(12) United States Patent
Kanaoka et al.

(10) Patent No.: US 8,026,163 B2
(45) Date of Patent: Sep. 27, 2011

(54) MANUFACTURING METHOD OF SEMICONDUCTOR INTEGRATED CIRCUIT DEVICE

(75) Inventors: Taku Kanaoka, Kanagawa (JP); Tota Maitani, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/917,804

(22) Filed: Nov. 2, 2010

(65) Prior Publication Data

US 2011/0117736 A1    May 19, 2011

(30) Foreign Application Priority Data

Nov. 13, 2009    (JP) .................. 2009-259711

(51) Int. Cl.
*H01L 21/44* (2006.01)
(52) U.S. Cl. .......... 438/613; 435/7.8; 435/29; 205/248; 205/267; 205/250
(58) Field of Classification Search ............... None
See application file for complete search history.

(56) References Cited

U.S. PATENT DOCUMENTS

2009/0117730 A1    5/2009    Maitani et al.

FOREIGN PATENT DOCUMENTS

| JP | 2006-291242 A | 10/2006 |
|---|---|---|
| JP | 2006-322037 A | 11/2006 |
| JP | 2009-114476 A | 5/2009 |

*Primary Examiner* — Ha Tran T Nguyen
*Assistant Examiner* — Shantanu C Pathak
(74) *Attorney, Agent, or Firm* — Miles & Stockbridge P.C.

(57) ABSTRACT

When relatively hard Au bump electrodes are mass-produced by electrolytic plating while ensuring usually required properties such as a non-glossy property and shape-flatness, combination of conditions, such as low liquid temperature, high current density, and low concentration of added Tl (thallium) that is an adjuvant, will be selected by itself. However, in such conditions, there is a problem that it is difficult to maintain the Tl concentration in a plating solution and, when the Tl concentration is reduced, defective appearance of the Au bump electrodes is generated by anomalous deposition. Conventionally, there has been no means to directly monitor minute Tl concentration and the Tl concentration has been controlled by analyzing the plating solution periodically. However, this can not prevent generation of a lot of defective products. One invention of the present application relates to detecting the added amount of Tl in the plating solution by monitoring the voltage applied to the plating solution in formation of bump electrodes by an electrolytic Au plating using a non-cyan based plating solution according to the manufacturing method of a semiconductor integrated circuit device.

18 Claims, 45 Drawing Sheets

FIG. 19 PRIOR STIRRING

COMPLETION OF FILLING WITH PLATING SOLUTION & CIRCULATION OF PLATING SOLUTION (CLEANING)

COUNTERCLOCKWISE STIRRING (CLEANING)

CIRCULATION OF PLATING SOLUTION (CLEANING)

CLOCKWISE STIRRING (CLEANING)

CIRCULATION OF PLATING SOLUTION (COMPLETION OF CLEANING)

CUP INVERSION

COMPLETE FILLING
WITH PLATING SOLUTION

COUNTERCLOCKWISE STIRRING

CIRCULATION OF PLATING SOLUTION

CLOCKWISE STIRRING

CIRCULATION OF PLATING SOLUTION

TERMINATION OF CIRCULATION OF PLATING SOLUTION

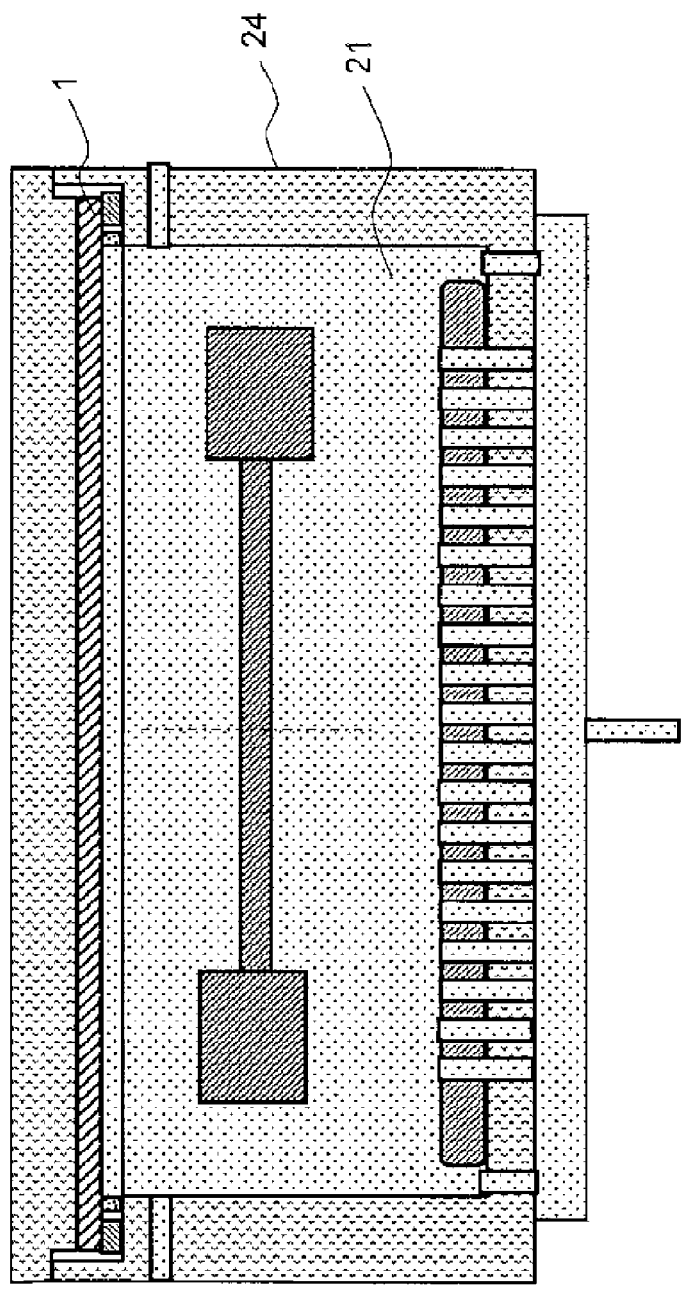
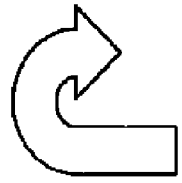
FIG. 36
CUP RE-INVERSION (COMPLETION OF PLATING)

FIG. 38 COMPLETION OF DISCHARGE OF PLATING SOLUTION

NITROGEN GAS PURGING

WAFER UNLOADING

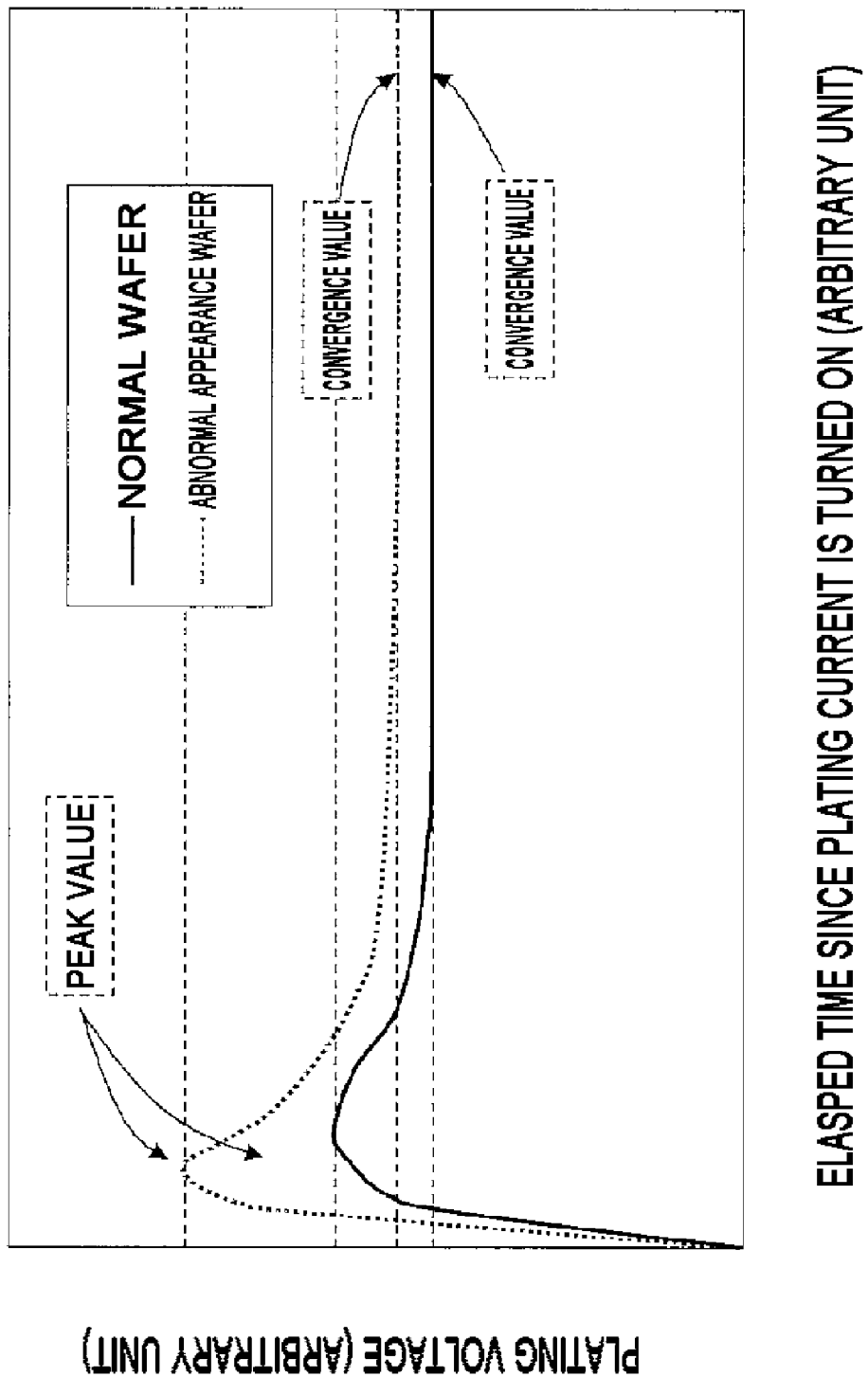

MANUFACTURING METHOD OF SEMICONDUCTOR INTEGRATED CIRCUIT DEVICE

CROSS-REFERENCE TO RELATED APPLICATION

The disclosure of Japanese Patent Application No. 2009-259711 filed on Nov. 13, 2009 including the specification, drawings and abstract is incorporated herein by reference in its entirety.

BACKGROUND OF THE INVENTION

The present invention relates to a bump formation technology in a manufacturing method of a semiconductor integrated circuit device (or a semiconductor device), in particular it relates to a technology that is effective for application to a gold (Au) bump formation technology.

In Japanese Patent Laid-Open No. 2006-291242 (Patent Document 1), with regard to formation of Au bumps over a semiconductor chip to be supplied for an assembling process, such as TCP (Tape Carrier Package), COF (Chip On Film or Chip On Flex), or COG (Chip On Glass), a technology, in which, in order to form an Au plated layer having relatively larger grains, the temperature and the thallium (Tl) concentration of a gold sulfite based (non-cyan based) plating solution are set to be relatively higher, has been disclosed.

In Japanese Patent Laid-Open No. 2006-322037 (Patent Document 2), with regard to formation of Au bumps over a semiconductor chip, a technology, in which, in order to form Au bumps having relatively lower hardness and good looking shapes, the temperature and the Tl concentration of the gold sulfite based (non-cyan based) plating solution are set to be relatively higher, has been disclosed.

In Japanese Patent Laid-Open No. 2009-114476 (Patent Document 3) or US Patent Application Publication No. US 2009/0117730 (Patent Document 4), with regard to formation of Au bumps over a semiconductor chip, a technology for preventing protrusions due to deposits in a plating cup from being generated over bump electrodes has been disclosed.

SUMMARY OF THE INVENTION

As for a semiconductor product such as an LCD (Liquid Crystal Display) driver, there is a bump plating process for forming Au bump electrodes having a thickness of about 15-20 μm. With regard to the Au bump electrode, at a time when TCP has been mainly used as a mounting process, in order to avoid damage to a lower layer of a chip during bonding, relatively soft Au bump electrodes have been required. However, as COG is mainly used what it is today, from a requirement for pressing conductive particles in an ACF (Anisotropically Conductive Film) to ensure a conductive path, a need for relatively hard Au bump electrodes has been increased.

In order to satisfy this need, inventors of the present application have investigated suitable conditions for a non-cyan based plating solution that is mainly used today from an environmental aspect and clarified the following problem. That is, when relatively hard Au bump electrodes are mass-produced by electrolytic plating while ensuring usually required properties such as a non-glossy property (microscopic roughness) and shape-flatness (macroscopic flatness), combination of conditions, such as low liquid temperature, high current density, and low concentration of added Tl (thallium) that is an adjuvant, will be selected by itself. However, in such conditions, there is a problem that it is difficult to maintain the Tl concentration in the plating solution and, when the Tl concentration is reduced, defective appearance of the Au bump electrodes is generated by anomalous deposition. Conventionally, there has been no means to directly monitor minute Tl concentration and the Tl concentration has been controlled by analyzing the plating solution periodically. However, this can not prevent generation of a lot of defective products.

The invention of the present application has been made in order to solve such a problem.

The present invention has been made in view of the above circumstances and provides a manufacturing method of a highly reliable semiconductor integrated circuit device.

The other purposes and the new feature of the present invention will become clear from the description of the present specification and the accompanying drawings.

The following explains briefly the outline of a typical invention among the inventions disclosed in the present application.

That is, one invention of the present application relates to formation of bump electrodes by electrolytic Au plating using a non-cyan based plating solution in a manufacturing method of a semiconductor integrated circuit device, in which added amount of Tl in the plating solution is detected by monitoring a voltage applied to the plating solution.

The following explains briefly the effect acquired by the typical invention among the inventions disclosed in the present application.

That is, in the formation of bump electrodes by electrolytic Au plating using a non-cyan based plating solution in the manufacturing method of a semiconductor integrated circuit device, because the added amount of Tl in the plating solution is detected by monitoring the voltage applied to the plating solution, defect, such as anomalous deposition due to decrease of the added amount of Tl, can be prevented from occurring.

BRIEF DESCRIPTION OF THE DRAWINGS

FIG. 36 is a cross-section view of the plating cup at a time of plating cup re-inversion after completion of plating in the Au bump plating process according to the manufacturing method of the semiconductor integrated circuit device of one embodiment of the present invention;

FIG. 45 is an explanatory diagram of a status of the plating voltage transition until the plating voltage becomes stable since plating current is turned on, for illustrating the transition of the plating voltage in FIG. 44.

DETAILED DESCRIPTION OF THE PREFERRED EMBODIMENTS

Outlines of Embodiments

Figure 1:
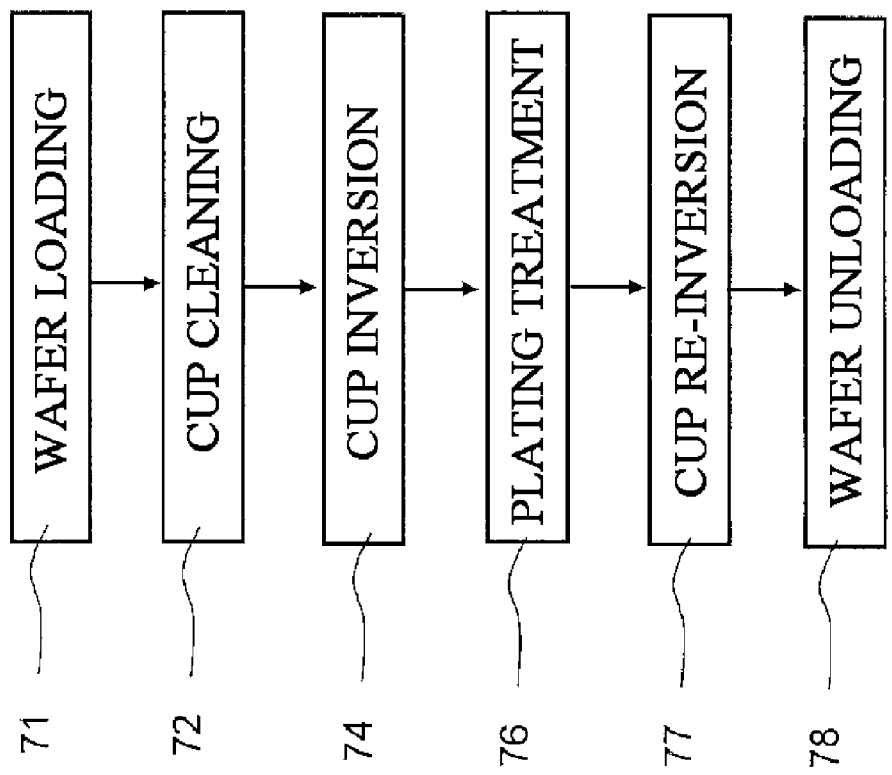
FIG. 1 is a flowchart of process blocks illustrating the outline of a process flow of Au bump plating according to a manufacturing method of a semiconductor integrated circuit device of one embodiment of the present invention.

First, a representative embodiment of an invention disclosed in the present application will be briefly described.

1. A manufacturing method of a semiconductor integrated circuit device including the following step of: (a) forming Au-based bump electrodes using Au as a principal component over a first principal surface of a semiconductor wafer by electrolytic plating using a non-cyan based Au plating solution added with thallium, wherein the step (a) includes the following sub-steps of: (a1) starting application of first plating current into the Au plating solution; (a2) after the sub-step (a1), finishing application of the first plating current; and (a3) at any period during the sub-steps (a1) and (a2), monitoring the added amount of thallium in the Au plating solution by monitoring voltage applied to the Au plating solution.

2. The manufacturing method of a semiconductor integrated circuit device according to the aspect 1, wherein the monitoring monitors relationship between the applied voltage and a set reference maximum voltage.

3. The manufacturing method of a semiconductor integrated circuit device according to the aspect 1 or 2, wherein the Au plating solution is a gold sulfite based plating solution.

4. The manufacturing method of a semiconductor integrated circuit device according to the aspect 3, wherein the applied voltage to be monitored is a peak voltage within the period.

5. The manufacturing method of a semiconductor integrated circuit device according to anyone of the aspects 1 to 4, further including the following step of: (b) adding Tl or Tl compound in the Au-plating solution based on the result of the sub-step (a3).

6. The manufacturing method of a semiconductor integrated circuit device according to anyone of the aspects 1 to 4, wherein the step (a) further includes the following sub-step of: (a4) adding Tl or Tl compound in the Au-plating solution based on the result of the sub-step (a3).

7. The manufacturing method of a semiconductor integrated circuit device according to the aspect 5 or 6, wherein the Tl compound is thallium formate, thallium sulfate, thallium nitrate, or thallium oxide.

8. The manufacturing method of a semiconductor integrated circuit device according to anyone of the aspects 1 to 7, wherein the step (a) further includes the following sub-step of: (a5) before the sub-step (a1), applying second plating current that is lower than the first plating current to the Au plating solution.

9. The manufacturing method of a semiconductor integrated circuit device according to anyone of the aspects 1 to 8, wherein the semiconductor integrated circuit device has an LCD driver circuit.

10. A manufacturing method of a semiconductor integrated circuit device including the following step of: (a) forming Au-based bump electrodes using Au as a principal component over a first principal surface of a semiconductor wafer by electrolytic plating using a non-cyan based Au plating solution added with thallium, wherein the step (a) includes the following sub-steps of: (a1) starting application of first plating current into the Au plating solution; (a2) after the sub-step (a1), finishing application of the first plating current; and (a3) at any period during the sub-steps (a1) and (a2), monitoring voltage applied to the Au plating solution; and (a4) before the sub-step (a1), setting a reference maximum voltage used for monitoring the added amount of thallium in the Au plating solution.

11. The manufacturing method of a semiconductor integrated circuit device according to the aspect 10, wherein the monitoring monitors relationship between the applied voltage and the reference maximum voltage.

12. The manufacturing method of a semiconductor integrated circuit device according to the aspect 10 or 11, wherein the Au plating solution is a gold sulfite based plating solution.

13. The manufacturing method of a semiconductor integrated circuit device according to anyone of the aspects 10 to 12, wherein the applied voltage to be monitored is a peak voltage within the period.

14. The manufacturing method of a semiconductor integrated circuit device according to anyone of the aspects 10 to 13, further including the following step of: (b) adding Tl or Tl compound in the Au-plating solution based on the result of the sub-step (a3).

15. The manufacturing method of a semiconductor integrated circuit device according to anyone of the aspects 10 to 13, wherein the step (a) further includes the following sub-step of: (a5) adding Tl or Tl compound in the Au-plating solution based on the result of the sub-step (a3).

16. The manufacturing method of a semiconductor integrated circuit device according to the aspect 14 or 15, wherein the Tl compound is thallium formate, thallium sulfate, thallium nitrate, or thallium oxide.

17. The manufacturing method of a semiconductor integrated circuit device according to anyone of the aspects 10 to 16, wherein the step (a) further includes the following sub-step of: (a6) before the sub-step (a1), applying second plating current that is lower than the first plating current to the Au plating solution.

18. The manufacturing method of a semiconductor integrated circuit device according to anyone of the aspects 10 to 17, wherein the semiconductor integrated circuit device has an LCD driver circuit.

Explanation of Description Format, and Fundamental Terms and Phrases in the Present Application 1. In the present application, embodiments will be explained, divided into plural sections, if necessary for convenience. Except for the case where it shows clearly in particular, they are not mutually unrelated, instead, they are parts of a single example and one has relationships such as a modification, details, and supplementary explanation of some or entire of another. Furthermore, as a principle, the repeated explanation of the same parts is omitted. Furthermore, in the following embodiments, elements are not necessarily indispensable, except for the case where it is clearly specified in particular and where the number is limited from a theoretical point of view and where it is considered to be clearly not right from context.

Furthermore, in the present application, "semiconductor device" or "semiconductor integrated circuit device", is referred to as a device in which singe bodies of various kinds of transistors (active elements) that are main components and resistances and capacitors etc. are integrated over a semiconductor chip etc. (for example, a single crystal silicon substrate). Here, as a representative example of the various kinds of transistors, a MOSFET (Metal Oxide Semiconductor Field Effect Transistor) as represented by a MISFET (Metal Insulator Semiconductor Field Effect Transistor) can be exemplified. At that time, as a representative example of configuration of an integrated circuit, a CMIS (Complementary Metal Insulator Semiconductor) integrated circuit as represented by a CMOS (Complementary Metal Oxide Semiconductor) integrated circuit which is a combination of an N channel MISFET and a P channel MISFET can be exemplified.

Today, usually, a wafer process of a semiconductor integrated circuit device, that is, an LSI (Large Scale Integration) can be broadly classified into an FEOL (Front End of Line) process that includes from a step of carrying-in a silicon wafer as a raw material to around a Premetal process (composed of steps of forming an interlayer insulating film etc. between a lower end of an M1 wiring layer and a gate electrode structure, forming a contact hole, burying a tungsten plug, and the like), and a BEOL (Back End of Line) process including from a step of forming the M1 wiring layer to around a process of forming a pad opening in a final passivation film over an Al based pad electrode (in a wafer level packaging process, this process is also included). Among the FEOL process, steps of, such as, patterning a gate electrode, and forming a contact hole are microprocessing steps in which fine pattern machining is required in particular. On the contrary, in the BEOL process, microprocessing is required in particular at via/trench formation step, in particular, in local wiring of relatively low layer (for example, from M1 to around M3 in buried wiring having a configuration of about four layers, and from M1 to around M5 in buried wiring having a configuration of about ten layers). Here, N-th layer wiring from the bottom is represented by "MN (normally, N is 1 to about 15)". M1 is a 1st layer wiring and M3 is a 3rd layer wiring.

2. Similarly, in the description of embodiments and the like, as for a material and composition etc. even if they are represented as "X composed of A", except for the case where it is clearly specified in particular and where it is considered to be clearly not right from context, one including an element except for A as one of principal elements is not excluded. For example, as for components the above representation has a meaning such as "X including A as a principal component". For example, even if representation of such as "Au bump electrodes" is used, not only pure gold but also gold alloys including gold as a principal component should be included. Similarly, even if representation of such as "a silicon member" is used, not only a pure silicon member but also members such as a SiGe alloy, a multiple component alloy including silicon as a principal component, and a silicon member containing other additives, should be included. Similarly, even if representations, such as "silicon dioxide film" and "silicon dioxide based insulating film", are used, not only relatively pure undoped silicon dioxide but also FSG (Fluorosilicate Glass); TEOS-based silicon oxide, SiOC (Silicon Oxicarbide); or carbon-doped silicon oxide; or a thermally oxidized film of such as OSG (Organosilicate glass), PSG (Phosphorus Silicate Glass), and BPSG (Borophosphosilicate Glass); application based silicon oxide such as a CVD oxidized film, SOG (Spin ON Glass), and NCS (Nano-Clustering Silica); a silica-based Low-k insulating film (porous insulating film) which is formed by introducing pores into a member similar to these members; and a composite film with another silicon based insulating film including these members as a principal element, should be included.

As for the silicon based insulating film usually used in a semiconductor field like the silicon dioxide based insulating film, there is a silicon nitride based insulating film. As materials belonging to this, there are SiN, SiCN, SiNH, SiCNH and the like. Here, when referring to "silicon nitride", except for the case where it is clearly specified in particular, both of SiN and SiNH are included. Similarly, when referring to "SiCN", except for the case where it is clearly specified in particular, both of SiCN and SiCNH are included.

In addition, SiC has a nature similar to that of SiN, rather, in many cases SiON is classified into the silicon dioxide based insulating film.

Silicon nitride film is often used as an etch stop film in an SAC (Self-Aligned Contact) technique, and also used as a stress applying film in an SMT (Stress Memorization Technique).

3. Similarly, in the following embodiments, when shape, position relationship, and properties etc. of an element are exemplified suitably, it is needless to say that the element should not be strictly restricted to these, except for the case where it is clearly specified in particular and where it is considered to be clearly not right from context.

4. Furthermore, in the following embodiments, when referring to the number of elements (including the number, a numeric value, an amount, a range, etc.), they may be not restricted to the specific number but may be greater or smaller than the specific number, except for the case where they are clearly specified in particular and where they are clearly restricted to the specific number theoretically and where it is considered to be clearly not right from context.

5. When referring to "a wafer", it is usually indicated as a single crystal silicon wafer over which a semiconductor integrated circuit device (a semiconductor device, an electronic device) is formed, however, it is needless to say that a composite wafer of an insulating substrate such as an epitaxial wafer, an SOI substrate, or an LCD glass substrate and a semiconductor layer etc. is also included.

6. As for a wafer treatment apparatus, when referring to "the inside" of the apparatus, in the present application, the inside of a wafer transfer container such as a wafer cassette placed in a wafer port, or a wafer transfer container such as a foup joined to a wafer port is the inside of this apparatus. On the contrary, when the wafer transfer container is moved outside the wafer port or the joint is released, the inside of this wafer transfer container is "the outside" of this apparatus.

7. As for a plating solution or a liquid chemical (plating solution etc.) in regard to a plating tank, "discharge" is referred to as lowering the liquid level of the plating solution etc. entirely or partially (mainly for the most part), except for the case where it is considered to be clearly not right from context (when referring to circulation etc.). This operation is necessary for distinguishing itself from circulation of the plating solution at a time of plating etc., because at a time of plating etc., the plating solution etc. is generally circulated in the plating tank (continuously discharged and introduced). Moreover, usually, gas purging is carried out in turn of "discharge" in order to keep the pressure inside the plating tank to be constant. On the contrary, "introduction" is referred to as rising the liquid level of the plating solution etc. entirely or partially, except for the case where it is considered to be clearly not right from context. Specifically, in many cases, "discharge" and "introduction" are controlled by regulating the amounts of introduction and discharge (including making either of them zero). In addition, the "liquid chemical" may be not only a solution etc. but sometimes pure water itself.

8. As for an introduction port or a discharge port in the plating tank of a plating cup, when referring to "a lower portion of the plating tank", it is indicated as the bottom surface facing the wafer loaded in the plating cup or the side surfaces near the bottom surface. Similarly, when referring to "an upper portion of the plating tank", it is indicated as the top surface (a surface facing the bottom surface) near the wafer loaded in the plating cup or the side surfaces near the top surface. That is, because the cup is inverted, in this limited case, the up and down is defined using a cup erecting state as a standard with no regard to the presence of inversion of the cup.

9. When referring to "the same composition" in regard to the plating solution etc., like the case where the plating solution etc. in a circulation system is commonly used in a various kinds of steps, it is needless to say that the case where the same object is commonly used in the various kinds of steps is included.

10. A "single wafer" plating apparatus is referred to as a plating apparatus where a sheet of wafer is treated in a single cup at one time with no regard to the number of the plating cups.

DETAILED DESCRIPTION OF PREFERRED EMBODIMENTS

The preferred embodiments will be described further in detail. In all the drawings for explaining embodiments, the same symbol is attached to the same member, as a principle, and the repeated explanation thereof is omitted.

Moreover, in order to make a drawing intelligible, in the case where hatching is complicated or the case where differentiation with respect to gaps is clear, hatching etc. may be omitted even if it is a cross section view. In this context, the border line of background of a hole may be omitted in some cases such as the case where it is clearly identified from explanation etc., even if the hole is closed in a plane. Furthermore, hatching may be attached in order to clarify not being a gap even if it is not a cross section view.

In addition, details of a countermeasure etc. against foreign matters etc. precipitated in the plating tank are described in Japanese Patent Laid Open No. 2009-114476 (publication date: May 28, 2009) or the correspondence US Patent Application Publication No. US 2009/0117730 (publication date: May 22, 2009) in detail.

1. Description of the Outlines of an Au Bump Plating Process and a Target Device in the Manufacturing Method of a Semiconductor Integrated Circuit Device According to the Present Embodiment (Mainly Illustrated in FIGS. 1 to 4).

Figure 2:
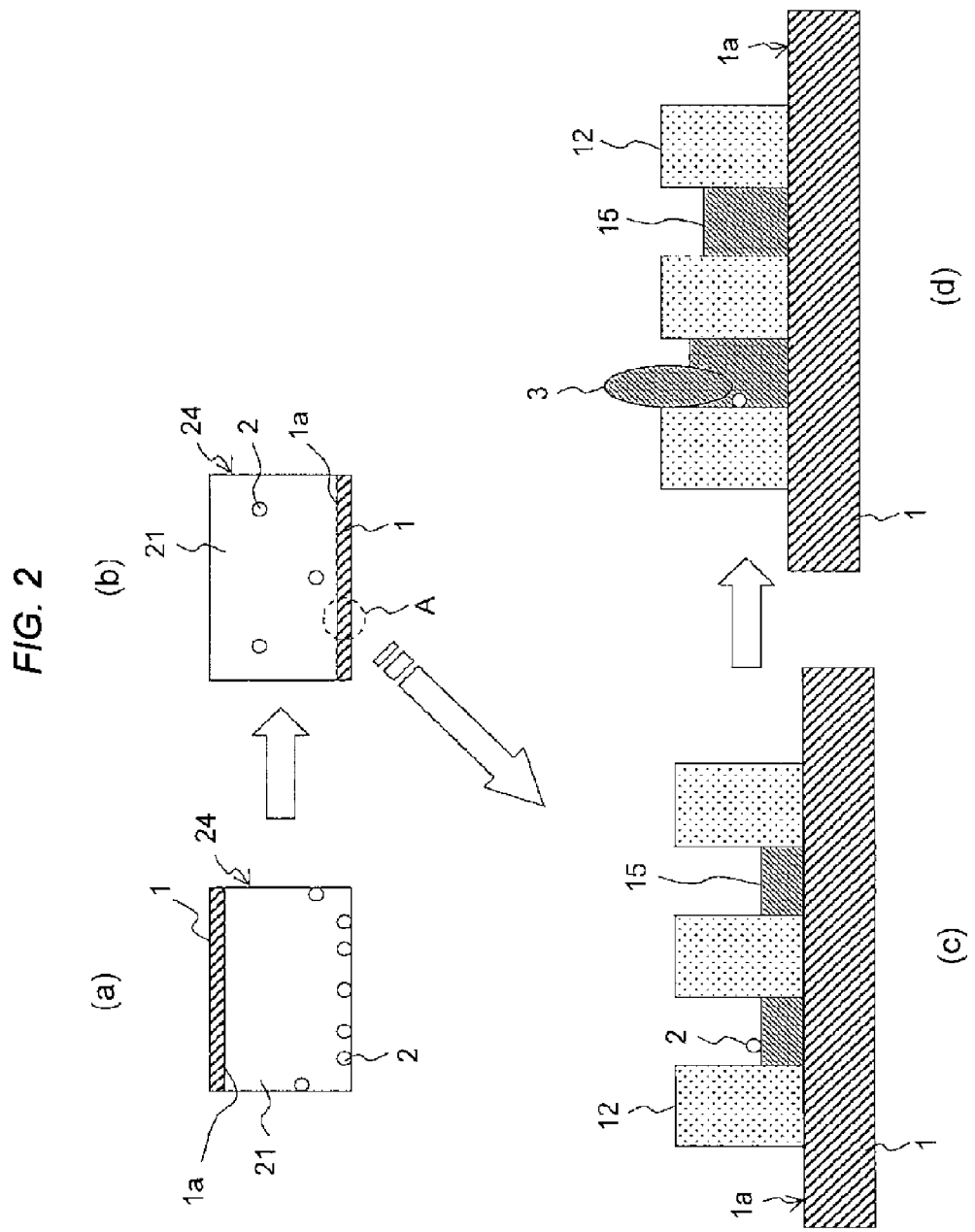
FIG. 2 is a schematic cross-section view of an apparatus and a device for explaining a technological problem in regard to foreign matters etc. precipitated in a plating tank of a plating apparatus used for the plating process of Au bumps according to the manufacturing method of the semiconductor integrated circuit device of one embodiment of the present invention.

FIG. 1 is a flowchart of process blocks illustrating the outline of a process flow of Au bump plating in a manufacturing method of a semiconductor integrated circuit device according to one embodiment of the present invention. FIG. 2 is a schematic cross-section view of an apparatus and the device for illustrating a technological problem in regard to foreign matters etc. precipitated in a plating tank of the plating apparatus used for the Au bump plating process according to the manufacturing method of a semiconductor integrated circuit device of one embodiment of the present invention. FIG. 2(a) is a cross-section view of a plating cup 24 in an erecting state, and FIG. 2(b) is a cross-section view of the plating cup 24 in an inverted (inversion) state, while FIG. 2(c) and FIG. 2(d) are enlarged schematic cross-section views of a section A in FIG. 2(b), they are cross-sectional flowcharts illustrating a mechanism by which protrusions due to deposits are generated. Based on these figures, the outline of the Au bump plating process in the manufacturing method of the semiconductor integrated circuit device of the present embodiment will be described. As illustrated in FIG. 1 or FIG. 2, first, a to-be-treated wafer 1 is loaded into the plating cup 24 (wafer loading step 71). At that time, the device surface 1a of the wafer 1 is caused to direct downward (in the direction of gravity). Because the precipitates 2 are relatively heavy, this positional relationship of the wafer 1 facilitates the precipitates 2 to rapidly flow from an upper side periphery to a lower side together with liquid flow (circulation flow) to be discharged from the lower side without adhering to the device surface 1a of the wafer 1.

Next, the precipitates 2 are dissolved in a plating solution 21 by filling the solution 21 in the cup 24 to an extent that the top surface of the solution 21 is brought into contact with the device surface 1a of the wafer 1, and stirring the solution 21 while circulating it (cup cleaning step 72). Here, the reason why the plating solution 21 is not completely filled, that is not filled (introduced) in 100%, is because there remains a gas layer above the solution 21 due to the structure of the apparatus. Accordingly, otherwise, the plating solution 21 may be filled in 100%. The reason why the cleaning step 72 is necessary is because if plating of the Au bump electrodes 15 is carried out in a state where the precipitates 2 adhere to the device surface 1a of the wafer 1, in particular, to openings of a photo-resist film 12, the plating layer will anomalously grow and protrusions 3 will appear. When the cleaning step 72 is completed, circulation of the plating solution is temporarily stopped while the plating cup 24 is inverted (cup inversion step 74). It is not always necessary to invert the cup 24, but, if the plating is carried out with the cup being inverted, there is a merit that adhesion of air bubbles over the wafer 1 is reduced by relationship with gravity. Next, if circulation of the plating solution is started with the cup 24 being inverted, the solution 21 will be rapidly filled in the cup 24 in approximately 100% (complete filling). It is also not necessarily indispensable to completely fill the solution 21 in the cup 24, but, if complete filling is carried out, there is an effect of reducing air bubbles. Next, with the plating cup 24 being inverted, plating treatment is carried out while circulating the plating solution 21 (plating treatment step 76). When the plating treatment is finished, the plating cup 24 is inverted again (plating cup re-inversion step 77). With the cup 24 being re-inverted, the plating solution 21 is discharged. After that, the wafer 1 is unloaded from the plating cup 24 (wafer unloading step 78).

Figure 3:
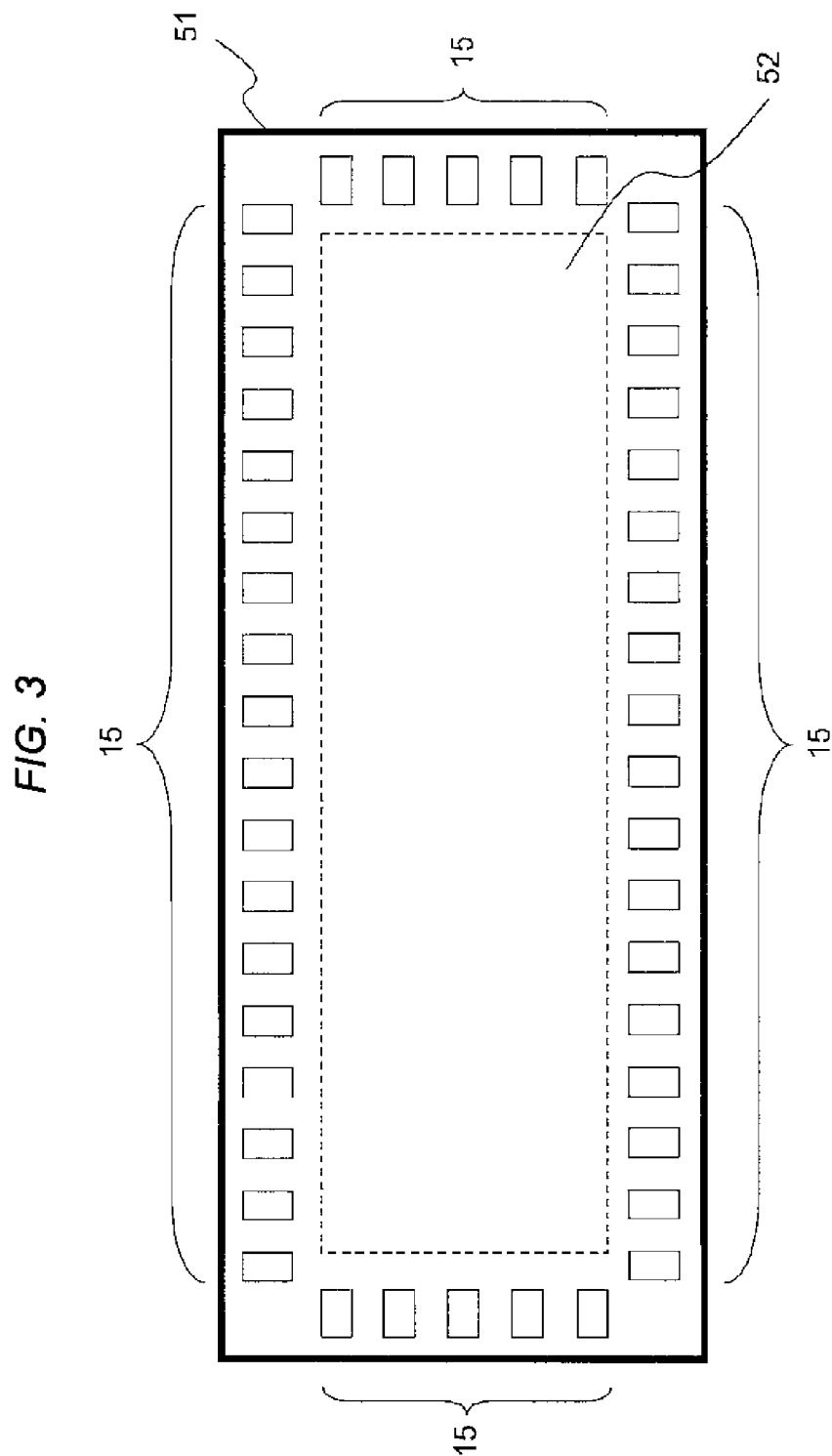
FIG. 3 is a top view of a chip illustrating one example of a semiconductor integrated circuit device (semiconductor device) according to the manufacturing method of the semiconductor integrated circuit device of the present invention.

FIG. 3 is a top view of a chip illustrating one example of a semiconductor integrated circuit device (semiconductor device) according to the manufacturing method of a semiconductor integrated circuit device of one embodiment of the present invention. This is an example of a chip for driver of a liquid crystal display device or an LCD (Liquid Crystal Display), wherein, over a chip 51, a circuitry region 52 is formed and a large number of bump electrodes 15 are arranged at the periphery of the region 52.

Figure 4:
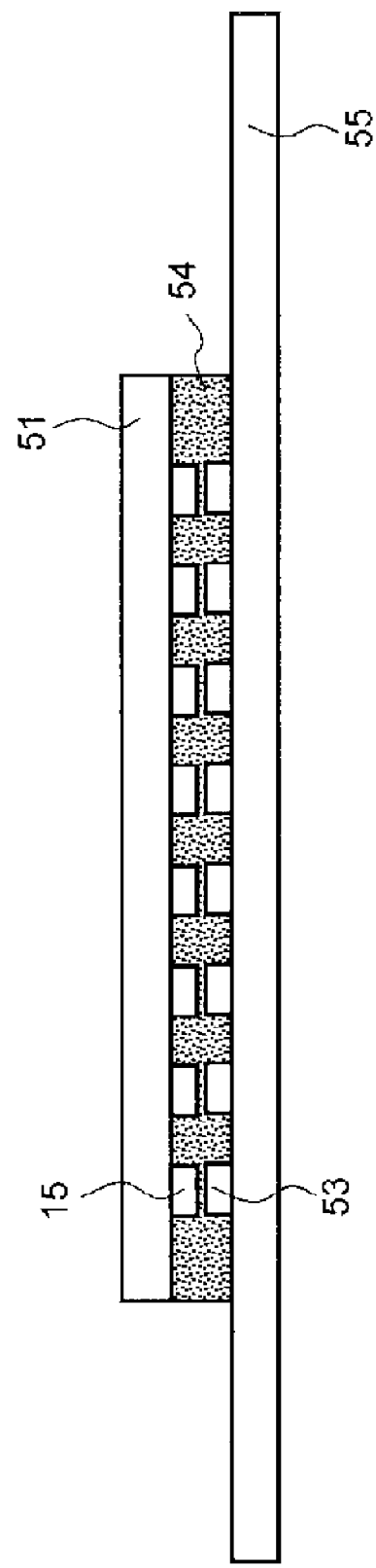
FIG. 4 is a cross-section view illustrating a structure where the liquid crystal display device is mounted with the semiconductor integrated circuit device (semiconductor device) according to the manufacturing method of the device of one embodiment of the present invention.

FIG. 4 is a cross-section view illustrating a structure where the liquid crystal display device is mounted with the semiconductor integrated circuit device (semiconductor device) according to the manufacturing method of the semiconductor integrated circuit device of one embodiment of the present invention. As illustrated in FIG. 4, a plurality of conductor external electrodes, such as ITO (Indium Tin Oxide) electrodes 53, are provided over a liquid crystal substrate 55 of the liquid crystal display device and electrically coupled to a plurality of Au bump electrodes 15 over the LCD driver chip 51 via an anisotropic conductive film 54 or ACF. At that time, if thickness unevenness is present in the Au bump electrodes 15, a problem such as that connection resistance between some electrodes increases, may occur in high probability.

2. Explanation of Entire Process and Target Device According to Manufacturing Method of Semiconductor Integrated Circuit Device of the Present Embodiment (Mainly FIGS. 5 to 12)

Figure 5:
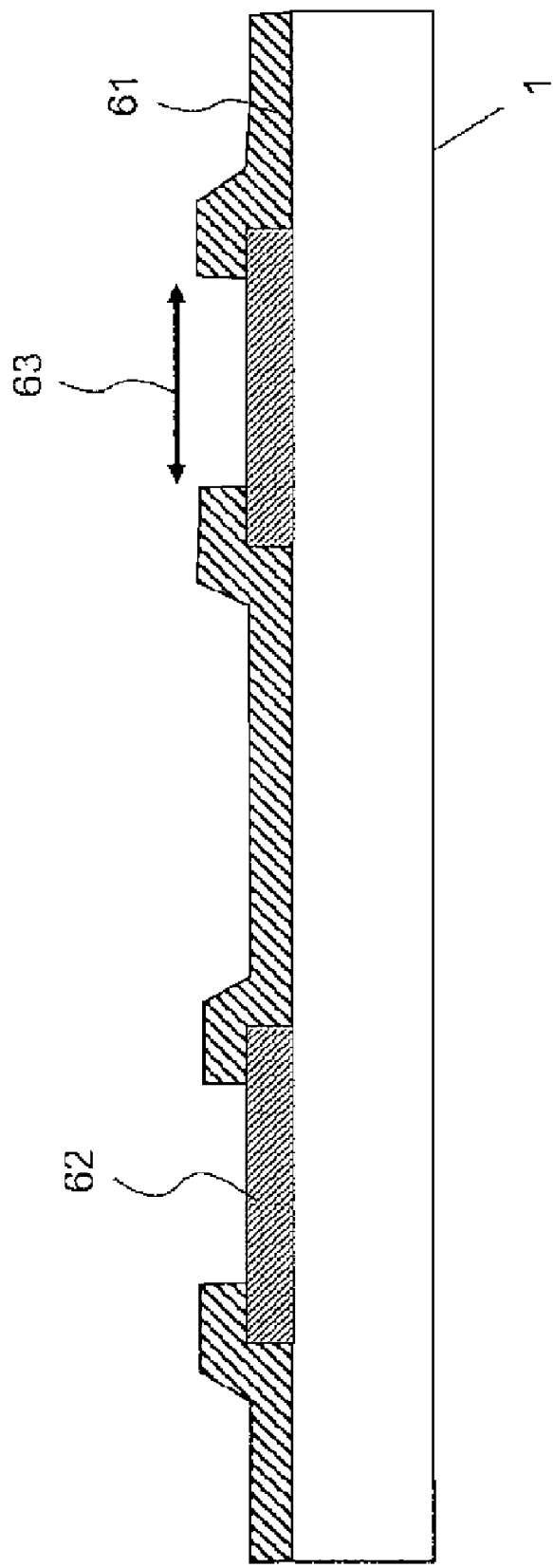
FIG. 5 is a schematic cross-section view illustrating a device structure of before subjected to bump formation treatment according to the manufacturing method of the semiconductor integrated circuit device of one embodiment of the present invention.
Figure 6:
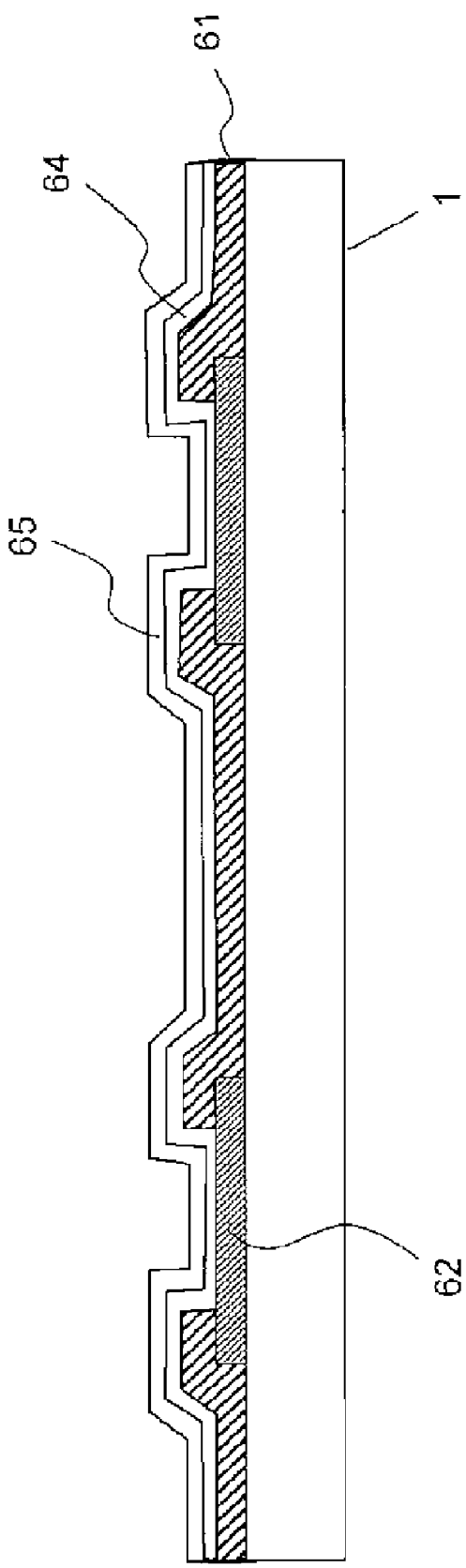
FIG. 6 is a schematic cross-section view illustrating the device structure during a step of forming a UBM (Under Bump Metal) according to the manufacturing method of the semiconductor integrated circuit device of one embodiment of the present invention.
Figure 7:
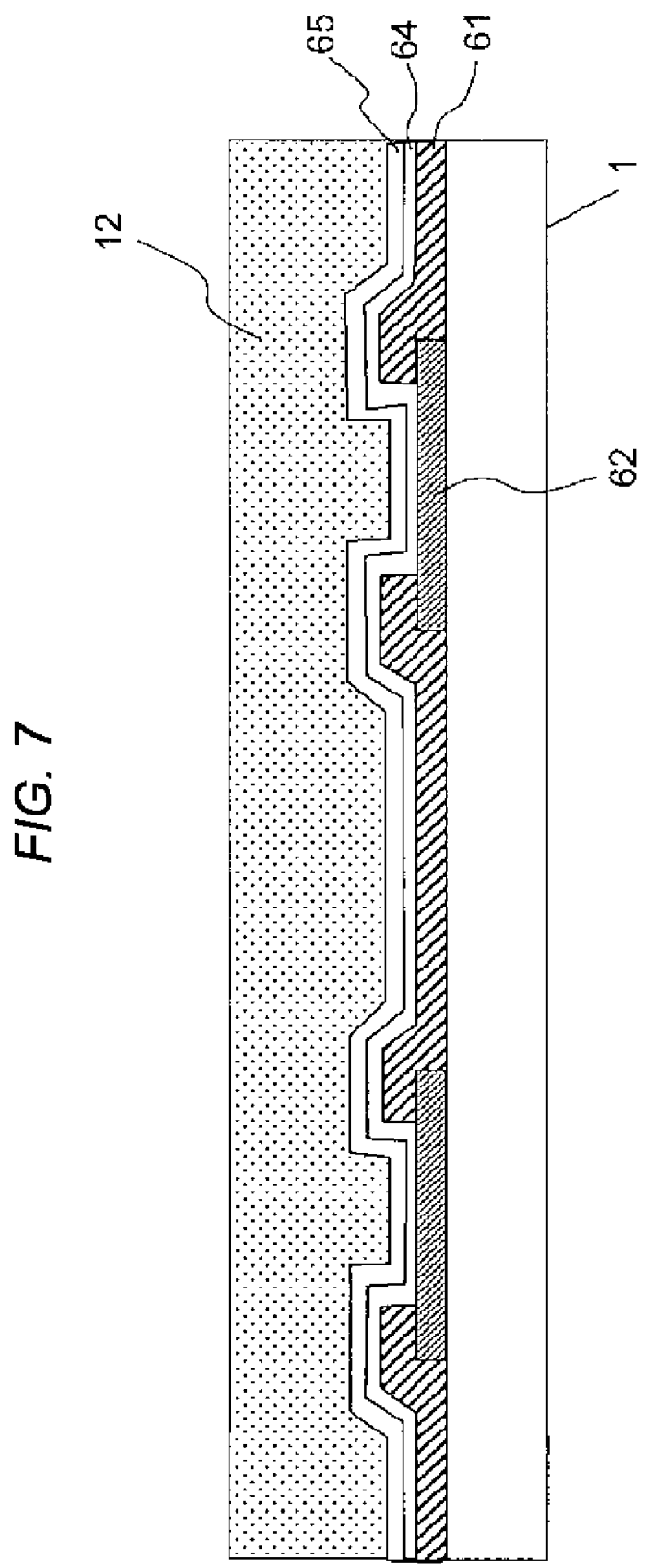
FIG. 7 is a schematic cross-section view illustrating the device structure at a time of completion of a photo resist application step according to the manufacturing method of the semiconductor integrated circuit device of one embodiment of the present invention.
Figure 8:
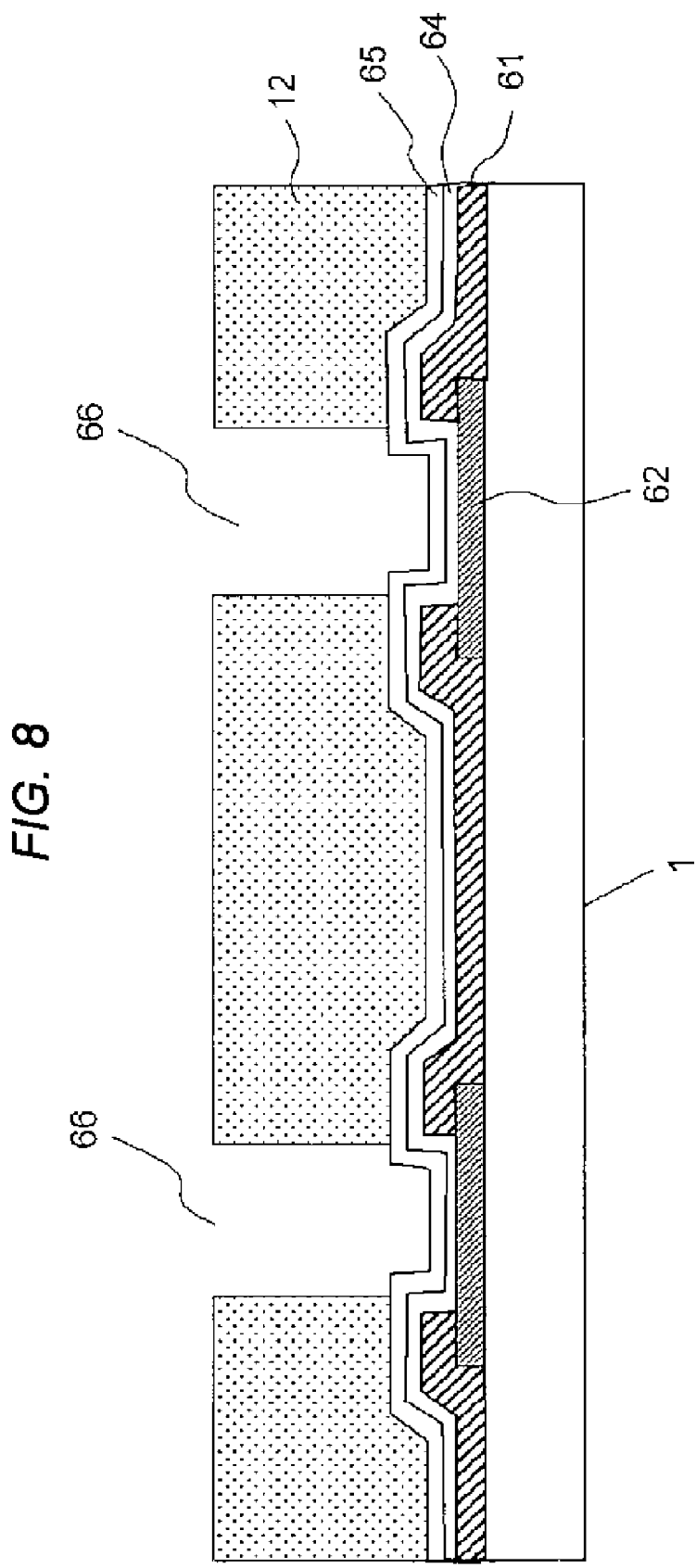
FIG. 8 is a schematic cross-section view illustrating the device structure at a time of completion of a photo resist development step according to the manufacturing method of the semiconductor integrated circuit device of one embodiment of the present invention.
Figure 9:
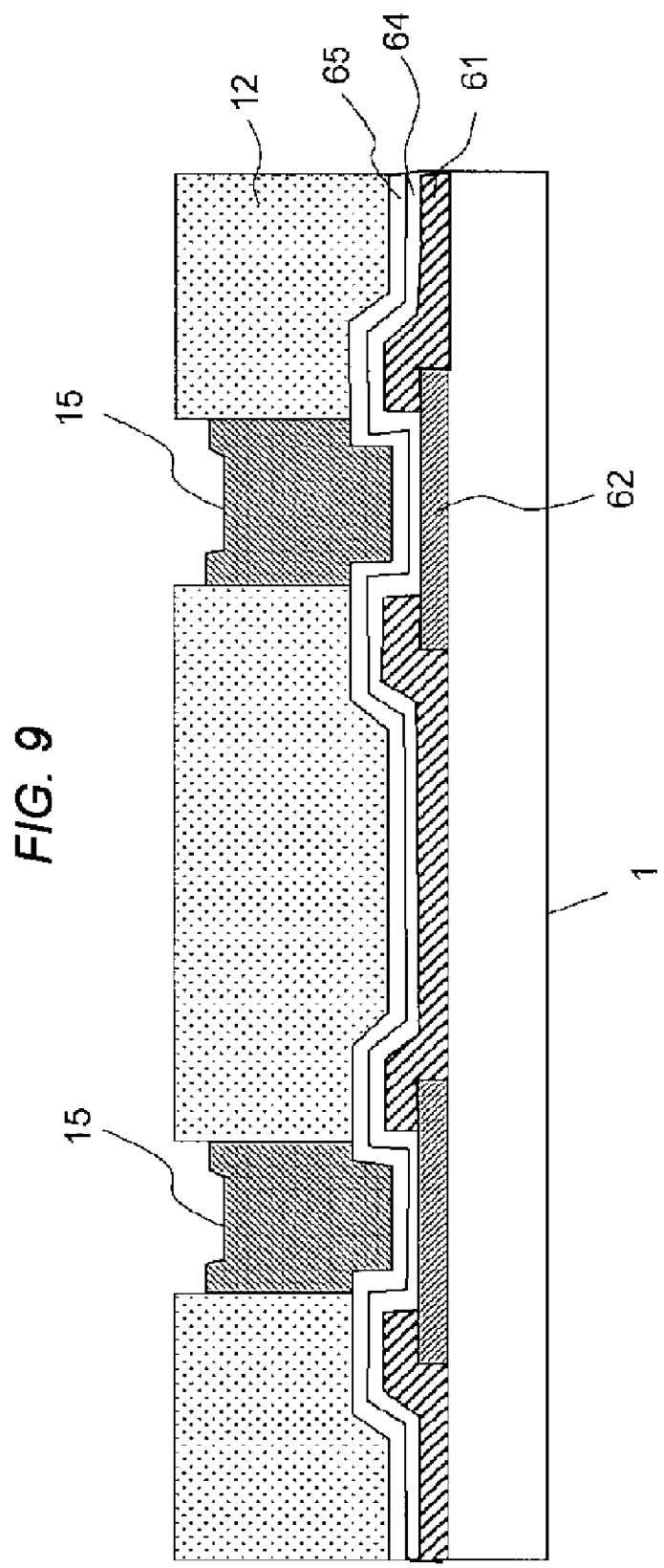
FIG. 9 is a schematic cross-section view illustrating the device structure at a time of completion of a plating step according to the manufacturing method of the semiconductor integrated circuit device of one embodiment of the present invention.
Figure 10:
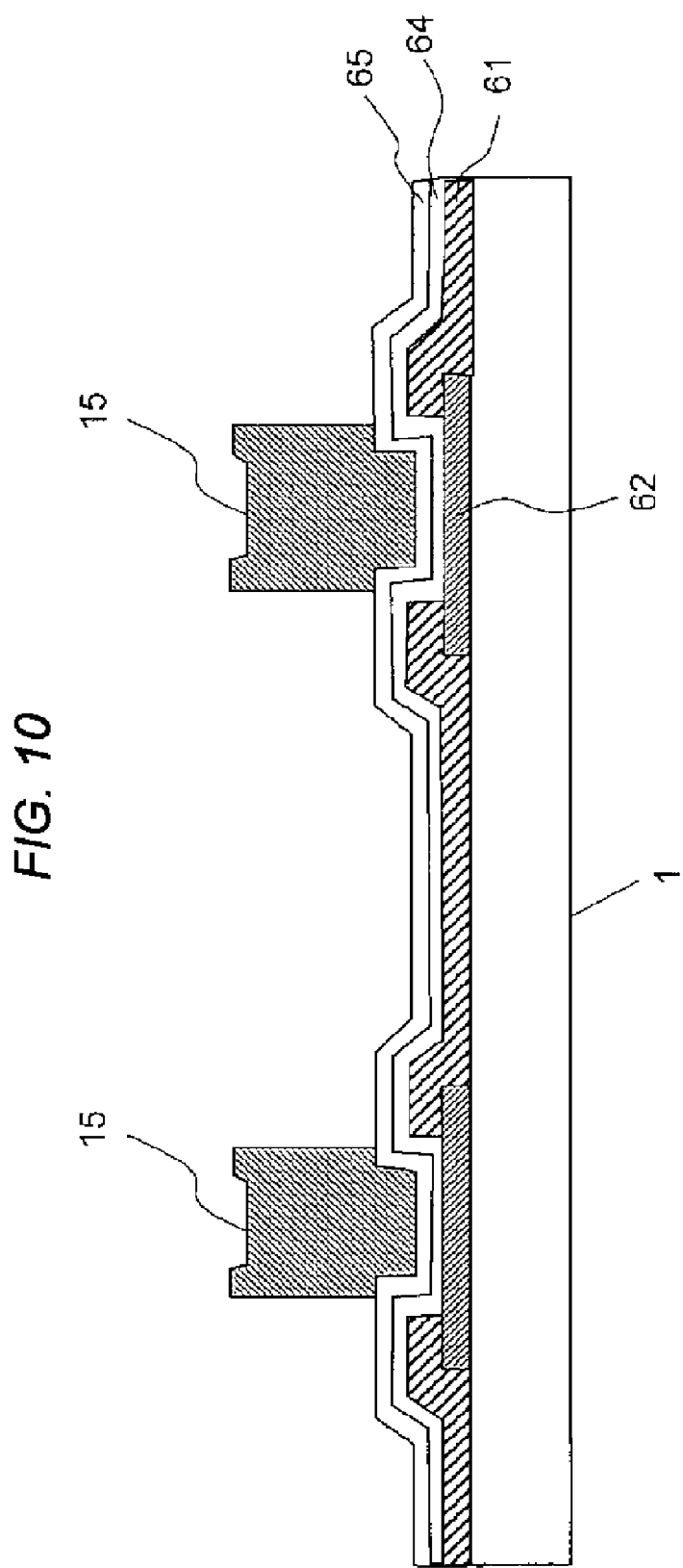
FIG. 10 is a schematic cross-section view illustrating the device structure at a time of completion of a resist removal step according to the manufacturing method of the semiconductor integrated circuit device of one embodiment of the present invention.
Figure 11:
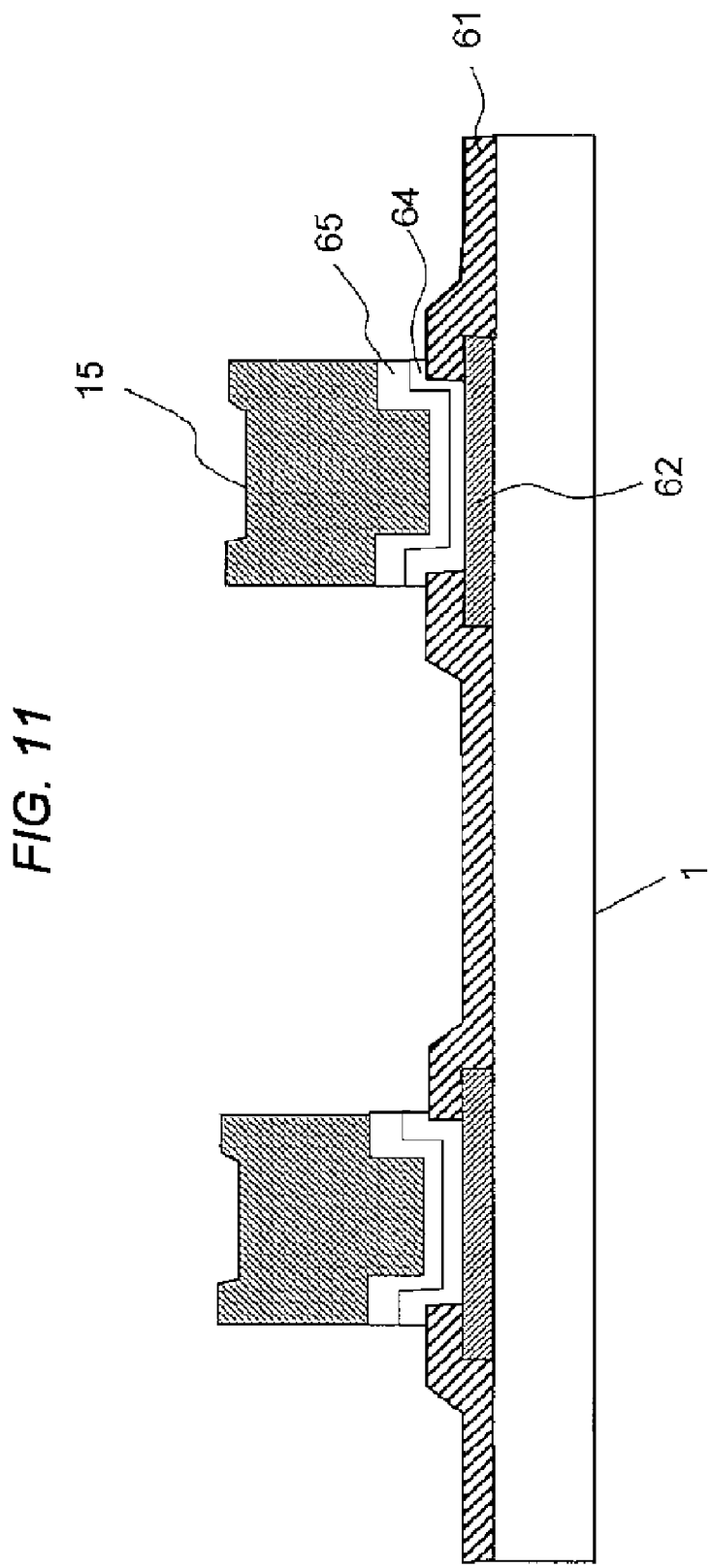
FIG. 11 is a schematic cross-section view illustrating the device structure at a time of completion of a UBM etching step according to the manufacturing method of the semiconductor integrated circuit device of one embodiment of the present invention.

Next, based on FIGS. 5 to 12, a bump formation process according to the manufacturing method of a semiconductor integrated circuit device of one embodiment of the present invention will be described. As illustrated in FIG. 5, over the principal surface of the wafer 1 over which a large number of devices and wirings (formed with a silicon dioxide film and a various kinds of metal layers) are formed, a final passivation film 61 of such as, for example, silicon nitride (not only inorganic based film but also organic based film may be used) is formed. In the passivation film 61, pad openings 63 are provided to areas corresponding to aluminum pads 62. Next, as illustrated in FIG. 6, UBM (Under Bump Metal) films, such as, a titanium film 64 (a lower layer) of about 175 μm thick, for example, and a palladium (Pd) film 65 (an upper layer) of about 175 μm thick, for example, are formed sequentially by sputtering. (These UBM materials are merely shown as examples, and other similar materials should not be excluded, for example, the Pd film may be displaced by an Au film, however, use of the Pd film gives higher reliability and a merit that the material cost is lower a little than that of Au.) As illustrated in FIG. 7, over the upper layer, for example, a positive resist film 12 of about 19 to 25 μm (for example; 20 μm) thick is formed. As the resist liquid used here, for example, a positive resist for a diazo-naphthoquinone-novolac based thick film (made by Tokyo Ohka Kogyo Co., LTD. and having a product name of "PMER P-LA900PM") or the like is included. Instead of the application based resist, a film resist may also be used. As illustrated in FIG. 8, openings 66 are formed by exposing and developing the resist. As illustrated in FIG. 9, an Au layer to be a bump electrode 15 of, for example, about 15 μm thick is buried in the openings 66 by electrolytic plating. Next, as illustrated in FIG. 10, the resist film 12 is removed. Finally, as illustrated in FIG. 11, using the Au bumps 15 as masks, unnecessary UBM films are selectively removed by wet etching. By these steps, formation of the bump electrodes will be tentatively completed.

Figure 12:
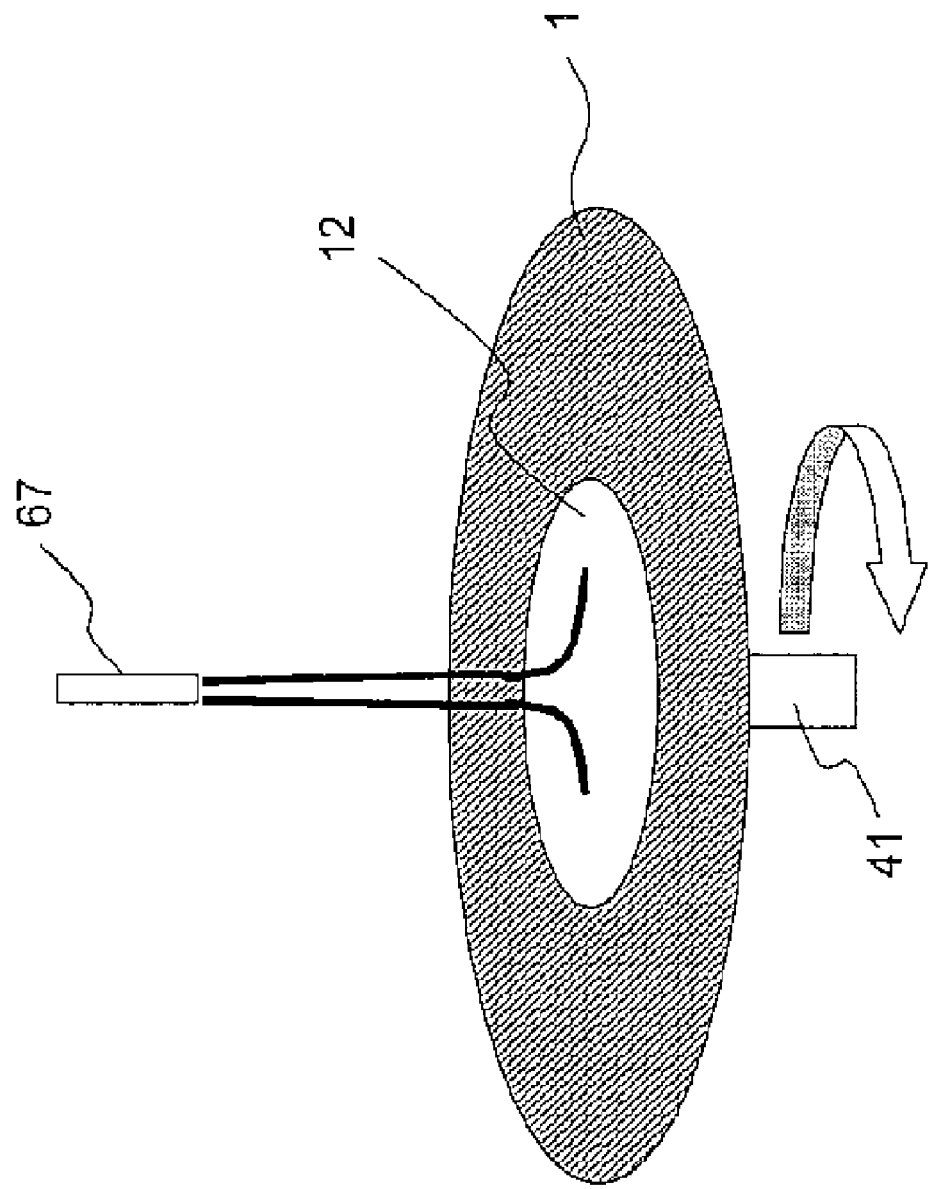
FIG. 12 is a perspective view illustrating an application part of a resist application device used for the manufacturing method of the semiconductor integrated circuit device of one embodiment of the present invention.

FIG. 12 is a perspective view illustrating an application area of a resist application device used for the manufacturing method of a semiconductor integrated circuit device of one embodiment of the present invention. The resist liquid dropped from a nozzle 67 is elongated into the resist film 12 of a predetermined thickness by high speed rotation of a spin chuck 41 over the wafer 1.

3. Explanation of Plating Apparatus Used for Au Plating Process According to Manufacturing Method of Semiconductor Integrated Circuit Device of the Present Embodiment (Mainly FIGS. 13 to 16)

Figure 13:
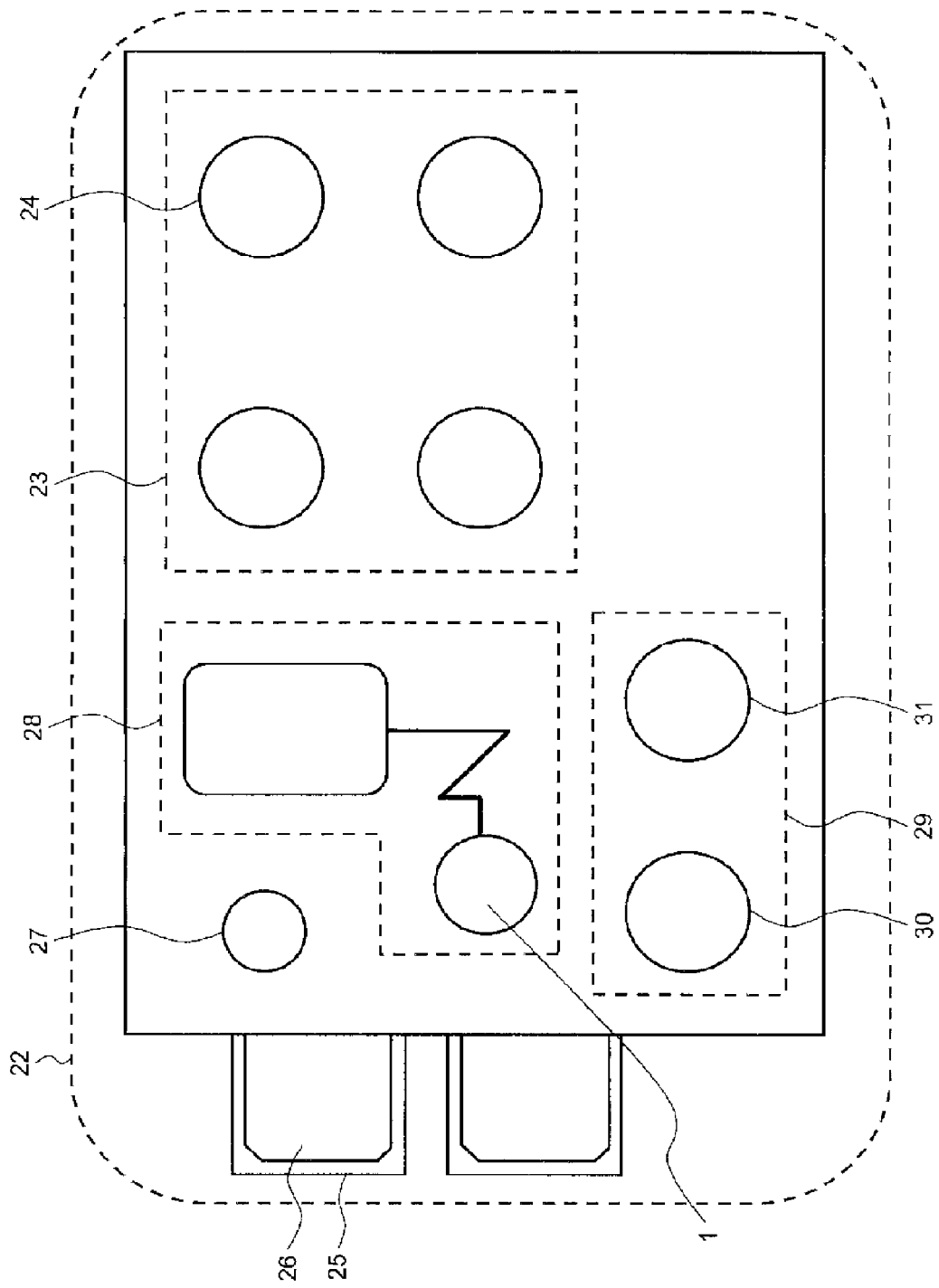
FIG. 13 is a top view of a single wafer plating apparatus used for an Au bump plating process according to the manufacturing method of the semiconductor integrated circuit device of one embodiment of the present invention.

FIG. 13 is a top view of a single wafer plating apparatus 22 used for an Au bump plating process according to the manufacturing method of a semiconductor integrated circuit device of one embodiment of the present invention. Based on FIG. 13, the movement of the wafer 1 in the apparatus is explained. As for the apparatus used here, for example, ALETA 300 that is a full automatic plating apparatus for a wafer of 300φ (produced by Electroplating Engineers of Japan Ltd.) etc. can be used. As illustrated in FIG. 13, a plating apparatus 22 is an apparatus for a wafer of 300φ including a load port 25 in which wafer containers 26, that is, Foups are set. The to-be-treated wafer 1 is taken out from one of the wafer containers 26 set in the load port 25 by a transfer robot 28. First, the wafer 1 is aligned at a wafer alignment section 27, then conveyed to a cleaning section 29 by the transfer robot 28, where, at a pre-treatment section 31, the device surface 1a of the wafer 1 is subjected to wet cleaning treatment by a liquid chemical or a pure water. After that, the wafer 1 is conveyed to one of a plurality of plating cups in a plating treatment section 23 and loaded therein by the transfer robot 28. After being subjected to plating treatment, the wafer 1 is conveyed to a rinsing and drying section 30 (wet-cleaning/drying section), and subjected to treatment such as wet-cleaning treatment, such as rinsing, by the liquid chemical or the pure water, and spin drying treatment there. After being subjected to the drying treatment, the wafer 1 is conveyed to the original wafer container 26 or another wafer container if necessary by the transfer robot 28.

Figure 14:
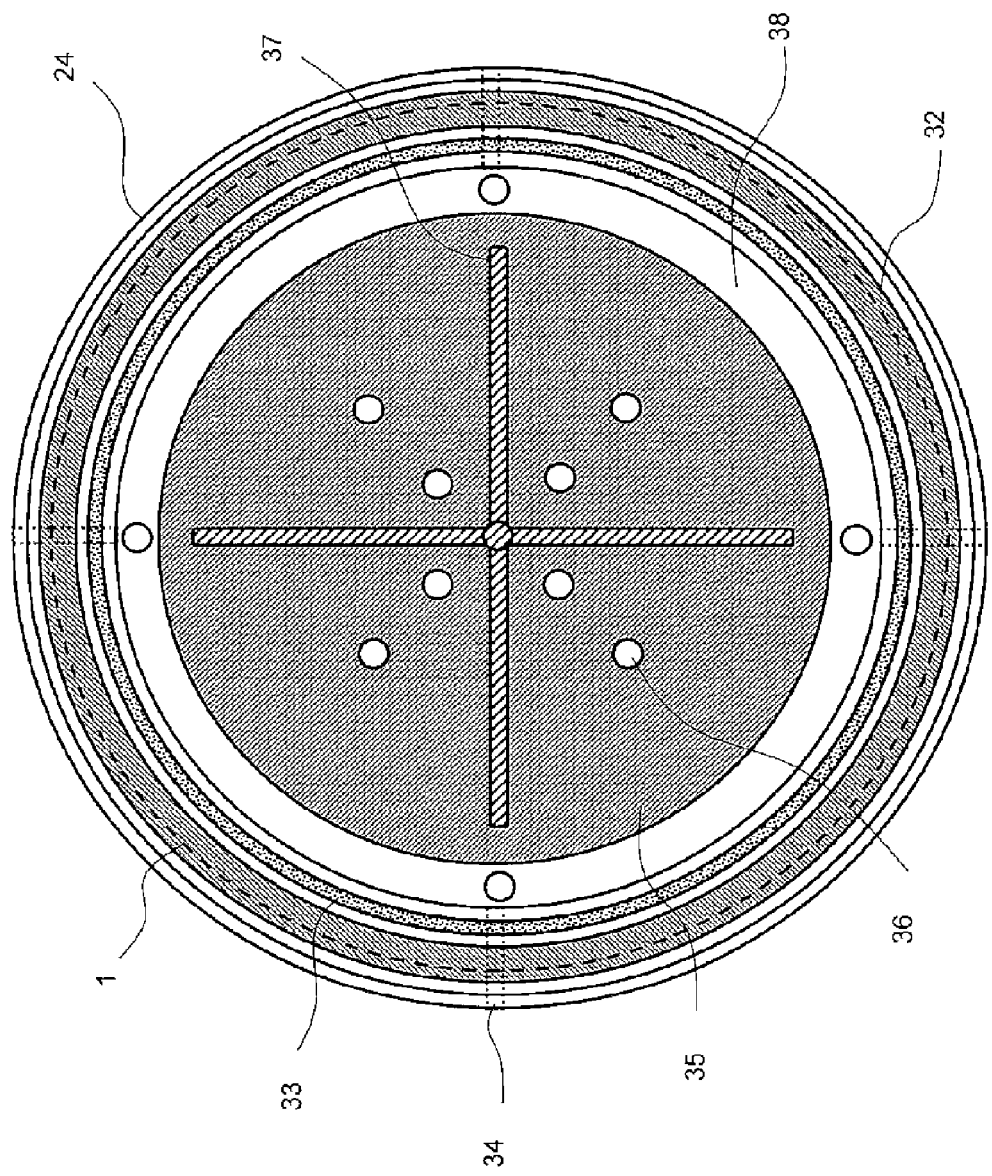
FIG. 14 is a top view of a plating tank (its rid is removed so that the inside can be easily seen) of a single wafer plating apparatus used for an Au bump plating process according to the manufacturing method of the semiconductor integrated circuit device of one embodiment of the present invention.

FIG. 14 is a top view of a plating tank (its rid is removed so that the inside can be easily seen) of the single wafer plating apparatus used for an Au bump plating process according to the manufacturing method of the semiconductor integrated circuit device of one embodiment of the present invention. Based on FIG. 14, the internal structure of the plating cup 24 will be explained. As in FIG. 14, a plating tank 38 of the plating cup 24 is illustrated and it is provided with an anode electrode 35 at the bottom surface thereof. The anode electrode 35 is an indium oxide electrode which is made by coating indium oxide over a Ti disc that is a base material. Being different from Pt electrode and other electrodes, this electrode has a merit that Au does not adhere thereto. Accordingly, periodical maintenance that has been necessary conventionally, will be unnecessary. However, in return for the merit that Au does not adhere thereto, the electrode has a demerit that precipitates containing Au tend to be generated. Accordingly, instead of using the indium oxide electrode, Pt electrode and other anode electrodes may be selected. The plating tank 38 is provided with a stirrer 37 (stirring bar) for stirring the plating solution 21 at the center thereof. The stirrer 37 is controlled to rotate in the plating tank 38 clockwise and counterclockwise. The bottom surface of the plating tank 38 and the anode electrode are provided with a large number of gas/liquid discharge ports 36 (for convenience of illustration, all of them are not shown). The upper portion of the side wall of the plating tank 38 is provided with a large number of gas/liquid introduction ports 34 around the periphery at even intervals (for convenience of illustration, all of them are not shown). At the inner side of the top surface of the side wall an elastic ring that is a lip seal 33 is provided. On the contrary, the central portion of the top surface of the side wall is provided with a cathode ring electrode 32 to be electrically coupled to the wafer 1.

Figure 15:
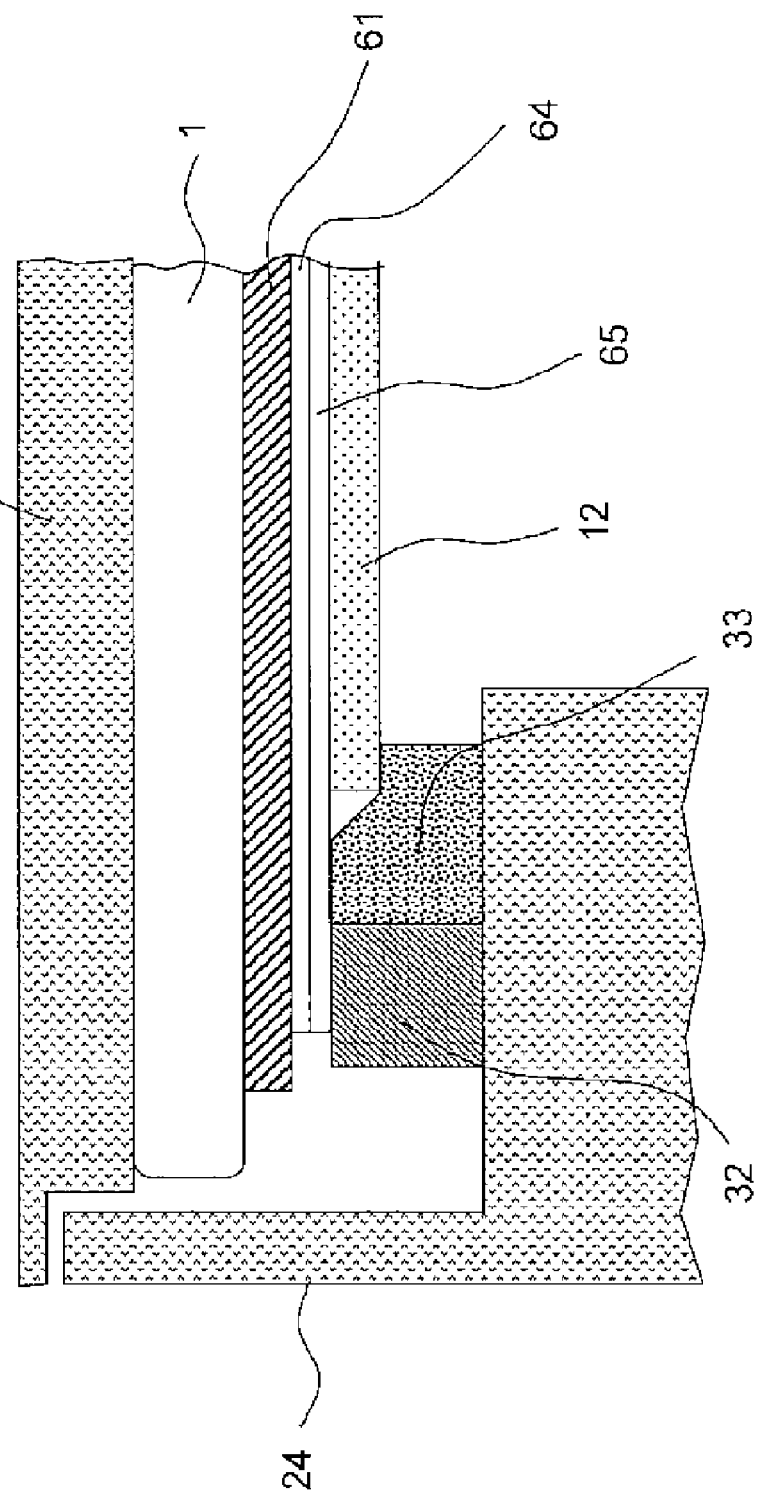
FIG. 15 is an enlarged cross-section view illustrating how a cathode electrode of the single wafer plating apparatus used for an Au bump plating process according to the manufacturing method of the semiconductor integrated circuit device of one embodiment of the present invention and a conductive layer of the device surface of the wafer are brought into contact with each other.

FIG. 15 is an enlarged cross-section view illustrating how the cathode electrode of the single wafer plating device used for the Au bump plating process according to the manufacturing method of the semiconductor integrated circuit device of one embodiment of the present invention and a conductive layer of the device surface of the wafer are brought into contact with each other. Based on FIG. 15, details of a method for loading the wafer 1 in the plating cup 24 will be explained. As illustrated in FIG. 15, when the wafer 1 is pushed down with a lid 42 of the plating cup 24 from the upper side while bringing the cathode ring electrode 32 into contact with the Pd layer 65 at the end portion of the wafer 1, the lip seal 33 is deformed to seal the plating tank 38. In addition, because it is necessary for the portion which is brought into contact with the cathode ring electrode 32 (the end portion of the Pd layer 65 not covered with the resist film 12) not to be contacted with the plating solution, the lip seal 33 seals the plating tank 38 while covering a part of the end portion of the resist film 12.

Figure 16:
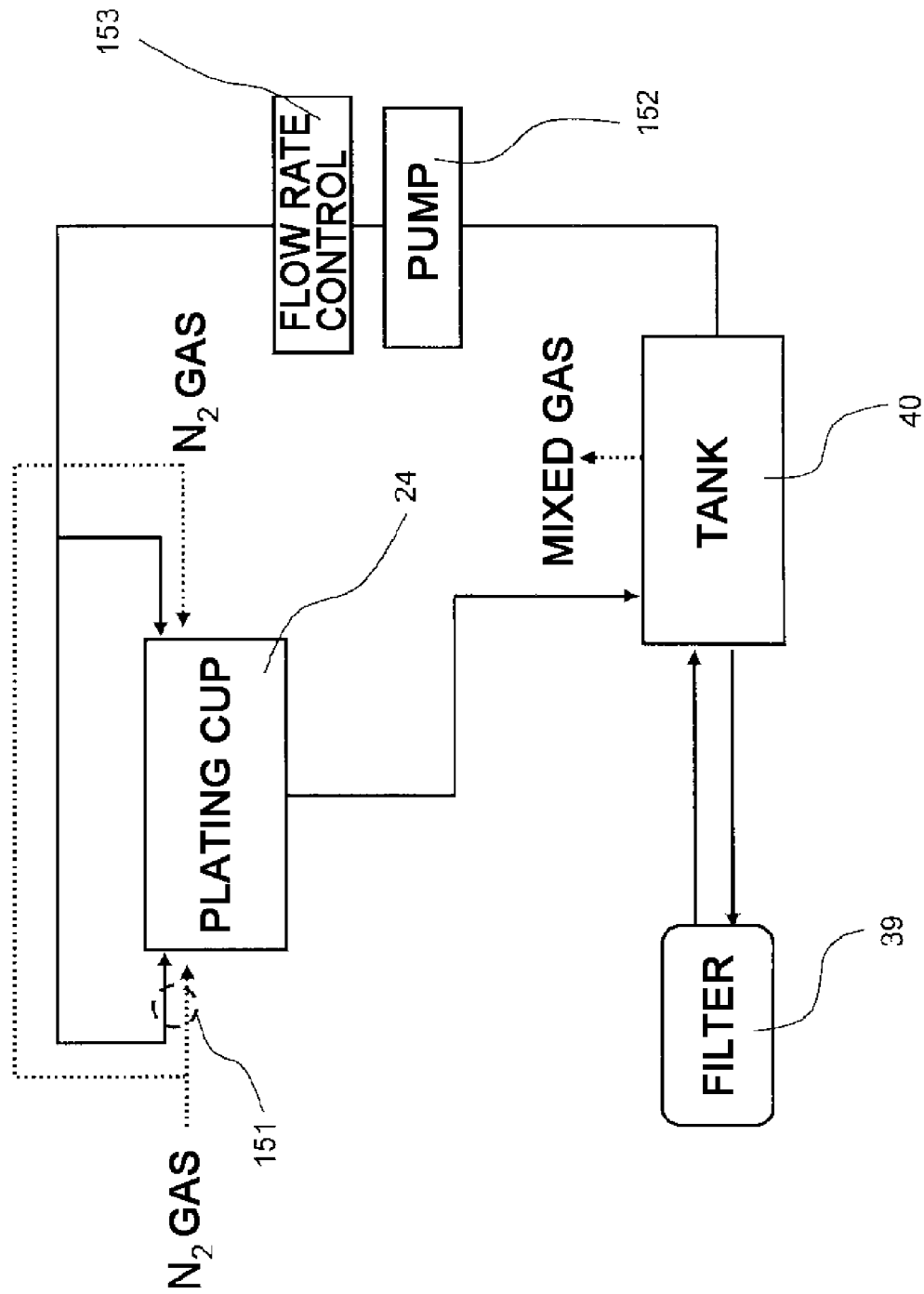
FIG. 16 is a system block diagram illustrating a circulation system of a plating solution etc. for the single wafer plating apparatus used for an Au bump plating process according to the manufacturing method of the semiconductor integrated circuit device of one embodiment of the present invention.

FIG. 16 is a system block diagram explaining a circulation system of a plating solution etc. for the single wafer plating apparatus used for an Au bump plating process according to the manufacturing method of the semiconductor integrated circuit device of one embodiment of the present invention. Based on FIG. 16, the circulation system will be explained. As illustrated in FIG. 16, the plating solution 21 etc. (such as a chemical liquid, a plating solution, and a gas) discharged from the discharge ports at the lower side of the plating cup 24 enter a tank 40 having a volume of about 200 liter. The tank 40 and a filter 39 for removing foreign matters form a closed circuit system, and thereby the plating solution 21 in the tank 40 is always maintained to be in a clean state. When it is necessary to further reduce the probability of occurrence of a problem that un-dissolved foreign matters discharged from one plating cup, foreign matter removal filters etc. should be interposed between each of the cups and the tank 40. In the tank 40, removal of mixed gas and adjustment of liquid temperature are carried out (for example, to a temperature of about 46 degree C. In general, the liquid temperature is adjusted to a temperature between about 40 degree C. and about 60 degree C. Note that, a temperature between about 40 degree C. and about 50 degree C. is particularly suitable, when it is necessary to form bumps having relatively hard bumps). After that, the plating solution etc. pass through a pump 152 and a switching solenoid valve 151 and return to the plating cup 24 from the introduction port provided to the upper side of the cup 24. The flow rate of the plating solution at the time of circulation is suitable to be about 5 liter/minute per one cup, for example (here, the volume of one plating cup is set to be 5 liter). On the contrary, introduction of the purge gas etc. is carried out by switching the switching solenoid valve 151. The flow rate of nitrogen gas at the time of gas-purging is suitable to be about 5 liter/minute per one cup (under one atmospheric pressure), for example (here, the volume of one plating cup is set to be 5 liter). Although, these are specific explanation of a circulation state, explanation of introduction or discharge is also almost the same as that of circulation, they are carried out by adjusting the feed rate of the pump 152 and a flow rate control mechanism 153 at the side of discharge.

4. Detailed Explanation of Au Plating Process According to Manufacturing Method of Semiconductor Integrated Circuit Device of the Present Embodiment (Mainly FIGS. 17 to 40)

Figure 17:
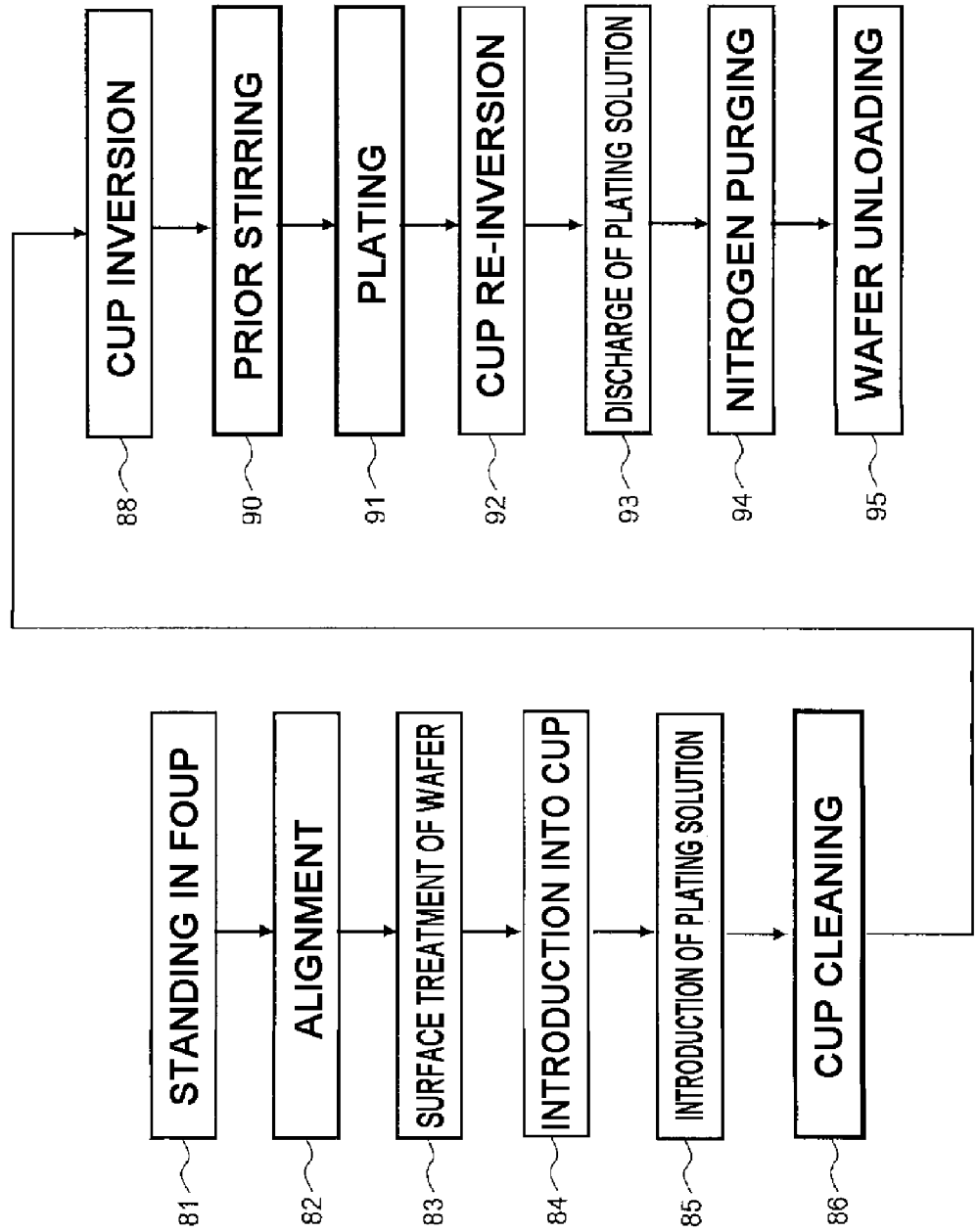
FIG. 17 is a block flow diagram illustrating a total flow of the Au bump plating process according to the manufacturing method of the semiconductor integrated circuit device of one embodiment of the present invention.
Figure 18:
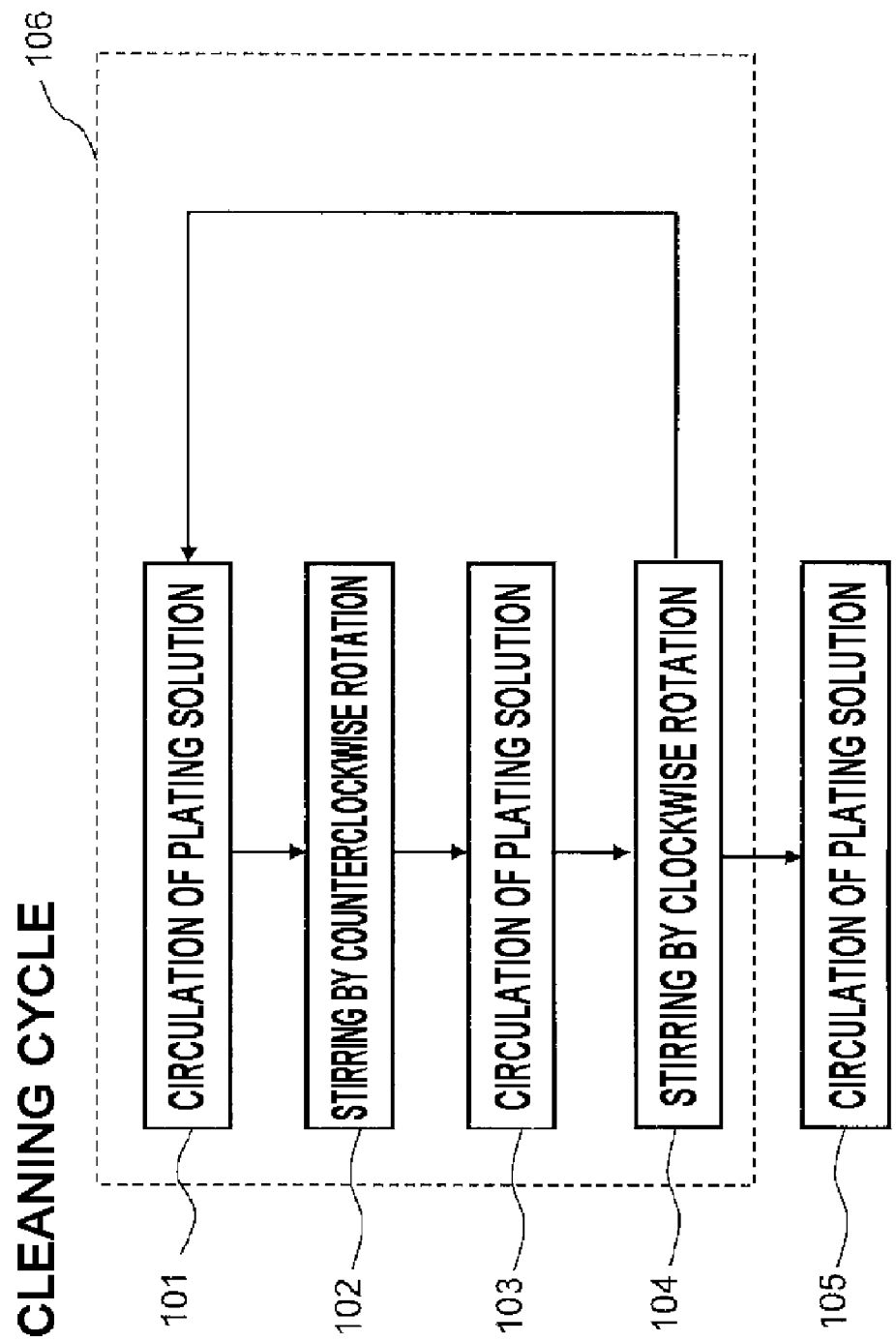
FIG. 18 is a block flow diagram illustrating a detailed flow of a cup cleaning step out of the total flow of the Au bump plating process according to the manufacturing method of the semiconductor integrated circuit device of one embodiment of the present invention.
Figure 19:
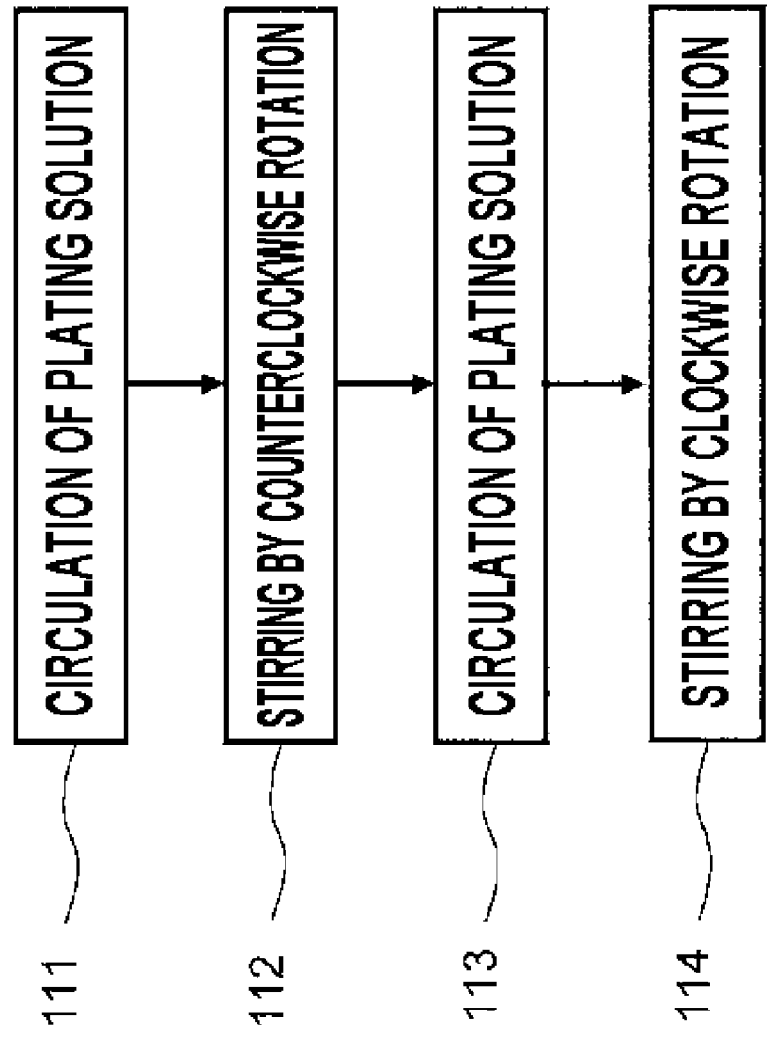
FIG. 19 is a block flow diagram illustrating a detailed flow of a prior stirring step out of the total flow of the Au bump plating process according to the manufacturing method of the semiconductor integrated circuit device of one embodiment of the present invention.
Figure 20:
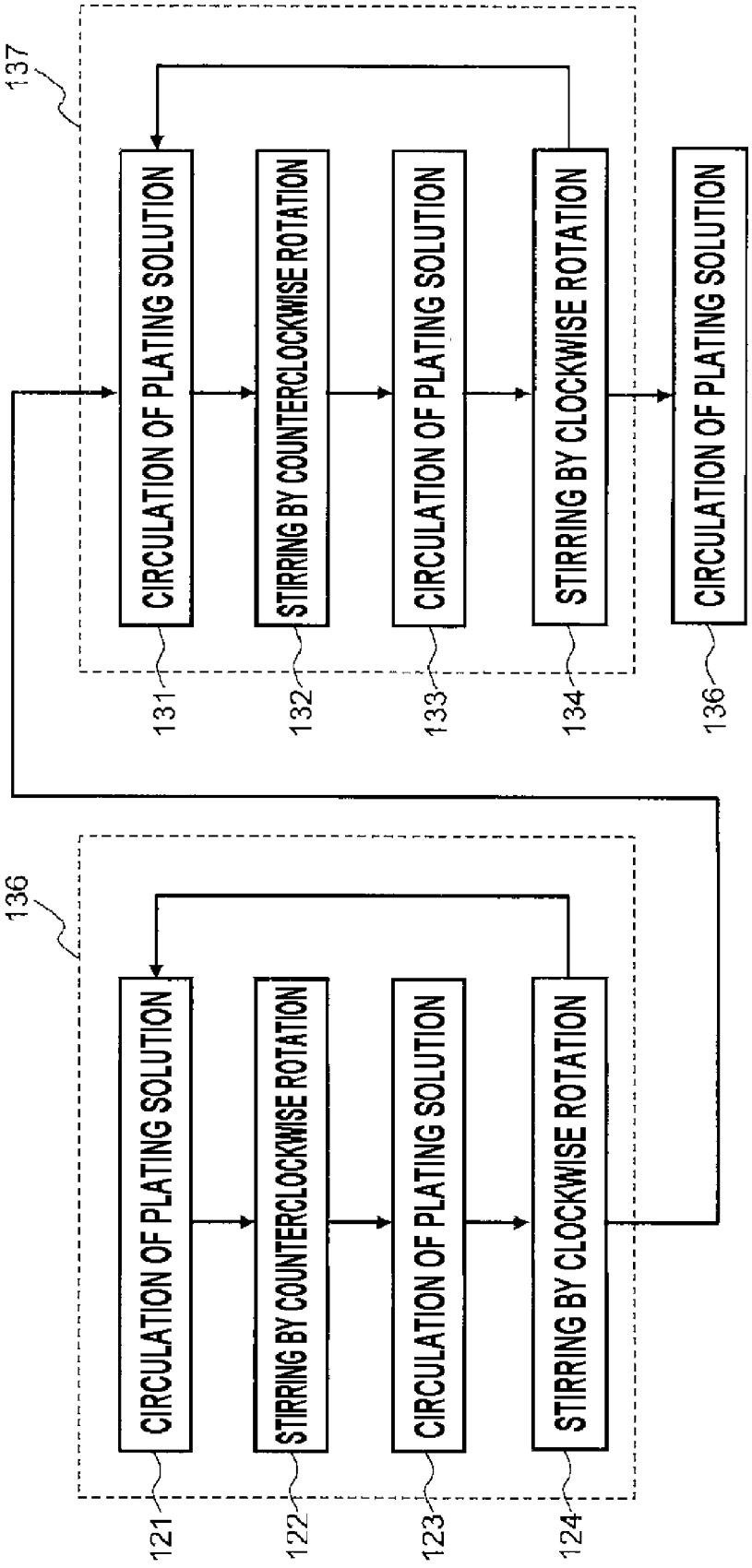
FIG. 20 is a block flow diagram illustrating a detailed flow of a plating step out of the total flow of the Au bump plating process according to the manufacturing method of the semiconductor integrated circuit device of one embodiment of the present invention.

FIG. 17 is a block flow diagram illustrating the total flow of the Au bump plating process according to the manufacturing method of the semiconductor integrated circuit device of one embodiment of the present invention. FIG. 18 is a block flow diagram illustrating a detailed flow of a cup cleaning step 86 (FIG. 17) out of the total flow of the Au bump plating process according to the manufacturing method of the semiconductor integrated circuit device of one embodiment of the present invention. FIG. 19 is a block flow diagram illustrating a detailed flow of a prior stirring step 90 (FIG. 17) out of the total flow of the Au bump plating process according to the manufacturing method of the semiconductor integrated circuit device of one embodiment of the present invention. FIG. 20 is a block flow diagram illustrating a detailed flow of a plating step 91 (FIG. 17) out of the total flow of the Au bump plating process according to the manufacturing method of the semiconductor integrated circuit device of one embodiment of the present invention. FIGS. 21 to 40 are each a cross-section view illustrating the state of the plating cup 24 during each of the steps (some steps may correspond to a plurality of steps because of their repeating factor) illustrated in FIGS. 17 to 20. Based on these figures, the total flow of the Au bump plating process briefly explained in section 1, will be explained in detail.

Figure 21:
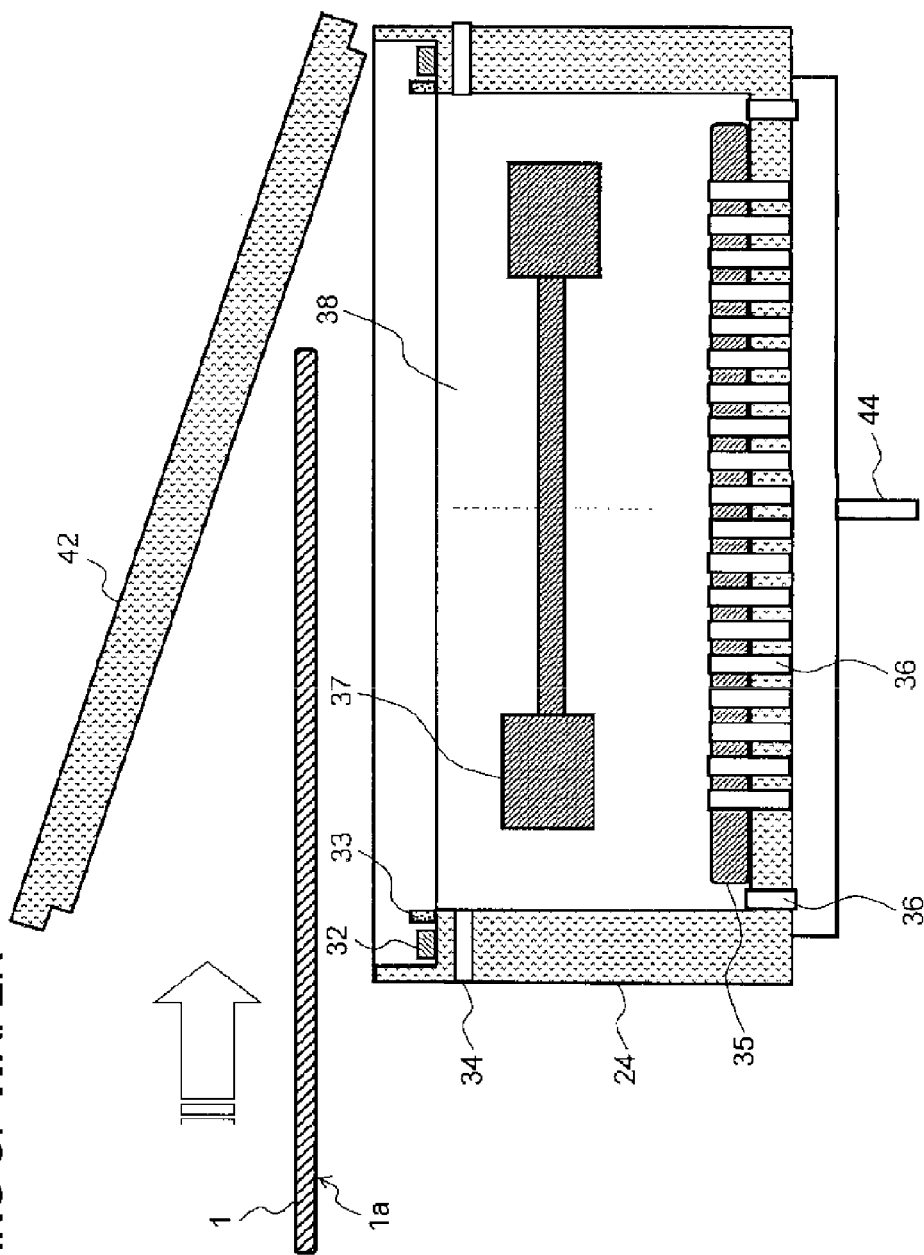
FIG. 21 is a cross-section view of a plating cup at a time of wafer loading in the Au bump plating process according to the manufacturing method of the semiconductor integrated circuit device of one embodiment of the present invention.
Figure 22:
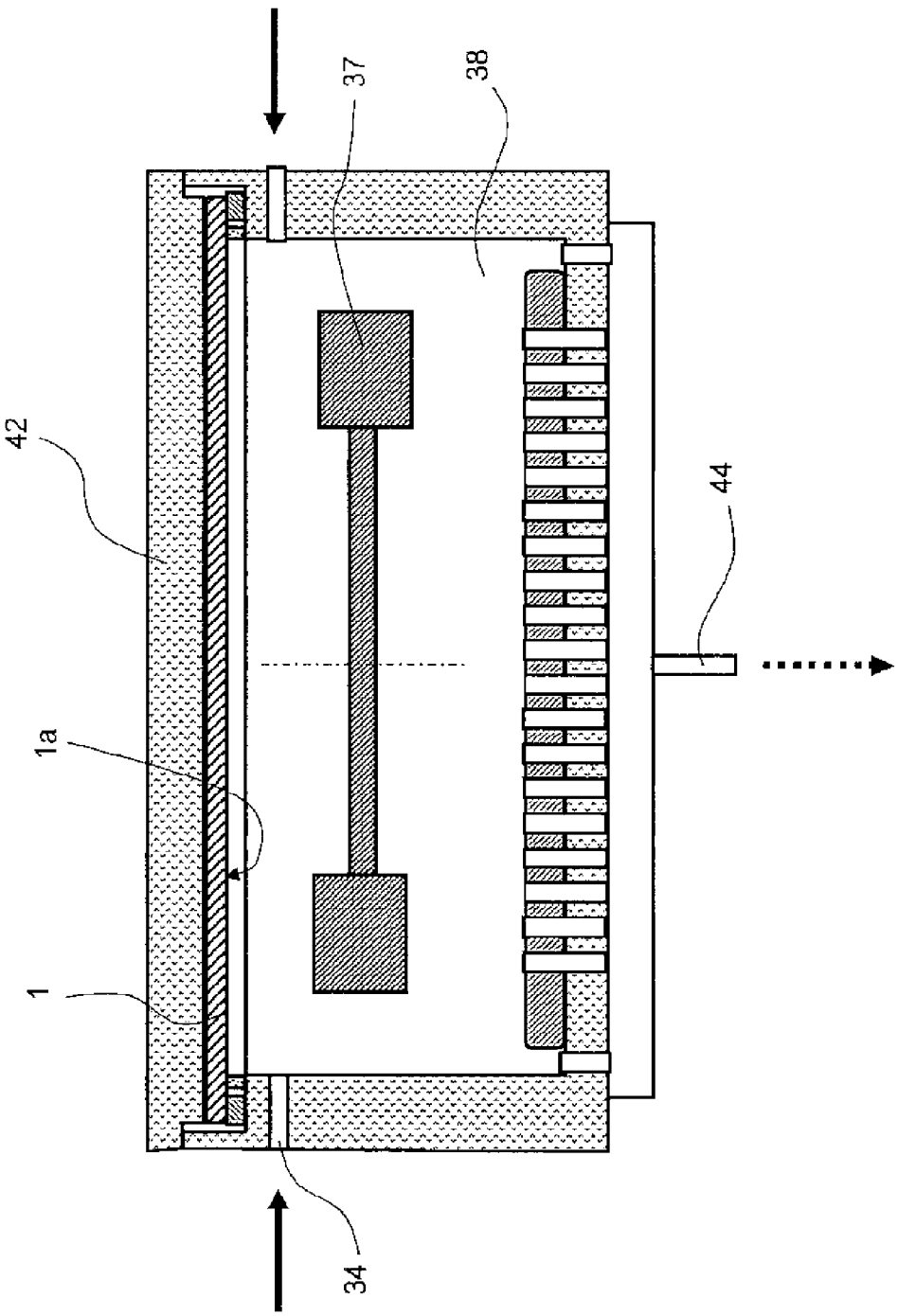
FIG. 22 is a cross-section view of a plating cup at a time of starting of plating solution introduction for cleaning in the Au bump plating process according to the manufacturing method of the semiconductor integrated circuit device of one embodiment of the present invention.
Figure 23:
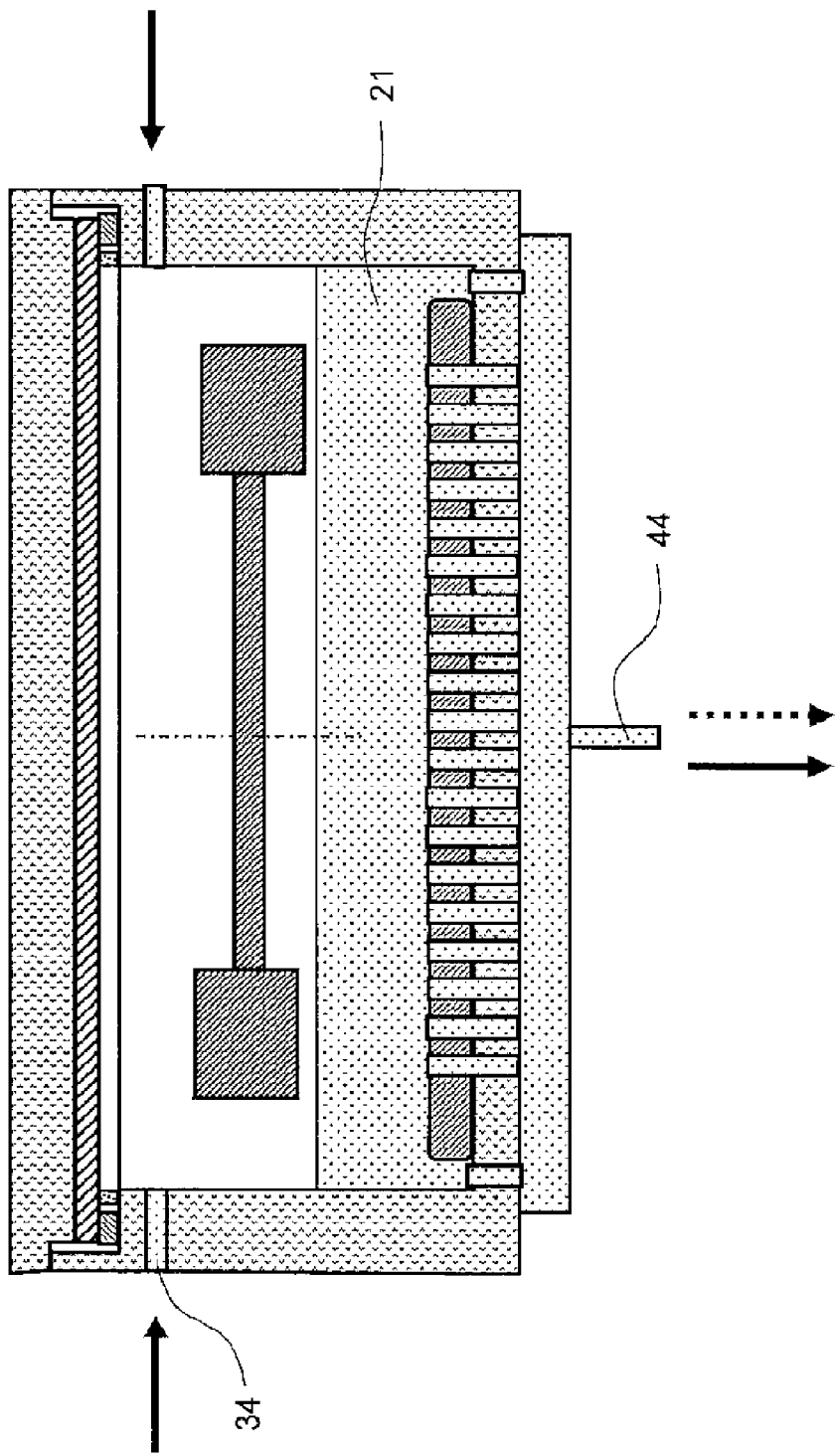
FIG. 23 is a cross-section view of the plating cup at a midpoint of plating solution introduction for cleaning in the Au bump plating process according to the manufacturing method of the semiconductor integrated circuit device of one embodiment of the present invention.

As illustrated in FIG. 17, a plurality of wafers 1 (for example, wafers of 300φ, 400φ and other diameters may be used) introduced in the plating apparatus are standing ready in the Foup (standing in foup step 81). After that, the wafers 1 are aligned (alignment step 82), and are subjected to wafer surface treatment (surface treatment of wafer step 83). Subsequently, as illustrated in FIG. 21, the wafers 1 are introduced in the plating cup 24 (introduction into cup step 84; FIG. 17). In addition, the bottom end (bottom) of the plating cup 24 is provided with a bottom end discharge pipe 44 for gathering the plating solution etc. from a large number of discharge ports 36 to send them to a circulation system. Next, as illustrated in FIG. 22, introduction of the plating solution is started from the upper side surface introduction ports 34 (plating solution introduction ports provided to the vicinity of the wafer set in the plating cup) (plating solution or cleaning fluid introduction step 85; FIG. 17). Furthermore, as illustrated in FIG. 23, the liquid level of the plating solution 21 rises. At that time, a part of gas is discharged through the bottom end discharge pipe 44 together with a part of the plating solution 21. Here, the liquid chemical for cleaning and the plating solution for plating are the same one. Because, this gives higher process stability and a simpler apparatus configuration than those of other cases. However any liquid chemical that can dissolve the Au containing precipitates can be used as the liquid chemical for cleaning. Accordingly, by using the plating solution itself as the liquid chemical for cleaning (cleaning liquid chemical), merits that process stability is ensured, and as well as the apparatus configuration becomes simple, are provided. However, it is possible to optimize the cleaning conditions as needed by using cleaning liquid chemical having a slightly different composition.

Moreover, as the plating solution, the gold sulfite based plating solution (a water solution containing sodium gold sulfite, ethylenediamine, and salt of an inorganic acid as principal components, and other few additives) that is a non-cyan based plating solution and has a few environmental problems, is used. One example of principal composition for the gold sulfite based plating solution is exemplified as follows. That is, the composition includes, for example, Au: 8-12 g/l; Ta: 3.5-10 mg/l; $SO_3^{2-}$: 20-80 g/l; $SO_4^{2-}$: 20-80 g/l; pH: 7.6-8; and specific gravity: 11-25. In addition, thallium is added to the composition as a stress relaxation agent etc.

If sufficient environmental care is taken, it is needless to say that a cyan-based plating solution can also be used.

Figure 24:
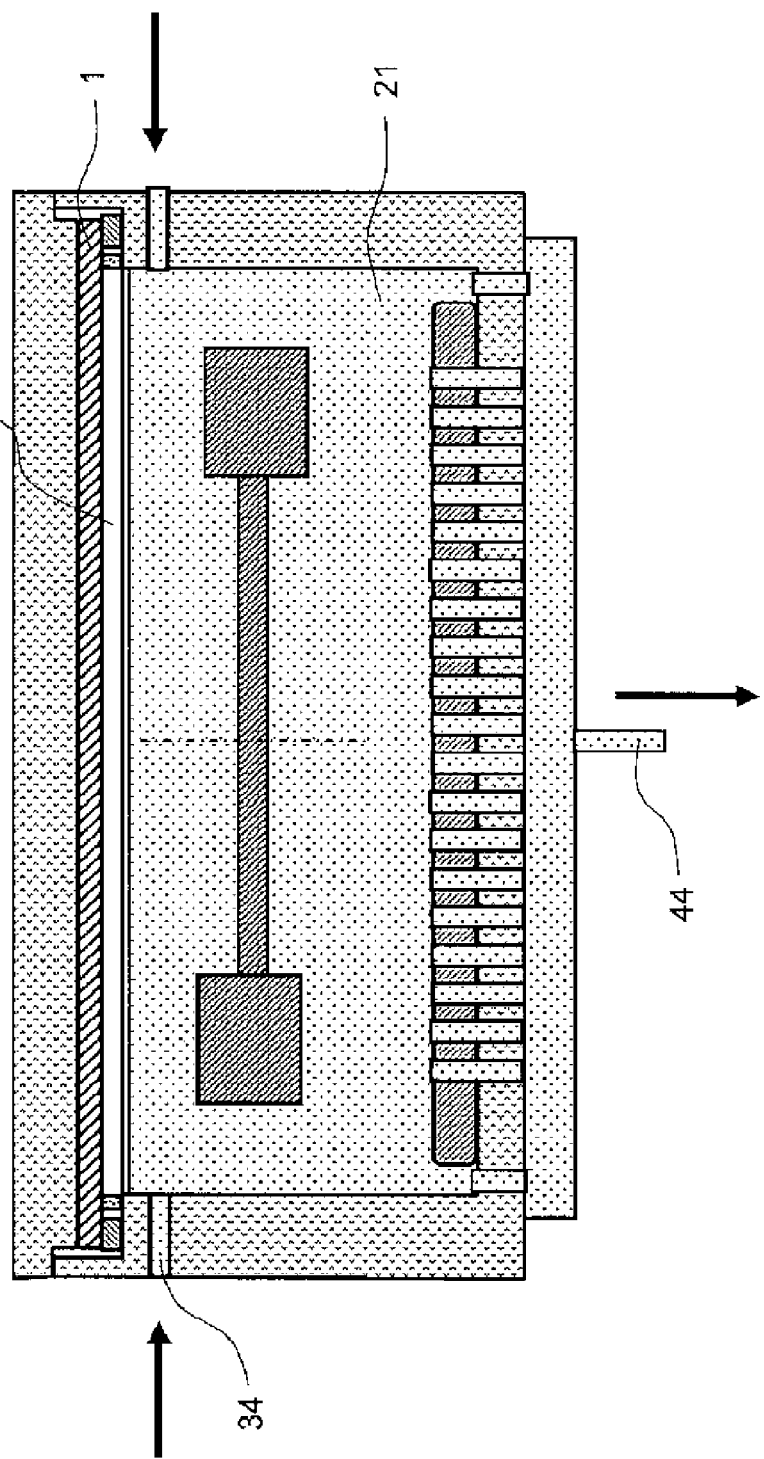
FIG. 24 is a cross-section view of the plating cup at a time of completion of plating solution introduction for cleaning in the Au bump plating process according to the manufacturing method of the semiconductor integrated circuit device of one embodiment of the present invention.
Figure 25:
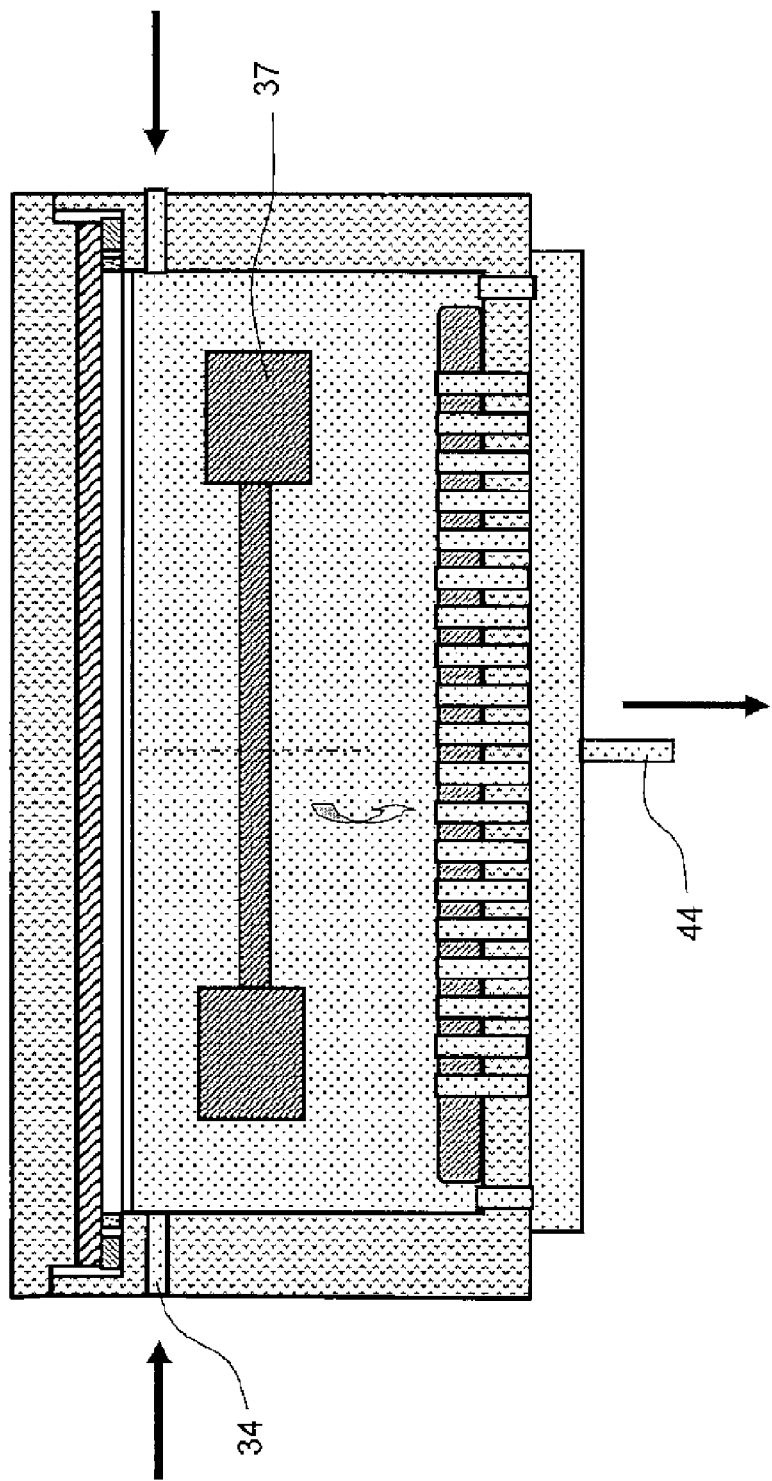
FIG. 25 is a cross-section view of the plating cup at a time of counterclockwise stirring for cleaning in the Au bump plating process according to the manufacturing method of the semiconductor integrated circuit device of one embodiment of the present invention.
Figure 26:
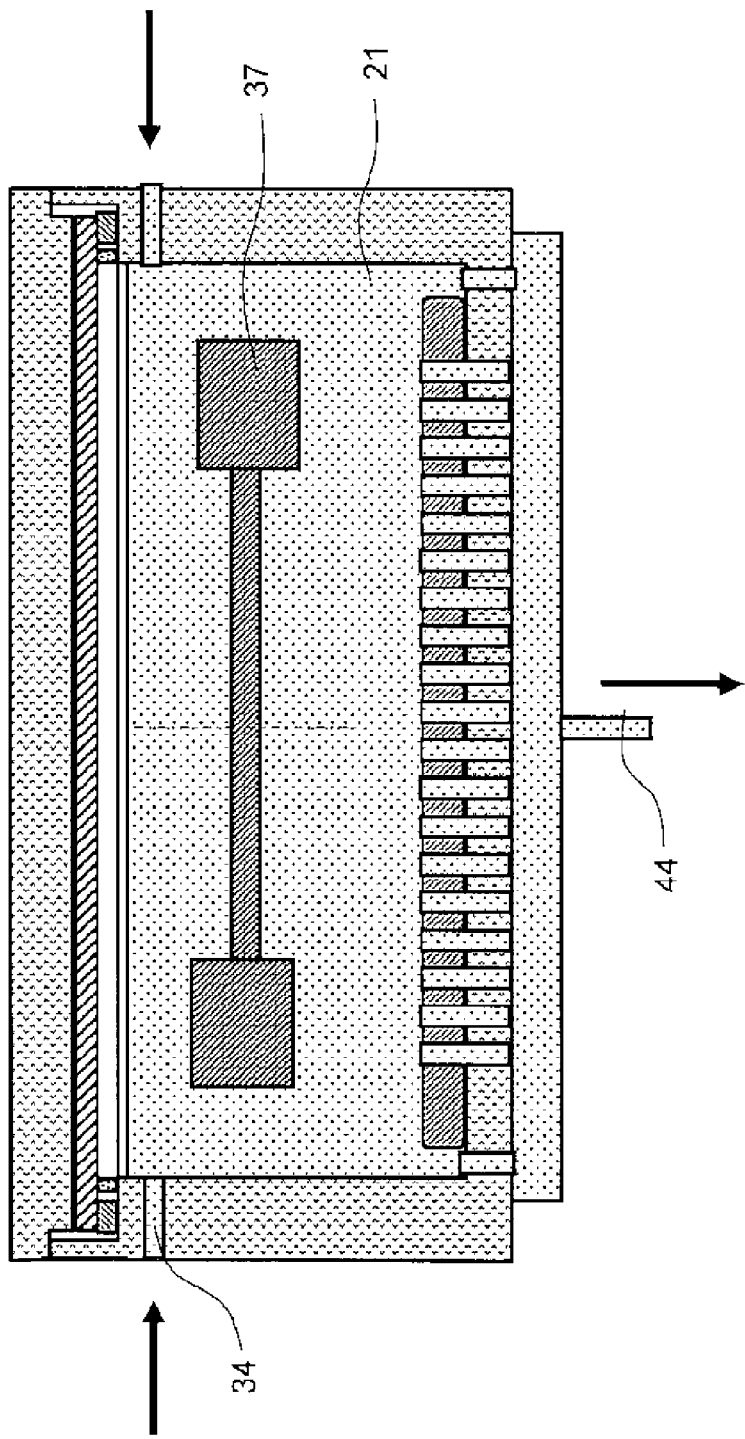
FIG. 26 is a cross-section view of the plating cup at a time of circulation of plating solution (switching of rotation) for cleaning in the Au bump plating process according to the manufacturing method of the semiconductor integrated circuit device of one embodiment of the present invention.
Figure 27:
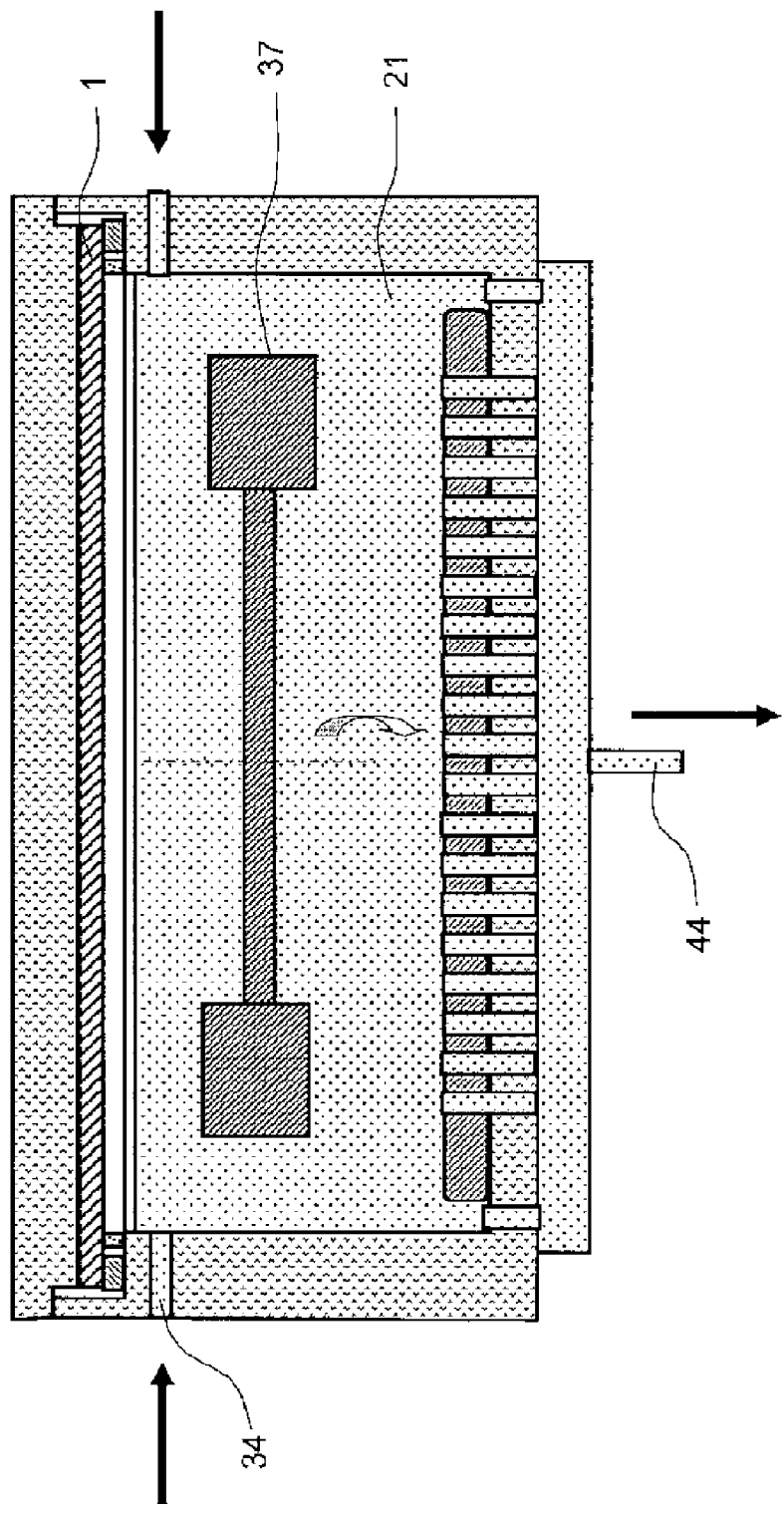
FIG. 27 is a cross-section view of the plating cup at a time of clockwise stirring for cleaning in the Au bump plating process according to the manufacturing method of the semiconductor integrated circuit device of one embodiment of the present invention.
Figure 28:
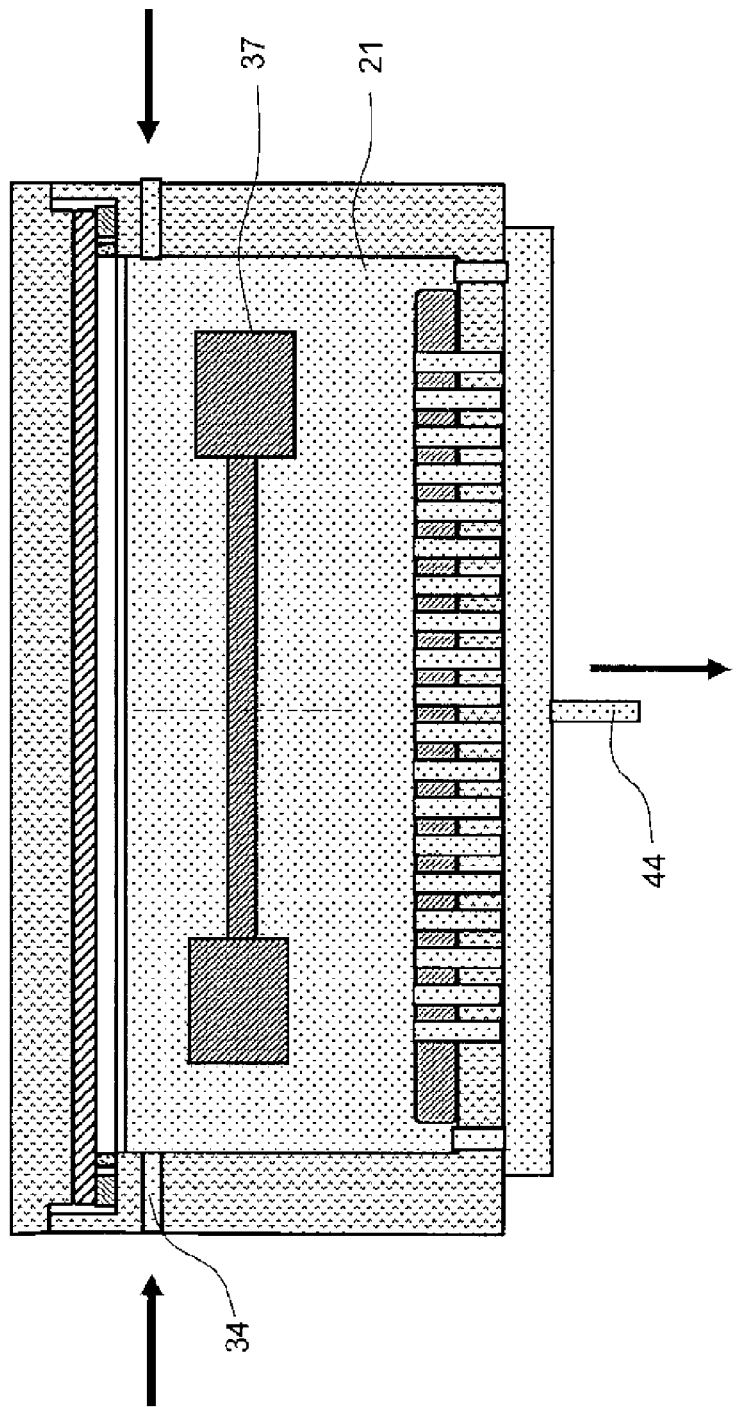
FIG. 28 is a cross-section view of the plating cup at a time of circulation of plating solution (completion of cleaning) for cleaning in the Au bump plating process according to the manufacturing method of the semiconductor integrated circuit device of one embodiment of the present invention.

Thus, as illustrated in FIG. 24, when the plating tank 38 is substantially filled with the plating solution 21 (cleaning fluid or liquid chemical), the tank 38 immediately enters a state of circulation of plating solution (circulation of plating solution sub-step 101; FIG. 18), and a cup cleaning step 86 (FIG. 17) is started. For the first cycle, the circulation of plating solution sub-step 101 continues, for example, for about 60 sec. For the second and subsequent cycles, the sub-step 101 continues for about 1 sec. Then, as illustrated in FIG. 25, the plating solution 21 is stirred by counterclockwise rotation of the stirrer 37 in a circulation state where the plating solution is introduced from the upper side surface introduction ports 34 and discharged from the bottom end discharge pipe 44 (stirring by counterclockwise rotation sub-step 102; FIG. 18). At that time, current for plating is not applied. The rotation speed of the stirrer 37 is, for example, about 50 rpm, and the rotation time thereof is, for example, about 29 seconds. After that, counterclockwise rotation of the stirrer 37 is stopped and the process returns to a circulation state (circulation of plating solution sub-step 103), which continues, for example, about 1 second. As illustrated in FIG. 27, the plating solution 21 is stirred by clockwise rotation of the stirrer 37 (stirring by clockwise rotation sub-step 104; FIG. 18). The rotation speed of the stirrer 37 is, for example, about 50 rpm, and the rotation time thereof is, for example, about 29 seconds. After that, as illustrated in FIG. 18, if necessary, a cleaning cycle including the circulation of plating solution sub-step 101 to stirring by clockwise rotation sub-step 104 is repeatedly carried out. Usually, the repeating number is preferably to be from about 5 to about 10. After the repeating cycle, as illustrated in FIG. 28, the process advances to a circulation of plating solution sub-step 105 (FIG. 18) for completing the cleaning step, which continues, for example, for about 60 seconds.

Figure 29:
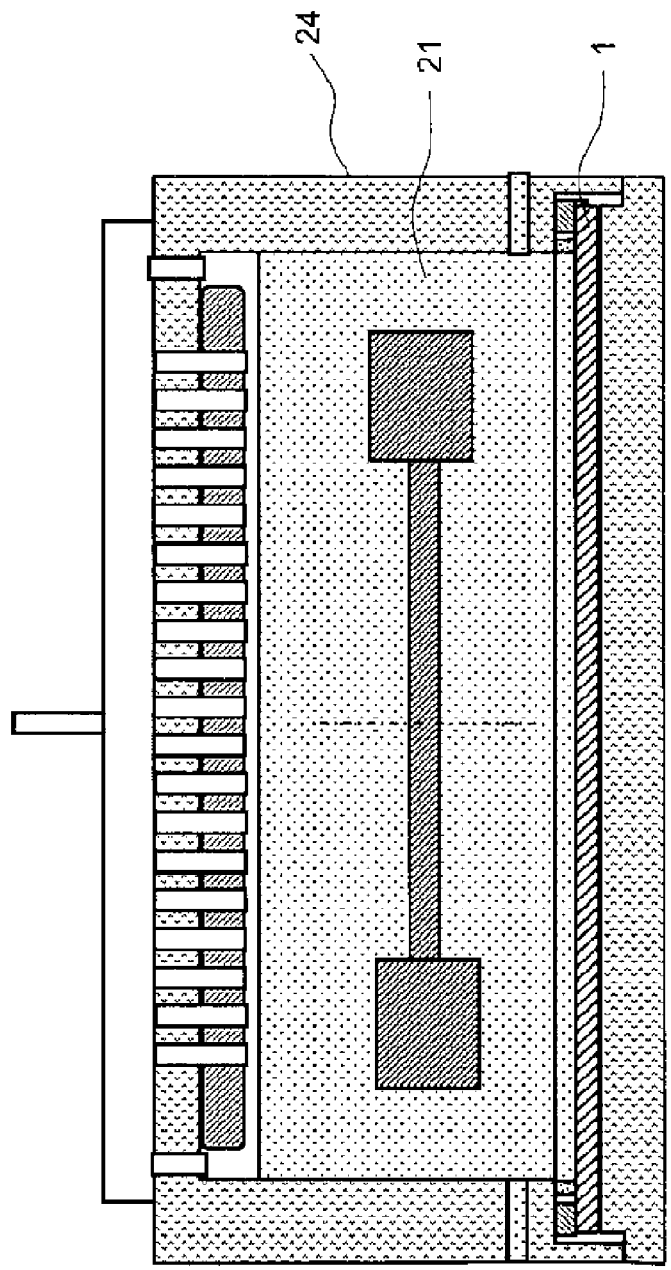
FIG. 29 is a cross-section view of the plating cup at a time of plating cup inversion for plating (including prior stirring) in the Au bump plating process according to the manufacturing method of the semiconductor integrated circuit device of one embodiment of the present invention.
Figure 30:
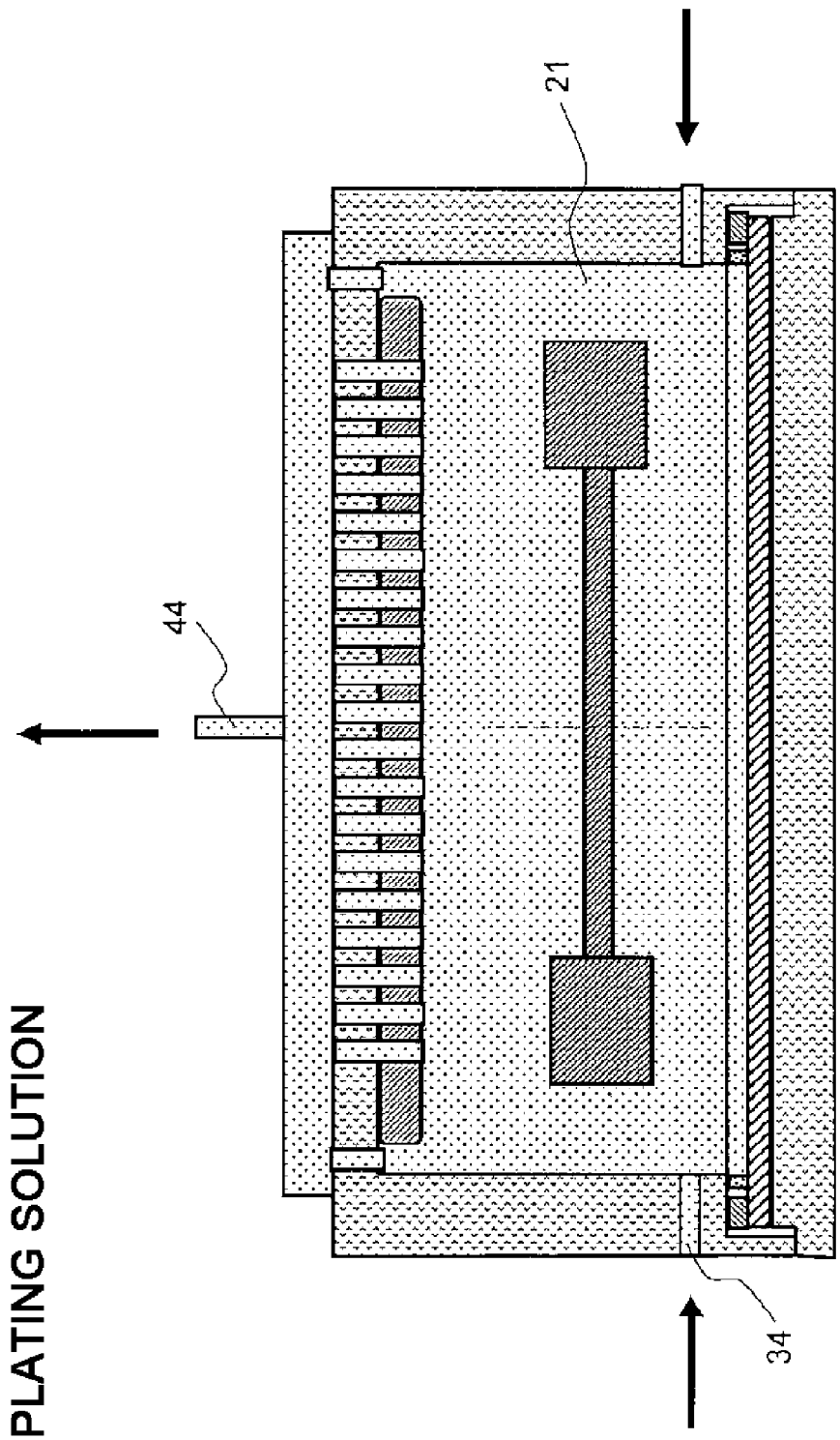
FIG. 30 is a cross-section view of the plating cup at a time of completely filling with the plating solution for plating (including prior stirring) in the Au bump plating process according to the manufacturing method of the semiconductor integrated circuit device of one embodiment of the present invention.
Figure 31:
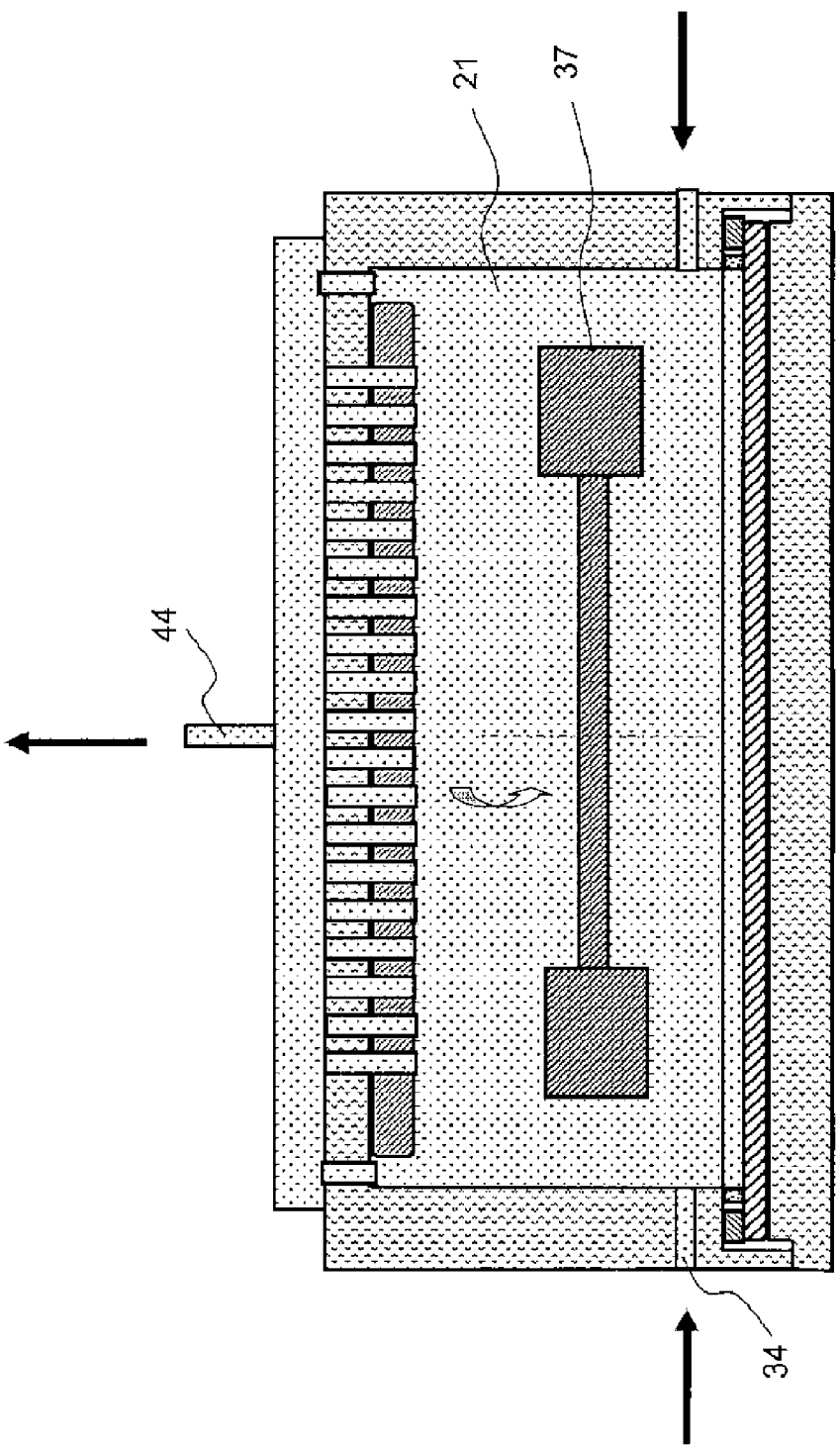
FIG. 31 is a cross-section view of the plating cup at a time of clockwise stirring for plating (including prior stirring) in the Au bump plating process according to the manufacturing method of the semiconductor integrated circuit device of one embodiment of the present invention.
Figure 32:
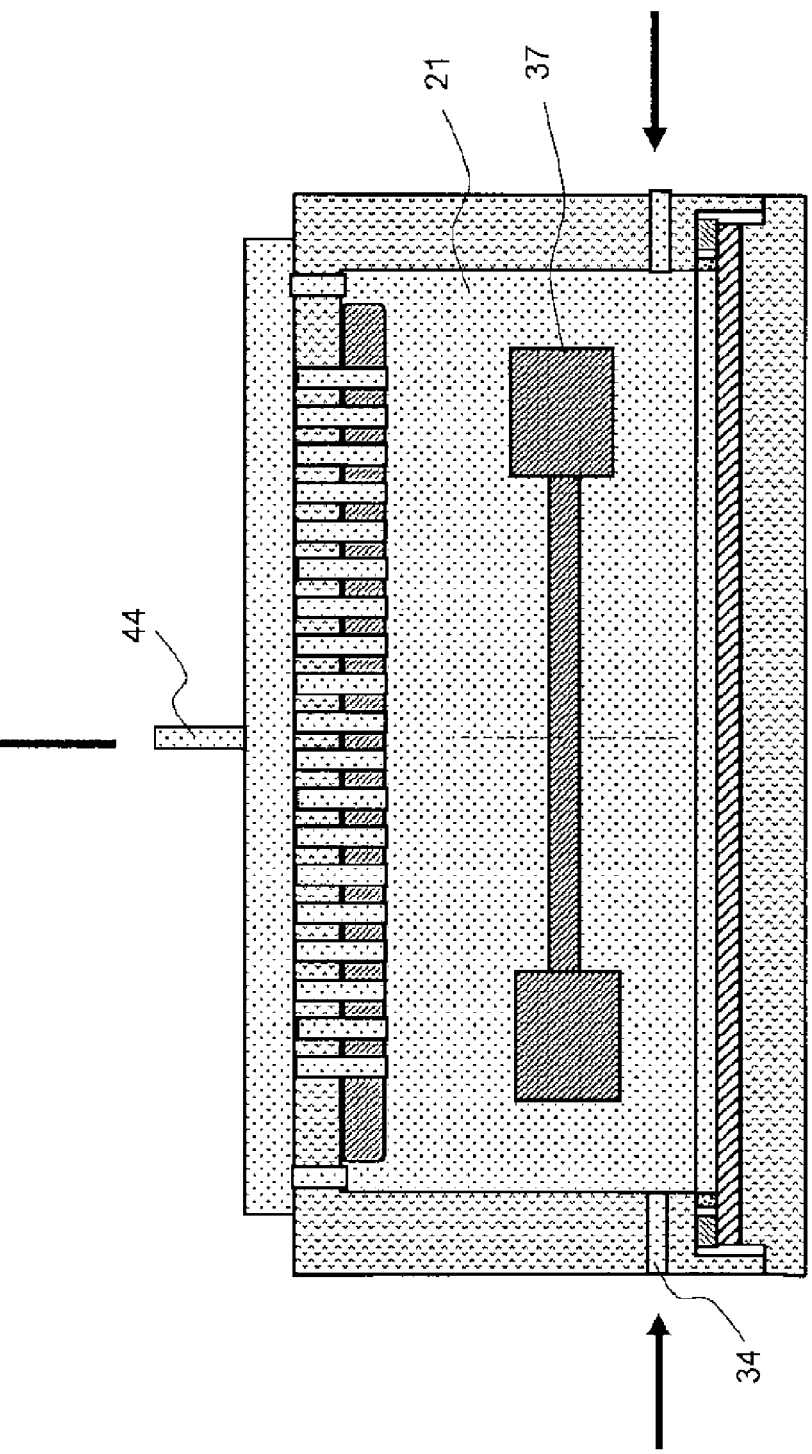
FIG. 32 is a cross-section view of the plating cup at a time of circulation of the plating solution (switching of rotation) for plating (including prior stirring) in the Au bump plating process according to the manufacturing method of the semiconductor integrated circuit device of one embodiment of the present invention.
Figure 33:
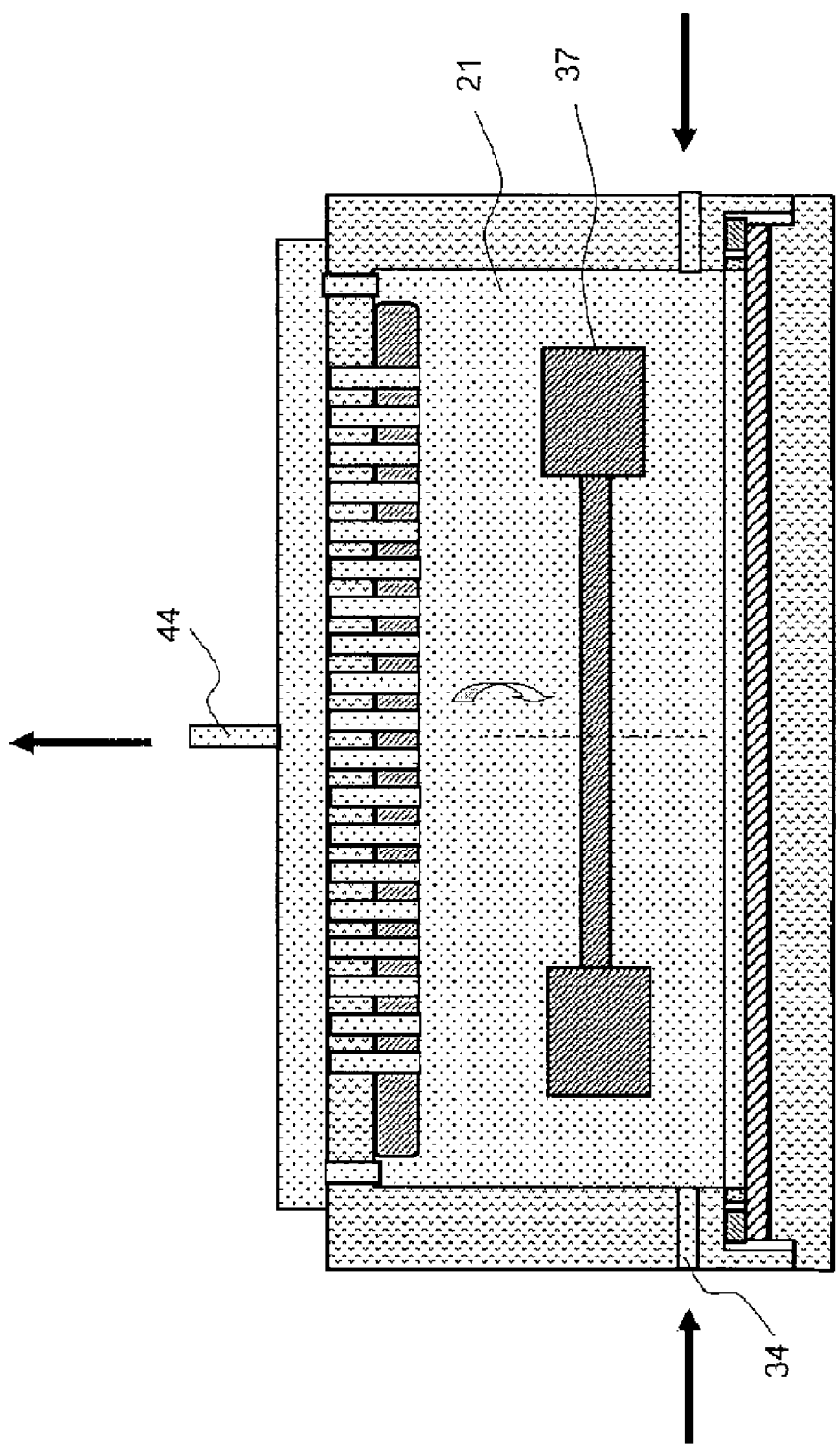
FIG. 33 is a cross-section view of the plating cup at a time of counterclockwise stirring for plating (including prior stirring) in the Au bump plating process according to the manufacturing method of the semiconductor integrated circuit device of one embodiment of the present invention.

After the cup cleaning is completed, circulation of the plating solution is terminated, and the process advances to the next cup inversion step 88 (FIG. 17). That is, as illustrated in FIG. 29, the cup is inverted by 180° (upside down). In addition, the cup may be inverted in a circulation state, however, this may require a complicated apparatus configuration. As illustrated in FIG. 30, the plating solution 21 is introduced from the upper side surface introduction ports 34 (as described before, because notation change due to cup reversing is a confusing matter, with regard to the introduction/discharge port, "the upper side" is denoted as the open end side of the cup regardless of the direction of gravity) in a cup inversion state, and the circulation thereof is started again. At that time, the gas inside the cup is forced upward by the plating solution 21 to be discharged from the bottom end discharge pipe 44 (because it locates at the bottom of the cup and in the upside down state, it locates at the upper side in normal meaning) in an orderly manner (complete filling of the plating solution), thereby, possibility of residual air bubbles is reduced. Thus, as illustrated in FIG. 30, when the tank is completely filled with the plating solution 21 (100% filling), immediately, the process enters a circulation of plating solution sub-step 111 (FIG. 19) of a prior stirring step 90 (FIG. 17) for mixing the plating solution 21 well. Here, current for plating is not applied yet. Subsequently, as illustrated in FIG. 31, the plating solution 21 is stirred by the counterclockwise rotation of the stirrer 37 (stirring by counterclockwise rotation sub-step 112; FIG. 19). The rotation speed of the stirrer 37 is, for example, about 50 rpm, and the rotation time thereof is, for example, about 29 seconds. When the stirrer 37 is stopped, as illustrated in FIG. 32, the process enters a circulation sub-step 113 (FIG. 19), which continues, for example, for about 1 second. Next, as illustrated in FIG. 33, the plating solution 21 is stirred by the clockwise rotation of the stirrer 37 (stirring by clockwise rotation sub-step 114; FIG. 19). The rotation speed of the stirrer 37 is, for example, about 50 rpm, and the rotation time thereof is, for example, about 29 seconds. After that, when the stirrer 37 is stopped again, as illustrated in FIG. 34, the process enters a circulation sub-step 121 (FIG. 20) of a plating step 91 (FIG. 17), which continues, for example, for about 1 second.

As illustrated in FIG. 20, the plating step 91 (FIG. 17) is divided into a first stage of a low current plating cycle 136 (for example; current density: about 0.2 A/dm2, that is a second plating current or current density) and a second stage of high current plating cycle 137 (for example; current density: about 0.9 A/dm2, that is a first plating current or current density). This is referred to as a "two-stage plating process". The reason of this is, because if the high current plating is carried out initially and rapidly, air bubbles may be generated. In addition, in the present embodiment, because the plating treatment is subjected to the wafer in a wafer face-up state, essentially, mixing of air bubbles (external air bubbles) is very few. However, by the two-stage plating process, it is also possible to reduce generation of air bubbles from the inside of the liquid (internal air bubbles). For example, if plating of a total thickness of about 15 μm is to be carried out, it is preferable to carry out plating to a thickness of, for example, about 0.5 to 1 μm by the low current plating cycle 136. In addition, if there is an allowable time, the plating treatment may be extended further.

Subsequent to the circulation sub-step 121 (FIG. 20), as illustrated in FIG. 31, the plating solution 21 is stirred by the counterclockwise rotation of the stirrer 37 (stirring by counterclockwise rotation sub-step 122; FIG. 20). At that time, low plating current is applied (the plating current is applied for the first time). The rotation speed of the stirrer 37 is, for example, about 120 rpm, and the rotation time thereof is, for example, about 59 seconds. After that, when the stirrer 37 is stopped, as illustrated in FIG. 32, the process enters a circulation sub-step 123 (FIG. 20), which continues, for example, for about 1 second. Next, as illustrated in FIG. 33, the plating solution 21 is stirred by the clockwise rotation of the stirrer 37 (stirring by clockwise rotation sub-step 124; FIG. 20). The rotation speed of the stirrer 37 is, for example, about 120 rpm, and the rotation time thereof is, for example, about 59 seconds. As illustrated in FIG. 20, the low current plating cycle 136 is repeated if necessary. It is suitable for the repeating number to be, for example, about 2 to about 6.

Figure 34:
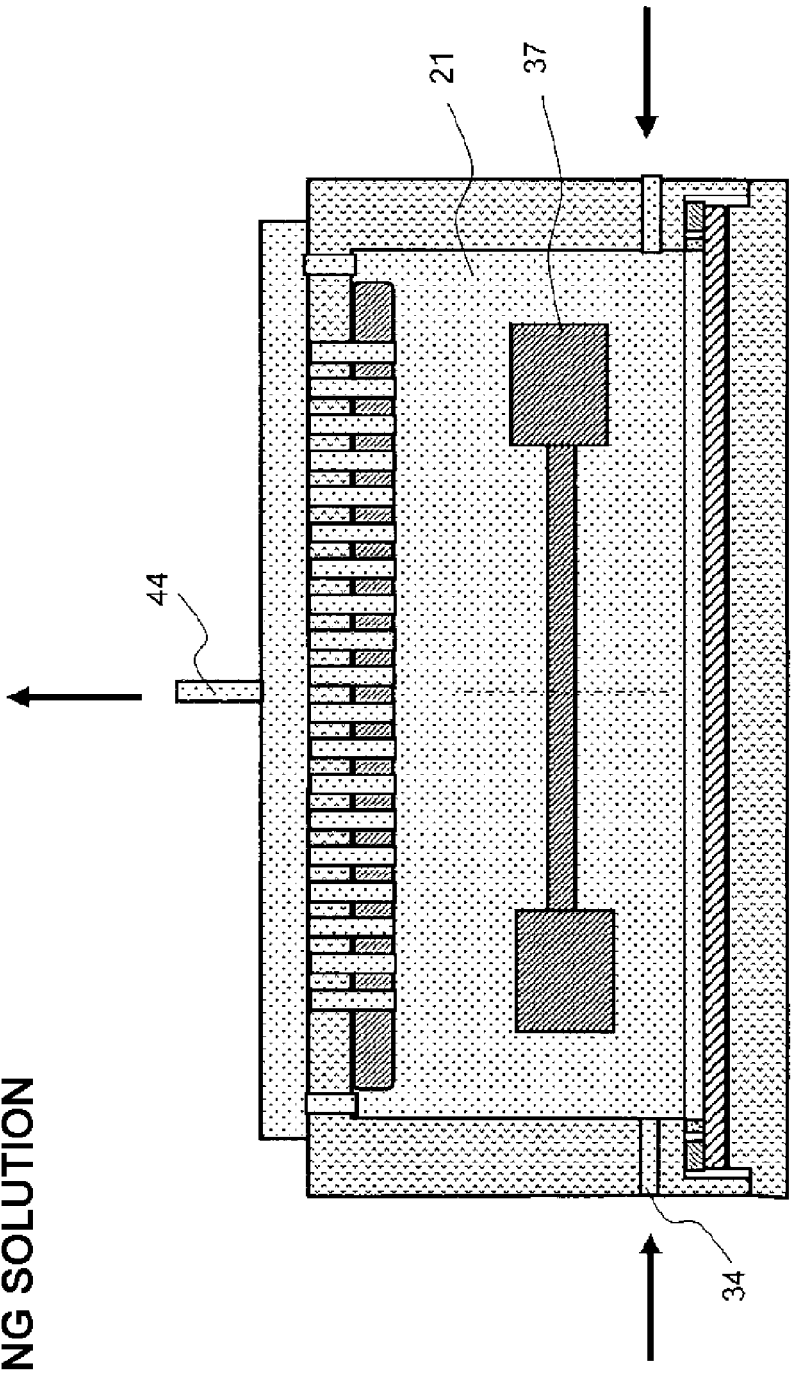
FIG. 34 is a cross-section view of the plating cup at a time of circulation of the plating solution (when plating or prior stirring is completed) for plating (including prior stirring) in the Au bump plating process according to the manufacturing method of the semiconductor integrated circuit device of one embodiment of the present invention.

In completion of the low current plating cycle 136, as illustrated in FIG. 34, the stirrer 37 is stopped, and the process enters a circulation of plating solution sub-step 131 (FIG. 20) of the high current plating cycle 137 (FIG. 20). At that time, the plating current is not applied. The sub-step 131 continues, for example, for 1 second. Next, as illustrated in FIG. 31, the plating solution 21 is stirred by the counterclockwise rotation of the stirrer 37 (stirring by counterclockwise rotation sub-step 132; FIG. 20). At that time, high plating current is applied. The rotation speed of the stirrer 37 is, for example, about 120 rpm, and the rotation time thereof is, for example, about 59 seconds. After that, when the stirrer 37 is stopped, as illustrated in FIG. 32, the process enters a circulation sub-step 133 (FIG. 20). At that time, the plating current is not applied. The sub-step 133 continues, for example, for 1 second. Next, as illustrated in FIG. 33, the plating solution 21 is stirred by the clockwise rotation of the stirrer 37 (stirring by clockwise rotation sub-step 134; FIG. 20). At that time, high plating current is applied. The rotation speed of the stirrer 37 is, for example, about 120 rpm, and the rotation time thereof is, for example, about 59 seconds. As illustrated in FIG. 20, the high current plating cycle 137 is repeated if necessary. If plating of total thickness of about 15 μm is to be carried out, it is suitable for the repeating number to be, for example, about 10 to about 15. At that time, the plating current is not applied, and when the stirrer 37 is stopped, the plating cycle is completed, and as illustrated in FIG. 34, the process enters a circulation sub-step 135 (FIG. 20), which continues, for example, for about 60 seconds. As for the final cycle of each plating cycle, it may be completed at a midpoint of the cycle in view of adjustment of the plating thickness.

Figure 35:
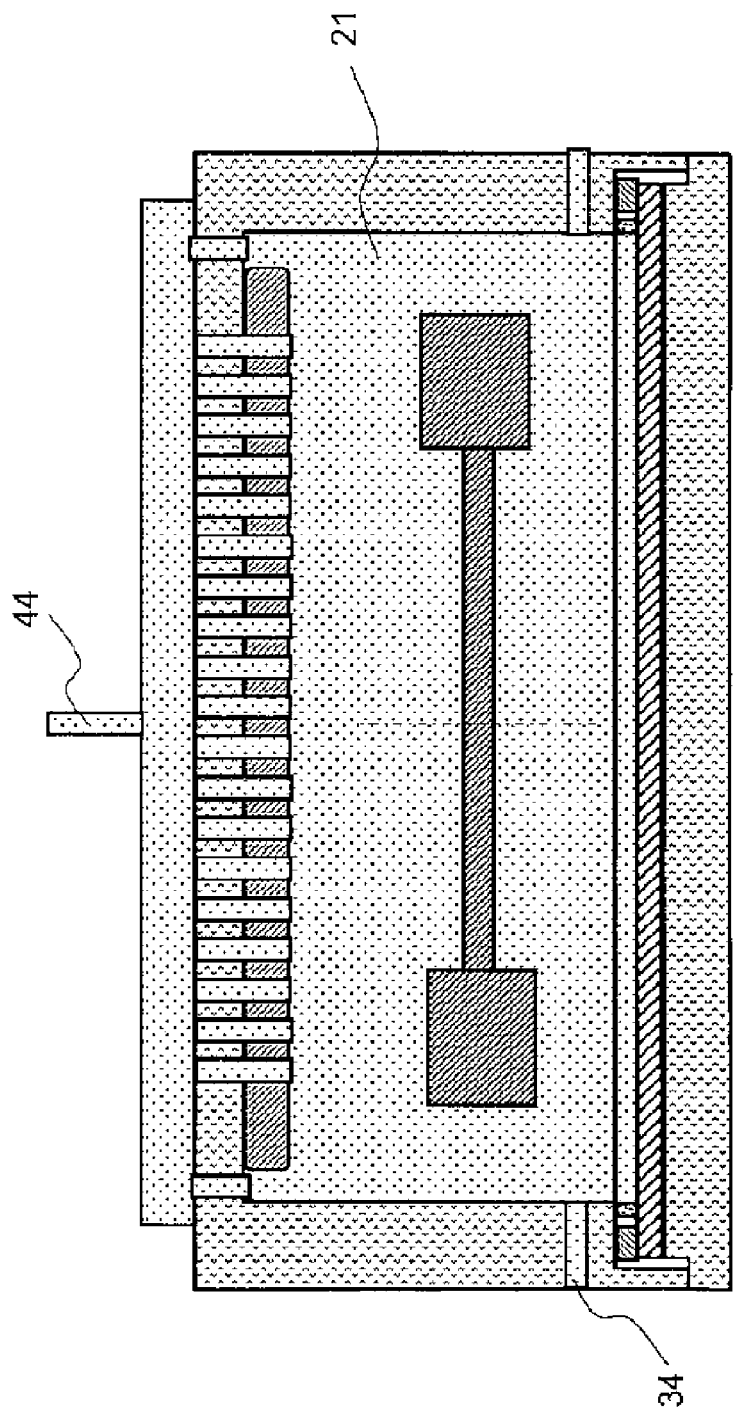
FIG. 35 is a cross-section view of the plating cup at a time of circulation of the plating solution when plating is completed in the Au bump plating process according to the manufacturing method of the semiconductor integrated circuit device of one embodiment of the present invention.
Figure 37:
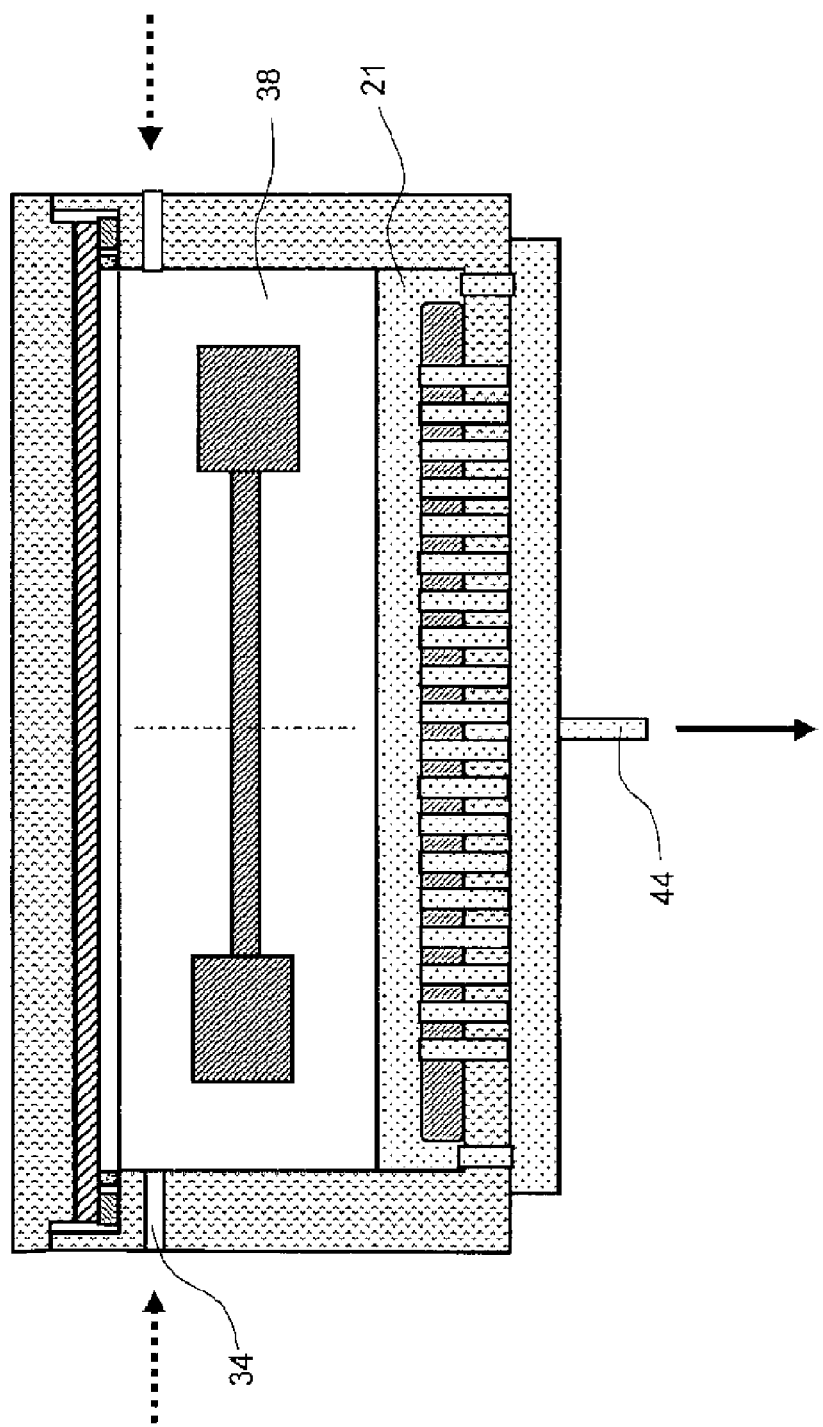
FIG. 37 is a cross-section view of the plating cup at a midpoint of discharge of the plating solution after completion of plating in the Au bump plating process according to the manufacturing method of the semiconductor integrated circuit device of one embodiment of the present invention.
Figure 38:
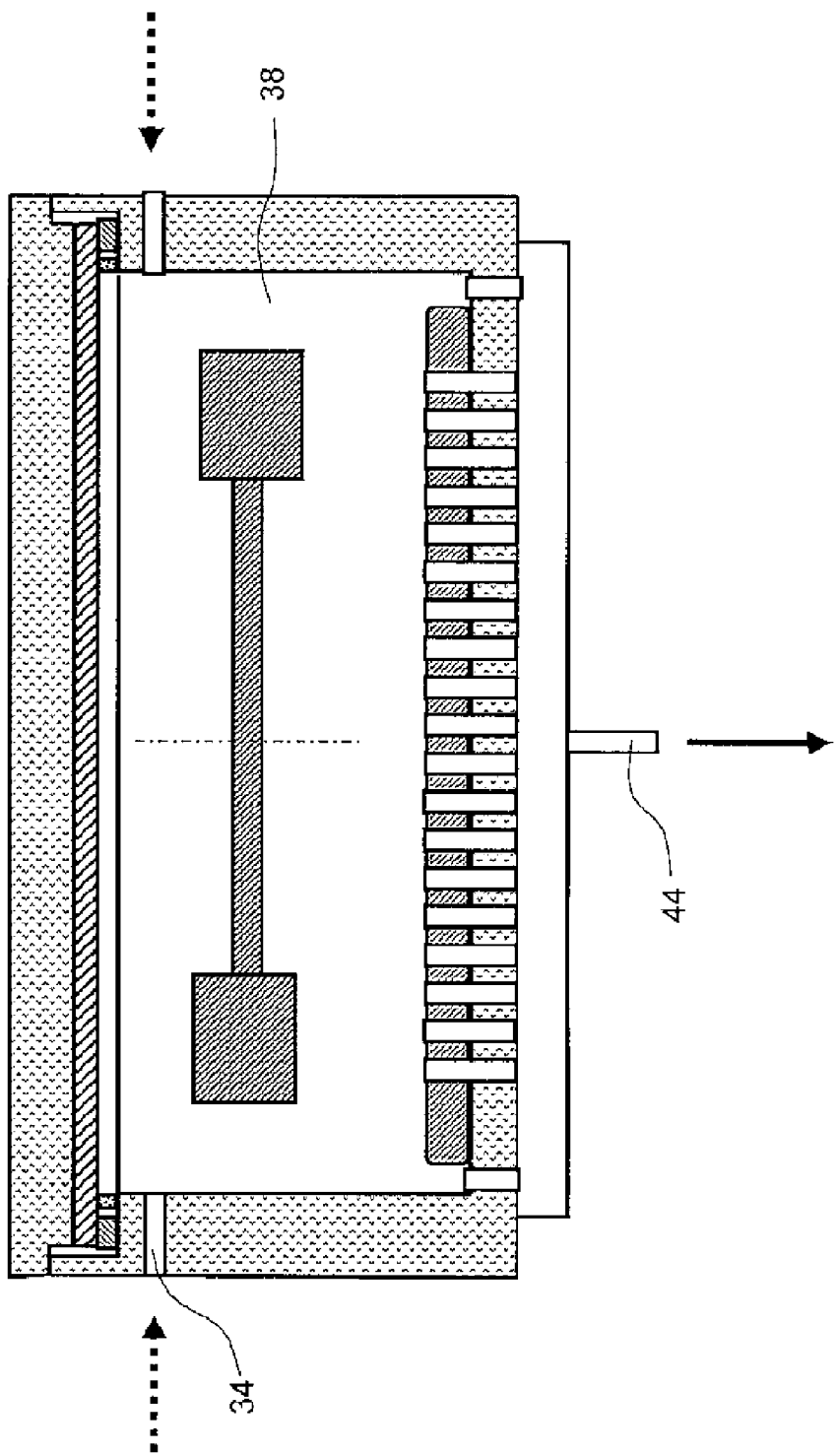
FIG. 38 is a cross-section view of the plating cup at a time of completion of discharge of the plating solution after completion of plating in the Au bump plating process according to the manufacturing method of the semiconductor integrated circuit device of one embodiment of the present invention.
Figure 39:
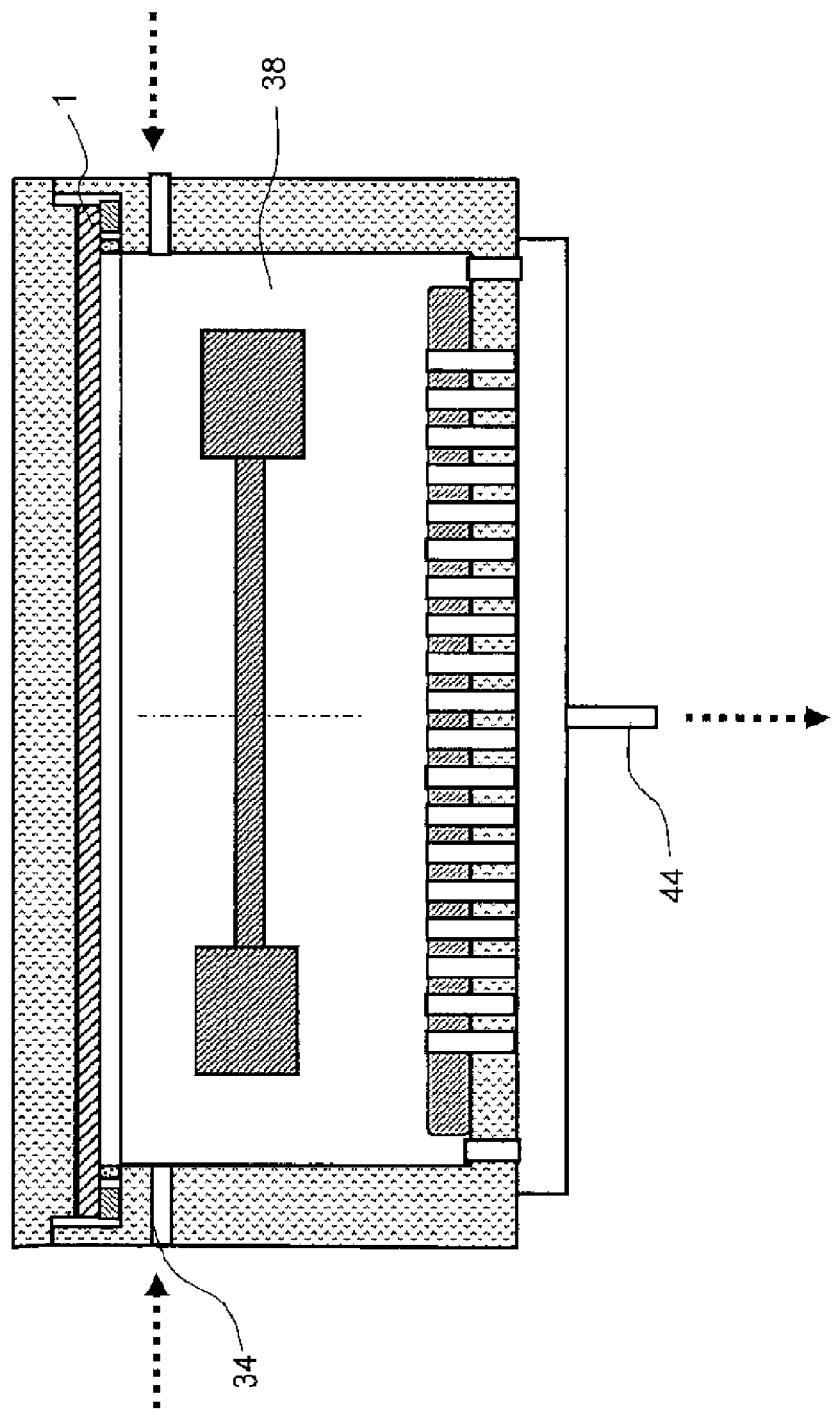
FIG. 39 is a cross-section view of the plating cup at a time of gas purging after completion of plating in the Au bump plating process according to the manufacturing method of the semiconductor integrated circuit device of one embodiment of the present invention.
Figure 40:
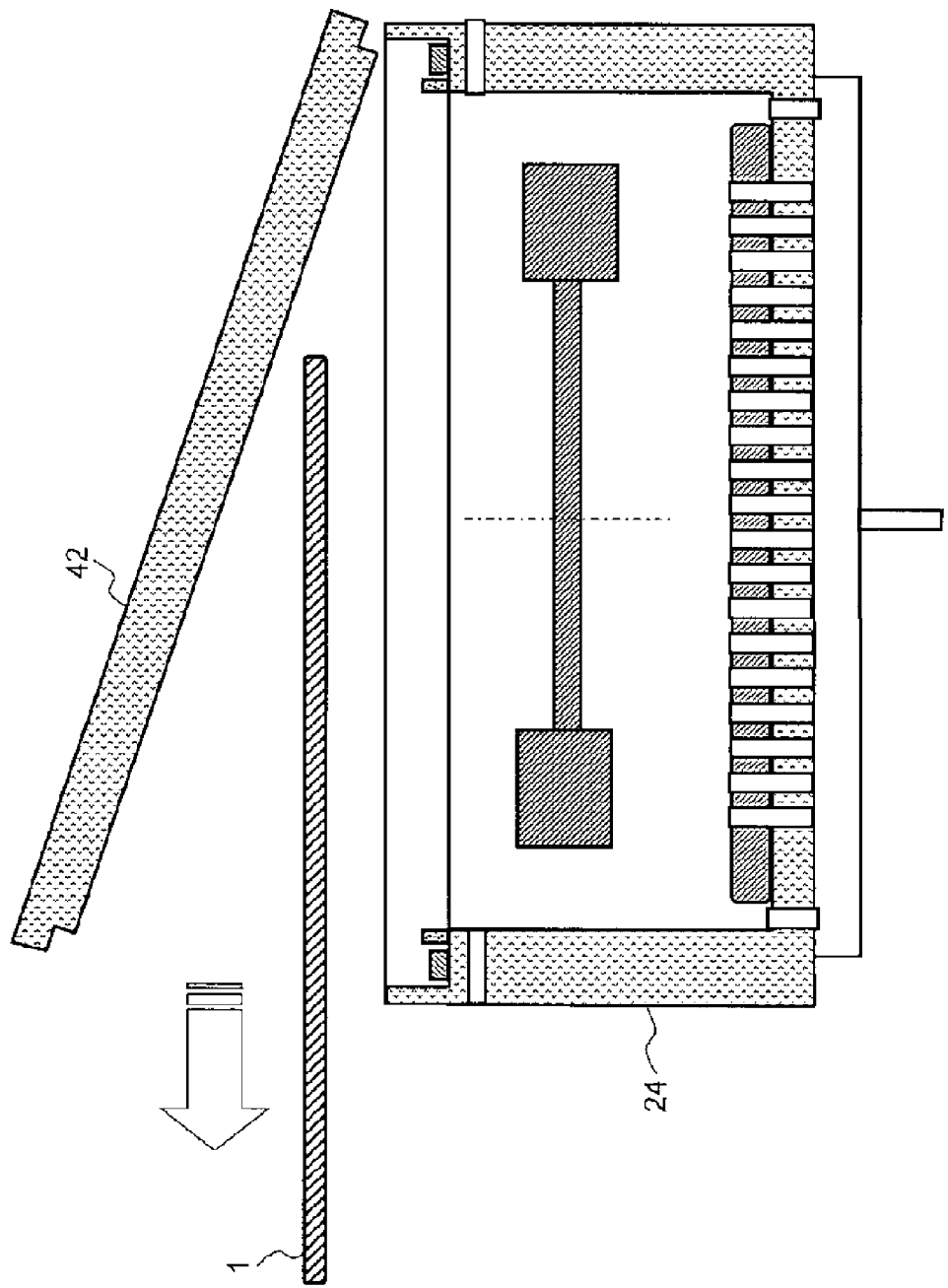
FIG. 40 is a cross-section view of the plating cup at a time of wafer unloading after completion of plating in the Au bump plating process according to the manufacturing method of the semiconductor integrated circuit device of one embodiment of the present invention.

Subsequently, as illustrated in FIG. 35, circulation of the plating solution 21 is also stopped. Here, as illustrated in FIG. 36, the plating cup 24 is inverted again and returns to the erecting state (cup re-inversion step 92; FIG. 17). After that, as illustrated in FIG. 37, the plating solution 21 is discharged from the bottom end discharge pipe 44. The reason why the discharge of the plating solution is carried out by re-inverting the cup to be in the erecting state, is to rapidly discharge the plating solution from the bottom of the cup without adhering foreign matters etc. to the wafer by flowing the plating solution vertically. As the plating solution 21 reduces, nitrogen gas is fed into the plating tank 38 from the upper side surface introduction ports 34 (discharge of plating solution step 93; FIG. 17). Furthermore, as illustrated in FIG. 38, the plating solution is completely discharged from the plating tank 38. Subsequently, as illustrated in FIG. 39, a nitrogen purging step 94 (FIG. 17) is carried out by feeding the nitrogen gas into the plating tank 38 from the upper side surface introduction ports 34 and discharging the gas from the bottom end discharge pipe 44. Finally, the wafer 1 is taken out from the plating cup 24 by opening the lid 42 thereof (wafer unloading step 95; FIG. 17).

5. Explanation of Detection of Added Amount of Tl and Management Thereof in Au Bump Plating Process; Substantial Part of Manufacturing Method of Semiconductor Integrated Circuit Device of Embodiment of Present Application (Mainly FIGS. 41 to 45)

In this section, detection of the added amount of Tl of the plating solution in the plating process explained in other sections, and management thereof, will be explained.

Because, usually, the added amount of Tl in the non-cyan based electrolytic Au plating solution is in a ppm order, detection and management thereof depend on a chemical analysis by sampling, which is accompanied with a time lag. However, real time management cannot be achieved by this, thereby, this cannot prevent generation of a lot of defective products in a mass-production process.

Figure 41:
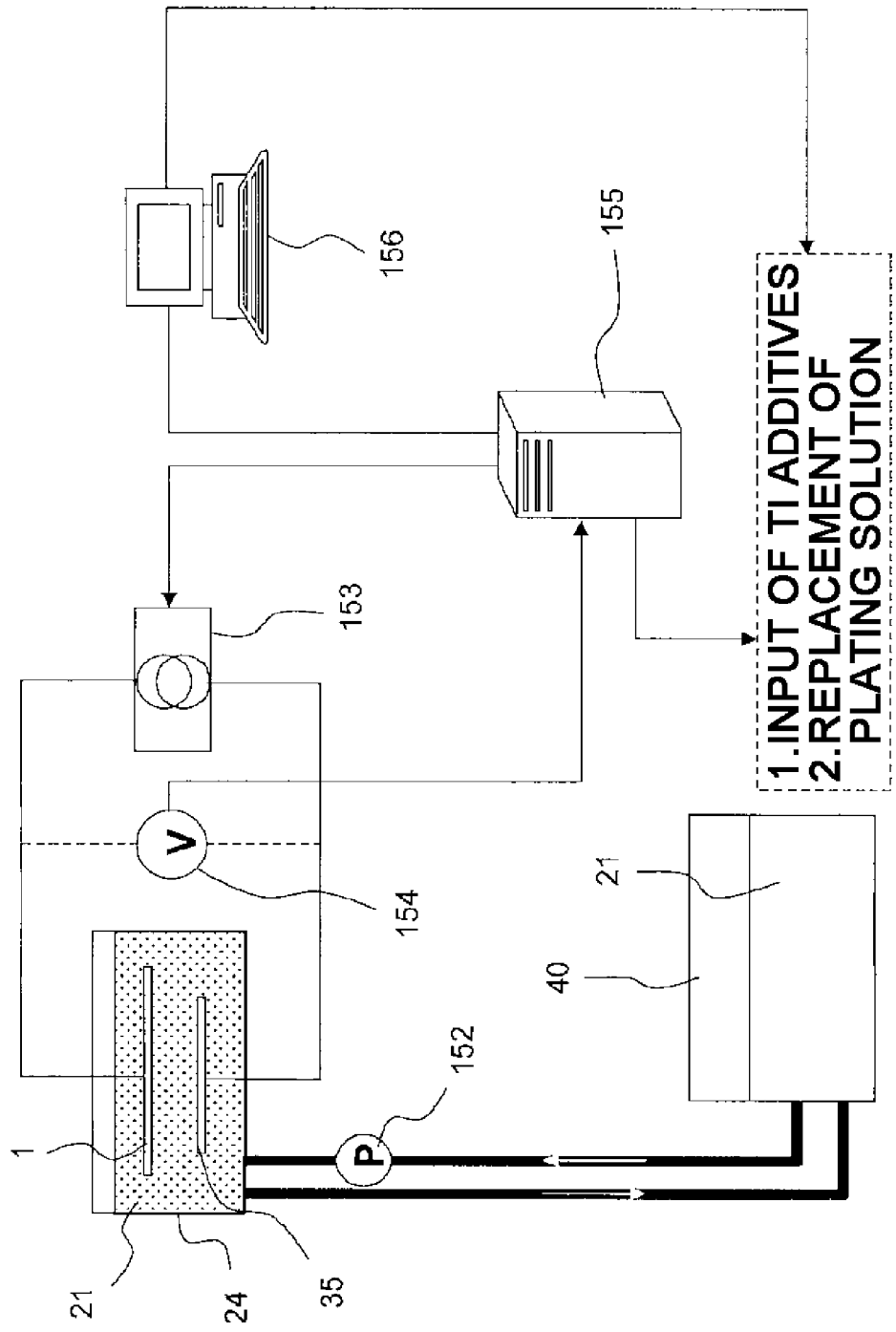
FIG. 41 is a configuration view of a Tl concentration control system, illustrating a system for detecting the added amount of Tl and controlling the Tl concentration in the Au bump plating process that is the substantial part of the manufacturing method of the semiconductor integrated circuit device of one embodiment of the present invention.

Thus, the plating system in FIG. 16 is provided with a system for detecting and managing the added amount of Tl as illustrated in FIG. 41. As illustrated in FIG. 41, the system is configured to monitor the transition of the plating voltage (voltage between the anode and the cathode of a plating cell) by supplying detection signal of a potentiometer 154 parallelly coupled to a constant current power supply 153 for supplying predetermined plating current to the plating cup 24 (plating cell) to an apparatus control system 155 (individual or common apparatus control system). Operation and condition inputting for the system can be executed from a control terminal 156 etc. Data etc. obtained by such a system will be explained below.

Figure 44:
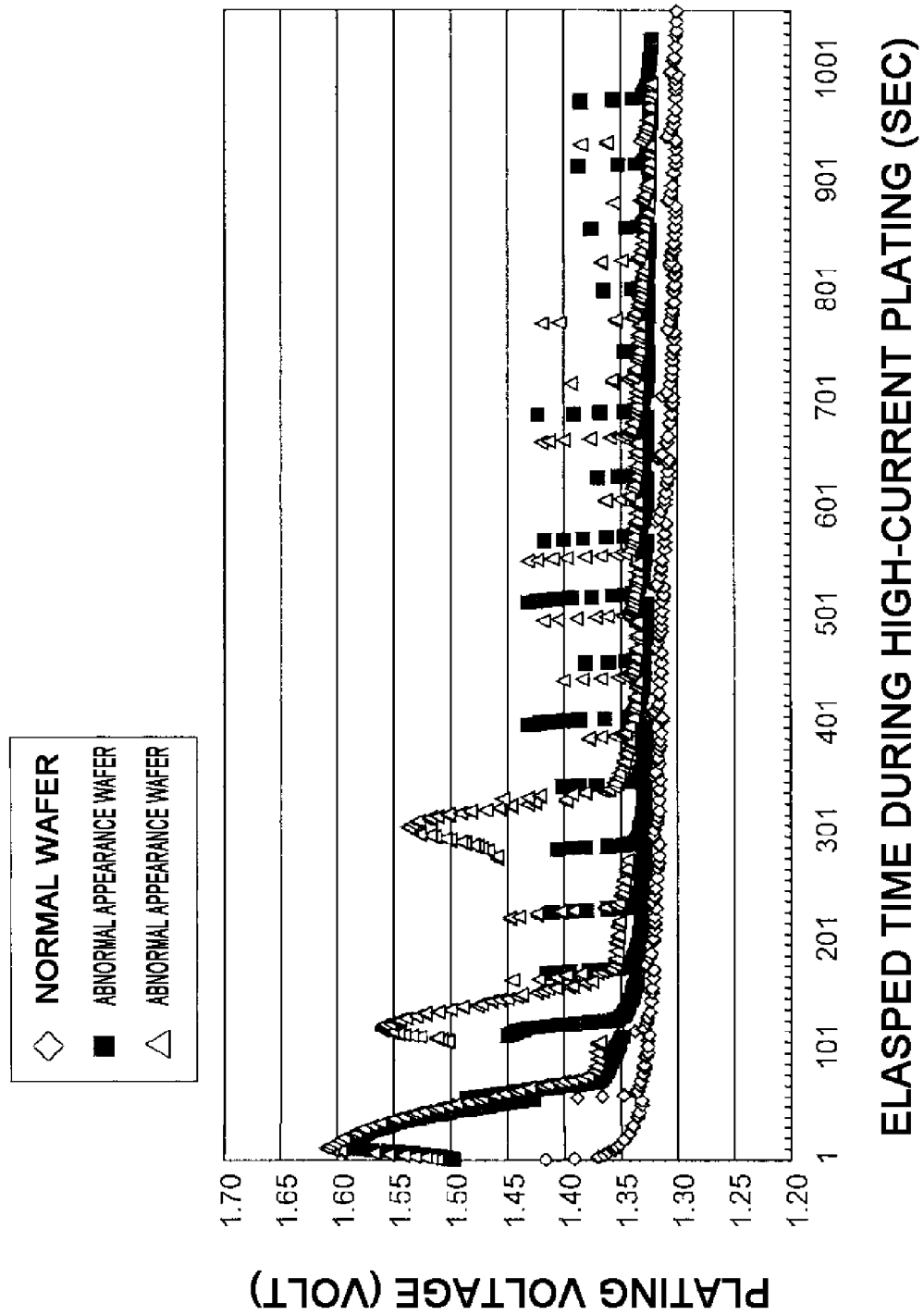
FIG. 44 is a data-plot view illustrating the relationship between the transition of the plating voltage and the defective appearance of the wafer according to the Tl concentration control system illustrated in FIG. 41.

FIG. 44 is a data-plot view illustrating the transition of the plating voltage in the high current plating cycle 137 explained in FIG. 20. As illustrated in FIG. 44, the reason of abrupt up and down is due to that plating-current-off periods such as the circulation of plating solution steps 131 and 132 and plating-current-on periods such as rotation/stirring steps 132 and 134 are repeated alternately. As the plating cycle is repeated, the fluctuation becomes small. The reason of this is considered that time is required until the state of the plating solution corresponds to high current. From FIG. 44, it is also known that the values of the initial peak voltage and the convergence voltage of a wafer having abnormal appearance are higher than those of a normal wafer. This can be explained as follows. That is, it is considered that for Au plating by a non-cyan based electrolytic plating solution, first, Tl is precipitated over the wafer (cathode), and after that, substitution of the precipitated Tl with Au in the liquid advances the Au plating. However, because this reaction path does not advance well in a plating solution where amounts of Tl are lacked, the constant current power source 153 (FIG. 41) will abruptly rise the output voltage in order to flow designated current. This tendency also appears in the convergent value in a similar manner, however, in the initial peak voltage (the peak of the voltage value appearing immediately after the current is applied at each step), the tendency appears as extremely larger difference than that of the former. FIG. 45 represents this schematically.

Figure 43:
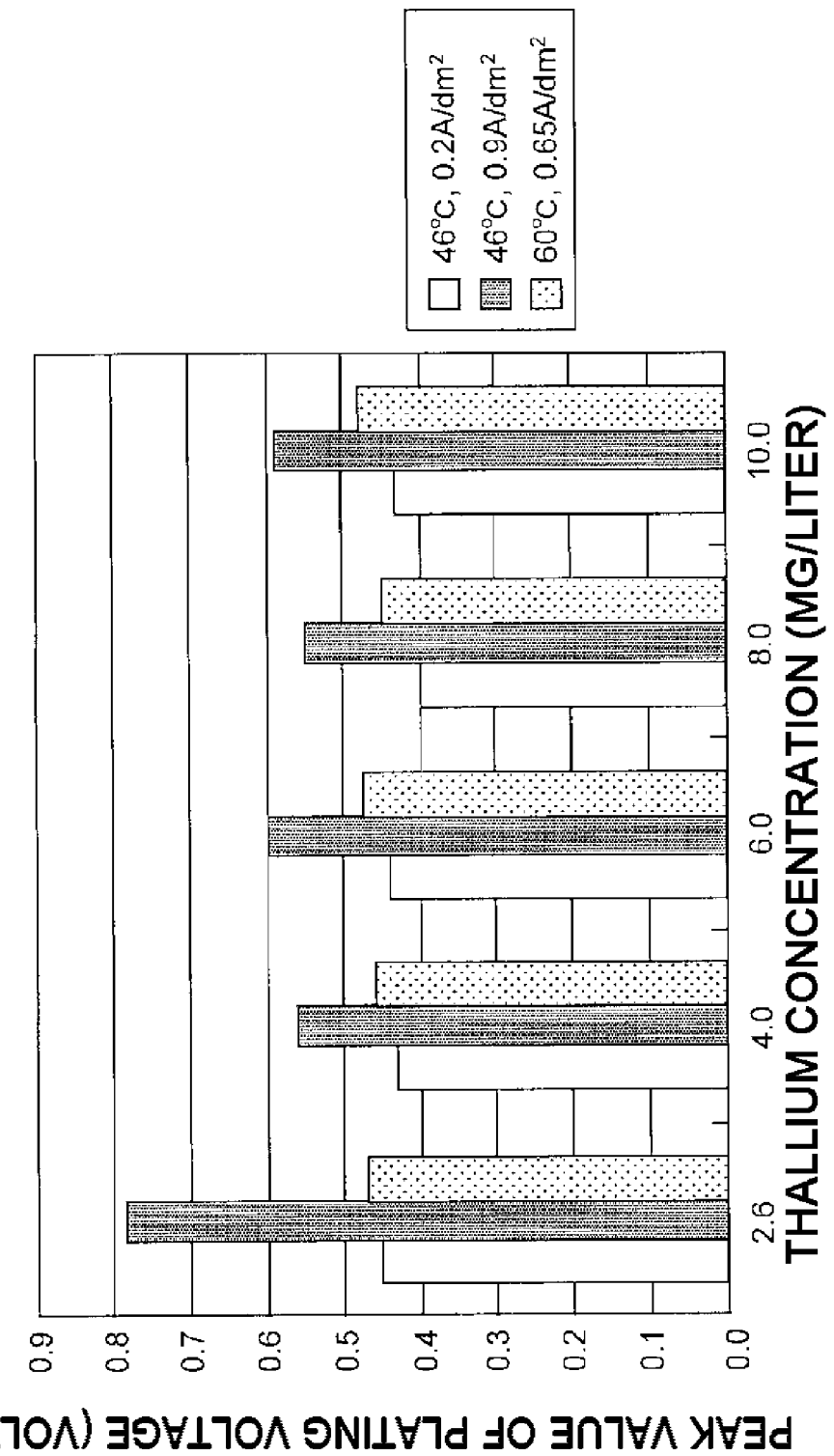
FIG. 43 is a histogram of the relationships (which are acquired and collected under various conditions) between the peak value of the plating voltage and the Ti concentration according to the Tl concentration control system illustrated in FIG. 41.

FIG. 43 is a view summarizing the relationships between the initial peak voltage (the peak value of the plating voltage) under various kinds of current densities and liquid temperatures and the Tl concentration. As known from FIG. 43, under conditions of high current density and relatively low liquid temperature (that is when the precipitated Au grains are small), Tl concentration dependence of the initial peak voltage increases.

FIG. 44 is a view illustrating the relationship between the peak value of the plating voltage and the Tl concentration when the temperature of the plating solution is 46 degree C.

As is known from the figure, as the Tl concentration decreases, the peak value of the plating voltage increases in a simple manner.

From the data mentioned above, as a method for managing Tl concentration, the following procedures can be exemplified.

Figure 42:
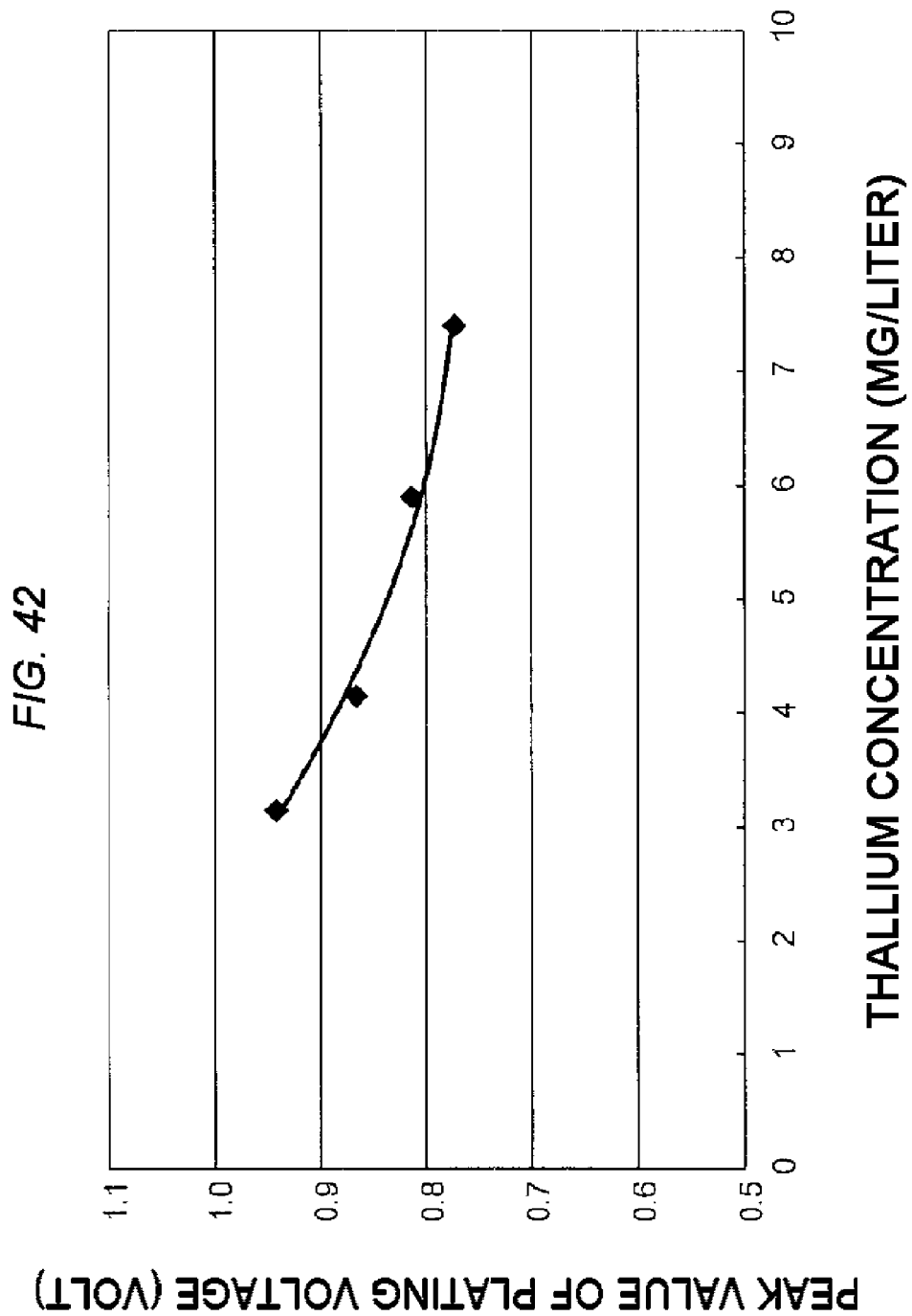
FIG. 42 is a data-plot view illustrating the relationship between the peak value of a plating voltage and the Tl concentration according to the Tl concentration control system illustrated in FIG. 41.

(1) In the Tl concentration management system in FIG. 41, automatically calculating the Tl concentration from the average value of the peak value of the plating voltage (observed applied voltage) in the high current plating cycle 137 (FIG. 20) by referring FIG. 42 etc.

(2) Comparing the calculated concentration with standard concentration (for example, 5.7 mg/liter) (these are collectively referred to as "reference concentration"); and when the calculated concentration is, for example, 4.5 mg/liter or more, determining that the Tl concentration is normal and continuing the plating treatment (for example, advancing to the next wafer treatment. The same holds below)

(3) When the calculated concentration is, for example, 4.0 mg/liter or more and smaller than 4.5 mg/liter, automatically adding Tl or Tl compound in the plating solution tank 40 (FIG. 41); and continuing the plating treatment. As Tl compounds, for example, thallium formate, thallium sulfate, thallium nitrate, thallium oxide etc. or the mixture of these are included. In addition, in this case, Tl or Tl compound may be added in the tank 40 during plating treatment, or may be added in the tank during a period between wafer treatments (a period between the former wafer treatment and the latter wafer treatment). However, as for the apparatus in FIG. 13 where a plurality of plating cups share one plating solution circulation system, in many cases, Tl or Tl compound is added in the tank during plating treatment with respect to another wafer.

(4) When the calculated concentration is, for example, 3.5 mg/liter or more and smaller than 4.0 mg/liter, intermitting the plating treatment; automatically adding Tl or Tl compound, and waiting that the plating solution becomes homogeneous (for example, about for 2 hours). Here, intermitting is referred to as not advancing to plating treatment on the next wafer. In this case, it is suitable to add Tl or Tl compound during a period between wafer treatments (a period between the former wafer treatment and the latter wafer treatment).

(5) When the calculated concentration is, for example, smaller than 3.5 mg/liter, intermitting the plating treatment; automatically replacing the plating solution in the plating solution tank 40 (FIG. 41).

Here, in procedures (3) to (5), these countermeasures are not necessarily indispensable. Instead, simple countermeasure such as, for example, "displaying that the Tl concentration is low", or "issuing an alarm", may be carried out.

In addition, instead of the reference concentration (reference maximum concentration or reference minimum concentration), the Tl concentration may be similarly managed by using the relationship between observed applied voltage and the reference plating voltage (reference maximum voltage or reference minimum voltage) corresponding to the reference concentration etc. in FIG. 42. These values of the reference concentration or the reference plating voltage are input from the control terminal 156 (FIG. 41) in advance.

Moreover, instead of the average value (or median value) such as the observed applied voltage, the peak value or the convergent value of the applied voltage in a representative step may be used as the target to be compared with the reference value. When, the peak value is used, there is a merit of high sensitivity.

In addition, in regard to Tl concentration detection, when a plating step of a plurality of current concentrations is applied like in FIG. 20, it is advantageous to measure the concentration at the high current step, however, when a single step is applied, of course, the transition of the plating current may be similarly observed in this step. In this case, it should be considered that the low current step is not present.

6. Explanation of Other Process or Apparatus Configuration

In the present embodiment, an apparatus of a type where plating is carried out by inverting the plating cup is used, but, instead, an apparatus of a type where the plating is carried out in a wafer face down state without inverting the cup may be used. In this case, the cup inversion step 74 and the cup re-inversion step 77 in FIG. 1 are simply skipped (in FIG. 17, the cup inversion step 88 and the cup re-inversion step 92). That is, in the cleaning step and the plating step, by causing the attitude (orientation in a space, that is the orientation of the device surface of the wafer) of the plating cup to be an optimum one for each step (as a result, the attitude of the plating cup differs between these steps), plating of highly reliable and high flatness bumps can be achieved. The attitudes of the plating cup are exemplified only for the erecting state and the upside-down state, however, it is needless to say that a slightly tilt attitude may be adopted if necessary.

Although, an example where the cup cleaning step 72 in FIG. 1 is carried out by setting (loading) the product wafer 1 to be subjected to plating treatment in the plating cup 24, has been explained, it is also possible to carry out the cup cleaning step 24 by simply closing the lid 42 without setting the wafer 1 or by setting a dummy wafer instead of the product wafer 1. In some cases, the way where the product wafer 1 is not set, has a merit such as that another treatment can be subjected to the product wafer during the cleaning step 72. In addition, even if the product wafer 1 is used, by sufficiently considering the treatment procedures or time allocation etc., treatment can be carried out substantially without reduction of throughput etc. In case where cleaning is carried out while loading the product wafer 1 in the plating cup 24, has a merit of smooth treatment flow than otherwise.

Furthermore, the prior stirring step 90 in FIG. 17 is not necessarily indispensable, but it is effective for stabilizing the plating properties.

7. Summary

Up to this point, the invention made by the present inventor has been explained by adopting the plating process in forming Au bumps according to the embodiment as an example, however, it is needless to say that the present invention is not limited to this, and various modifications can be considered within a scope not departing from its gist.

For example, it is needless to say that the present invention can be similarly applied in formation of bumps except for Au bumps, such as solder bumps and Ag bumps. Moreover, it is needless to say that the present invention can be applied not only in bump formation but also in a wide field of dealing materials.

Moreover, in the present embodiment, a process where openings are formed in a resist film, and the openings are subjected to plating, has been explained, however, it is needless to say that the present invention can also be applied for a process like a Cu damascene (or Ag damascene) process where almost entire surface of a wafer is subjected to plating of a metal film without using a resist.

Furthermore, in the embodiment, the present invention has been explained in special by mainly adopting an cup-inversion type (wafer-face-up type) plating apparatus as an example, however, it is needless to say that the present invention is not limited to this, it can be applied in a wafer-facedown type plating apparatus almost as it is, which is widely used today and does not invert the cup.

What is claimed is:

1. A manufacturing method of a semiconductor integrated circuit device comprising the following step of:
   (a) forming Au-based bump electrodes using Au as a principal component over a first principal surface of a semiconductor wafer by electrolytic plating using a non-cyan based Au plating solution added with thallium,
   wherein the step (a) includes the following sub-steps of:
      (a1) starting application of first plating current into the Au plating solution;
      (a2) after the sub-step (a1), finishing application of the first plating current; and
      (a3) at any period during the sub-steps (a1) and (a2), monitoring the added amount of thallium in the Au plating solution by monitoring voltage applied to the Au plating solution.

2. The manufacturing method of a semiconductor integrated circuit device according to claim 1,
   wherein the monitoring monitors relationship between the applied voltage and a set reference maximum voltage.

3. The manufacturing method of a semiconductor integrated circuit device according to claim 2,
   wherein the Au plating solution is a gold sulfite based plating solution.

4. The manufacturing method of a semiconductor integrated circuit device according to claim 3,
   wherein the applied voltage to be monitored is a peak voltage within the period.

5. The manufacturing method of a semiconductor integrated circuit device according to claim 4, further comprising the following step of:
   (b) adding thallium or thallium compound in the Au-plating solution based on the result of the sub-step (a3).

6. The manufacturing method of a semiconductor integrated circuit device according to claim 4,
   wherein the step (a) further includes the following sub-step of:
      (a4) adding thallium or thallium compound in the Au plating solution based on the result of the sub-step (a3).

7. The manufacturing method of a semiconductor integrated circuit device according to claim 5,
   wherein the thallium compound is thallium formate, thallium sulfate, thallium nitrate, or thallium oxide.

8. The manufacturing method of a semiconductor integrated circuit device according to claim 6,
   wherein the step (a) further includes the following sub-step of:
      (a5) before the sub-step (a1), applying second plating current that is lower than the first plating current into the Au plating solution.

9. The manufacturing method of a semiconductor integrated circuit device according to claim 4,
   wherein the semiconductor integrated circuit device has an LCD driver circuit.

10. A manufacturing method of a semiconductor integrated circuit device comprising the following step of:
    (a) forming Au-based bump electrodes using Au as a principal component over a first principal surface of a semiconductor wafer by electrolytic plating using a non-cyan based Au plating solution added with thallium,
    wherein the step (a) includes the following sub-steps of:
       (a1) starting application of first plating current into the Au plating solution;
       (a2) after the sub-step (a1), finishing application of the first plating current; and
       (a3) at any period during the sub-steps (a1) and (a2), monitoring voltage applied to the Au plating solution; and
       (a4) before the sub-step (a1), setting a reference maximum voltage used for monitoring the added amount of thallium in the Au plating solution.

11. The manufacturing method of a semiconductor integrated circuit device according to claim 10,
    wherein the monitoring monitors relationship between the applied voltage and the reference maximum voltage.

12. The manufacturing method of a semiconductor integrated circuit device according to claim 11,
    wherein the Au plating solution is a gold sulfite based plating solution.

13. The manufacturing method of a semiconductor integrated circuit device according to claim 12,
    wherein the applied voltage to be monitored is a peak voltage within the period.

14. The manufacturing method of a semiconductor integrated circuit device according to claim 13, further comprising the following step of:
    (b) adding thallium or thallium compound in the Au plating solution based on the result of the sub-step (a3).

15. The manufacturing method of a semiconductor integrated circuit device according to claim 13,
    wherein the step (a) further includes the following sub-step of:
       (a5) adding thallium or thallium compound in the Au plating solution based on the result of the sub-step (a3).

16. The manufacturing method of a semiconductor integrated circuit device according to claim 14,
    wherein the thallium compound is thallium formate, thallium sulfate, thallium nitrate, or thallium oxide.

17. The manufacturing method of a semiconductor integrated circuit device according to claim 15,
    wherein the step (a) further includes the following sub-step of:
       (a6) before the sub-step (a1), applying second plating current that is lower than the first plating current into the Au plating solution.

18. The manufacturing method of a semiconductor integrated circuit device according to claim 13,
    wherein the semiconductor integrated circuit device has an LCD driver circuit.

* * * * *